(12) United States Patent
Tang et al.

(10) Patent No.: US 11,984,634 B2
(45) Date of Patent: May 14, 2024

(54) BASE STATION ANTENNAS HAVING DOUBLE-SIDED PHASE SHIFTERS AND/OR REARWARDLY EXTENDING PHASE SHIFTERS AND ASSOCIATED PHASE SHIFTER ASSEMBLIES

(71) Applicant: CommScope Technologies LLC, Hickory, NC (US)

(72) Inventors: Haidan Tang, Suzhou (CN); Junfeng Yu, Suzhou (CN); Dongmin Wang, Suzhou (CN); Chaohui Liu, Suzhou (CN); Samantha L. Merta, Richardson, TX (US); Hangsheng Wen, Suzhou (CN); Amit Kaistha, Coppell, TX (US); Muhammed Ameer P, Kerala (IN)

(73) Assignee: CommScope Technologies LLC, Hickory, NC (US)

(*) Notice: Subject to any disclaimer, the term of this patent is extended or adjusted under 35 U.S.C. 154(b) by 255 days.

(21) Appl. No.: 17/276,253

(22) PCT Filed: Sep. 19, 2019

(86) PCT No.: PCT/US2019/051873
§ 371 (c)(1),
(2) Date: Mar. 15, 2021

(87) PCT Pub. No.: WO2020/061275
PCT Pub. Date: Mar. 26, 2020

(65) Prior Publication Data
US 2022/0037753 A1 Feb. 3, 2022

Related U.S. Application Data

(60) Provisional application No. 62/877,484, filed on Jul. 23, 2019, provisional application No. 62/828,831, (Continued)

(51) Int. Cl.
*H01Q 19/10* (2006.01)
*H01P 1/18* (2006.01)
(Continued)

(52) U.S. Cl.
CPC ............... *H01P 1/184* (2013.01); *H01P 1/18* (2013.01); *H01Q 1/24* (2013.01); *H01Q 1/246* (2013.01);
(Continued)

(58) Field of Classification Search
CPC .......... H01Q 1/246; H01Q 19/10; H01Q 1/24; H01P 1/184; H01P 1/18; H05K 1/0243; H05K 2201/10098; H05K 1/02
(Continued)

(56) References Cited

U.S. PATENT DOCUMENTS

2002/0126059 A1* 9/2002 Zimmerman .......... H01Q 1/246
343/757
2006/0077098 A1* 4/2006 Zimmerman ............ H01Q 3/32
342/372
(Continued)

FOREIGN PATENT DOCUMENTS

CN 1505850 A 6/2004
CN 202523820 U 11/2012
(Continued)

OTHER PUBLICATIONS

European Search Report issued in corresponding European Patent Application No. 19862549.3, dated Jul. 4, 2022.
(Continued)

*Primary Examiner* — Hai V Tran
(74) *Attorney, Agent, or Firm* — Myers Bigel, P.A.

(57) ABSTRACT

A phase shifter assembly, suitable for a base station antenna, includes a main printed circuit board with opposing first and second primary sides. The main printed circuit board has a
(Continued)

plurality of radio frequency (RF) transmission paths on the first primary side and a plurality of RF transmission paths on the second primary side. The phase shifter assembly also includes a first wiper arm rotatably coupled to the main printed circuit board and electrically coupled to the plurality of transmission paths on the first primary side of the main printed circuit board; and a second wiper arm rotatably coupled to the main printed circuit board and electrically coupled to the plurality of transmission paths on the second primary side of the main printed circuit board. Rearwardly extending phase shifter assemblies that are oriented perpendicular to a plane defined by a reflector within a base station antenna are also provided.

20 Claims, 48 Drawing Sheets

Related U.S. Application Data filed on Apr. 3, 2019, provisional application No. 62/733,721, filed on Sep. 20, 2018.

(51) Int. Cl.
*H01Q 1/24* (2006.01)
*H05K 1/02* (2006.01)

(52) U.S. Cl.
CPC .............. *H01Q 19/10* (2013.01); *H05K 1/02* (2013.01); *H05K 1/0243* (2013.01); *H05K 2201/10098* (2013.01)

(58) Field of Classification Search
USPC ........................................................ 343/834
See application file for complete search history.

(56) References Cited

U.S. PATENT DOCUMENTS

| | | | |
|---|---|---|---|
| 2009/0189826 A1 | 7/2009 | Timofeev et al. | |
| 2011/0063049 A1 | 3/2011 | Bradley et al. | |
| 2019/0044258 A1 | 2/2019 | Everest et al. | |
| 2019/0334636 A1* | 10/2019 | Li | H01P 1/184 |

FOREIGN PATENT DOCUMENTS

| | | |
|---|---|---|
| CN | 102938482 A | 2/2013 |
| CN | 103066381 A | 4/2013 |
| CN | 103220032 A | 7/2013 |
| CN | 103490175 A | 1/2014 |
| CN | 203910970 U | 10/2014 |
| CN | 104241854 A | 12/2014 |
| CN | 204706643 U | 10/2015 |
| CN | 108140932 A | 6/2018 |
| KR | 101305246 B1 | 9/2013 |
| TW | 201406276 A | 2/2014 |
| WO | 2017036339 A1 | 3/2017 |
| WO | 2018082285 A1 | 5/2018 |

OTHER PUBLICATIONS

"International Search Report and Written Opinion corresponding to International Patent Application No. PCT/US2019/051873, dated Jan. 24, 2020".
Gong et al., "A Novel Design of Low Profile Circularly Polarized Antenna with High Gain Characteristics", Proceedings of the 2016 National Military Academic Conference on Microwave, Terahertz, and Electromagnetic Compatibility Technology, Aug. 17, 2016.
First Office Action dated Aug. 2, 2021, for corresponding Chinese Application No. 201980061882.3, including English translation.
"First Office Action and English language translation", CN Application No. 202210174896.X, dated Feb. 1, 2023, 13 pp.
Office Action for EP 19862549.3 mailed Jan. 2, 2024, 12 pages.

* cited by examiner

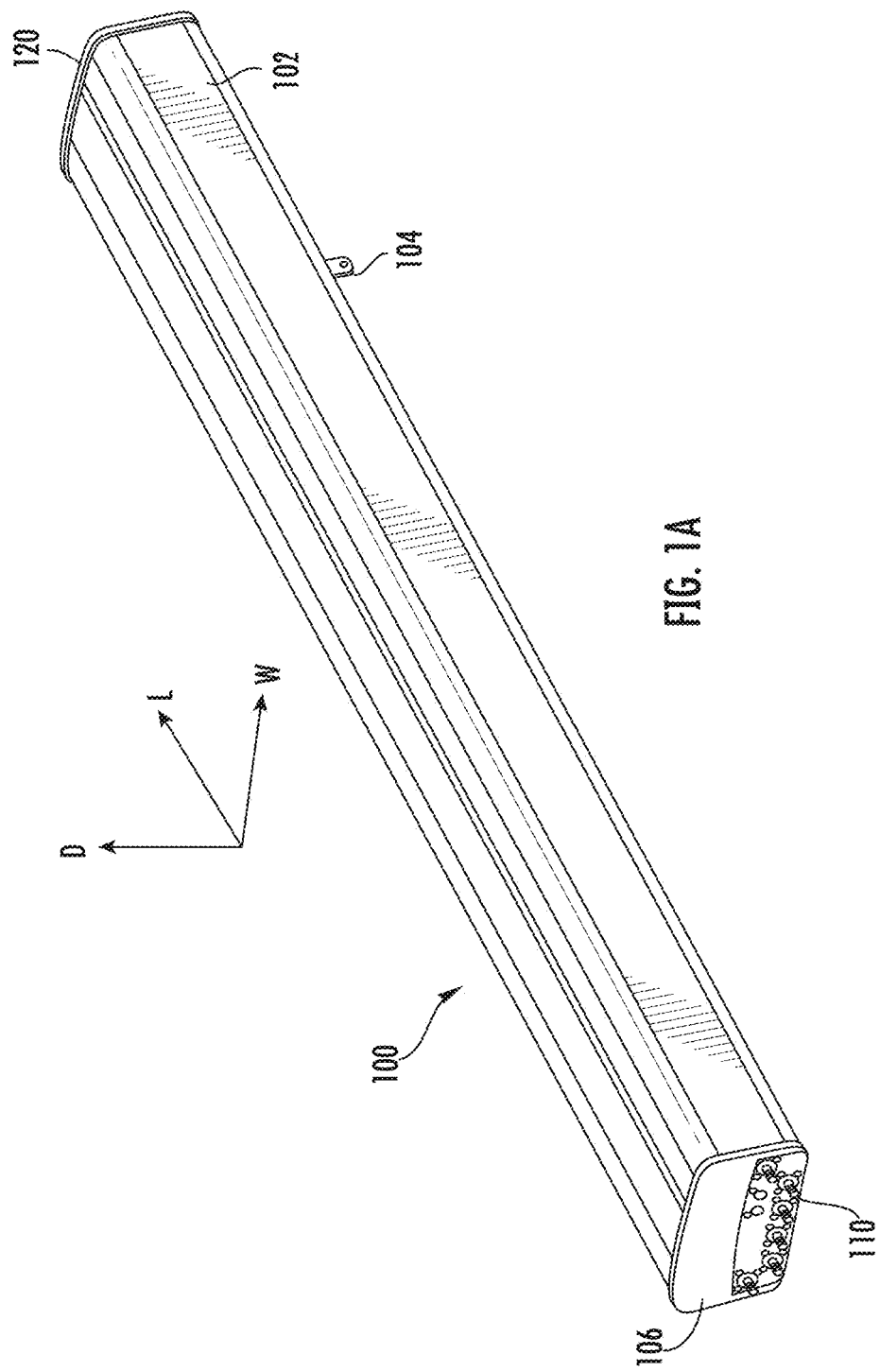

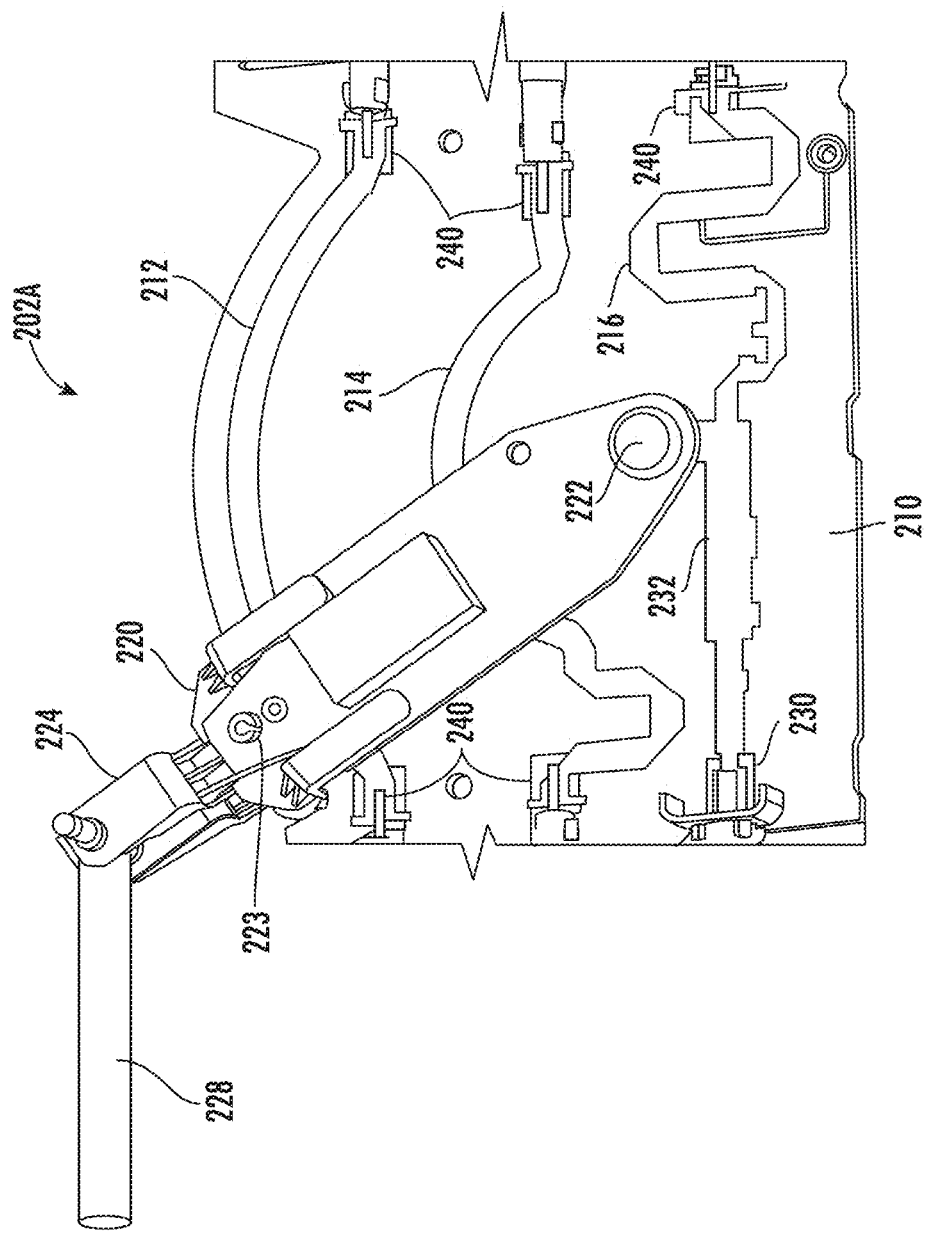

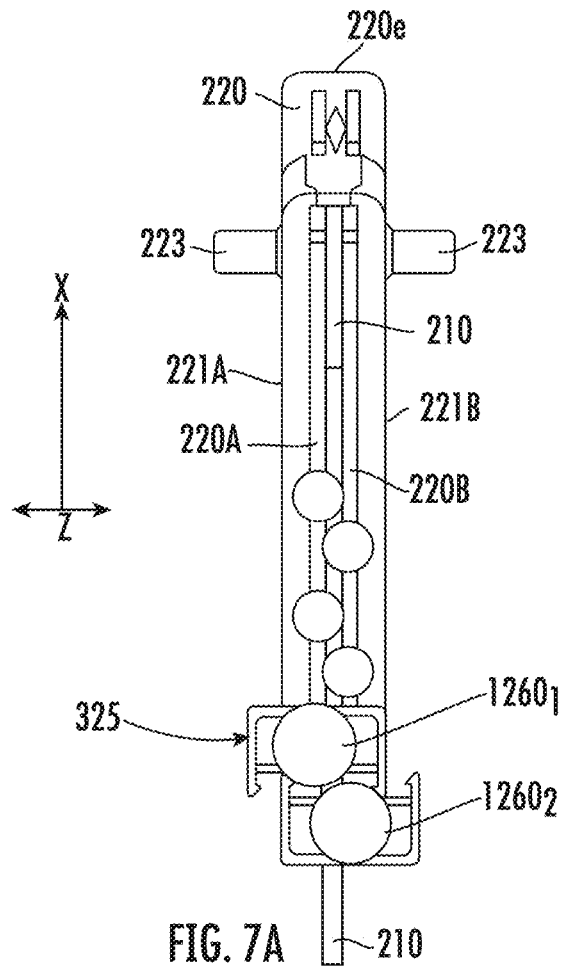
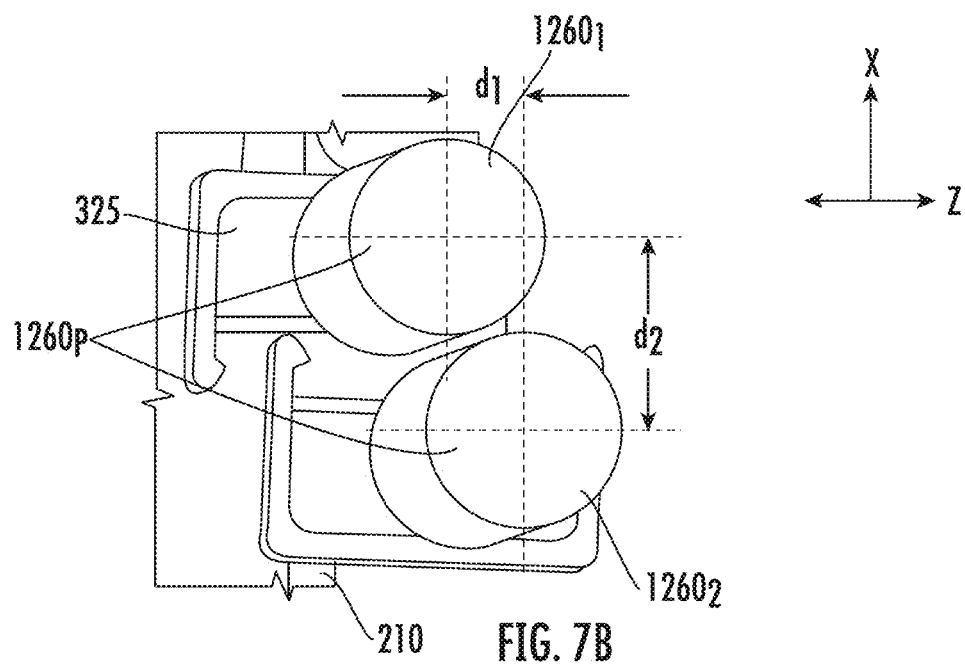
FIG. 7A
FIG. 7B

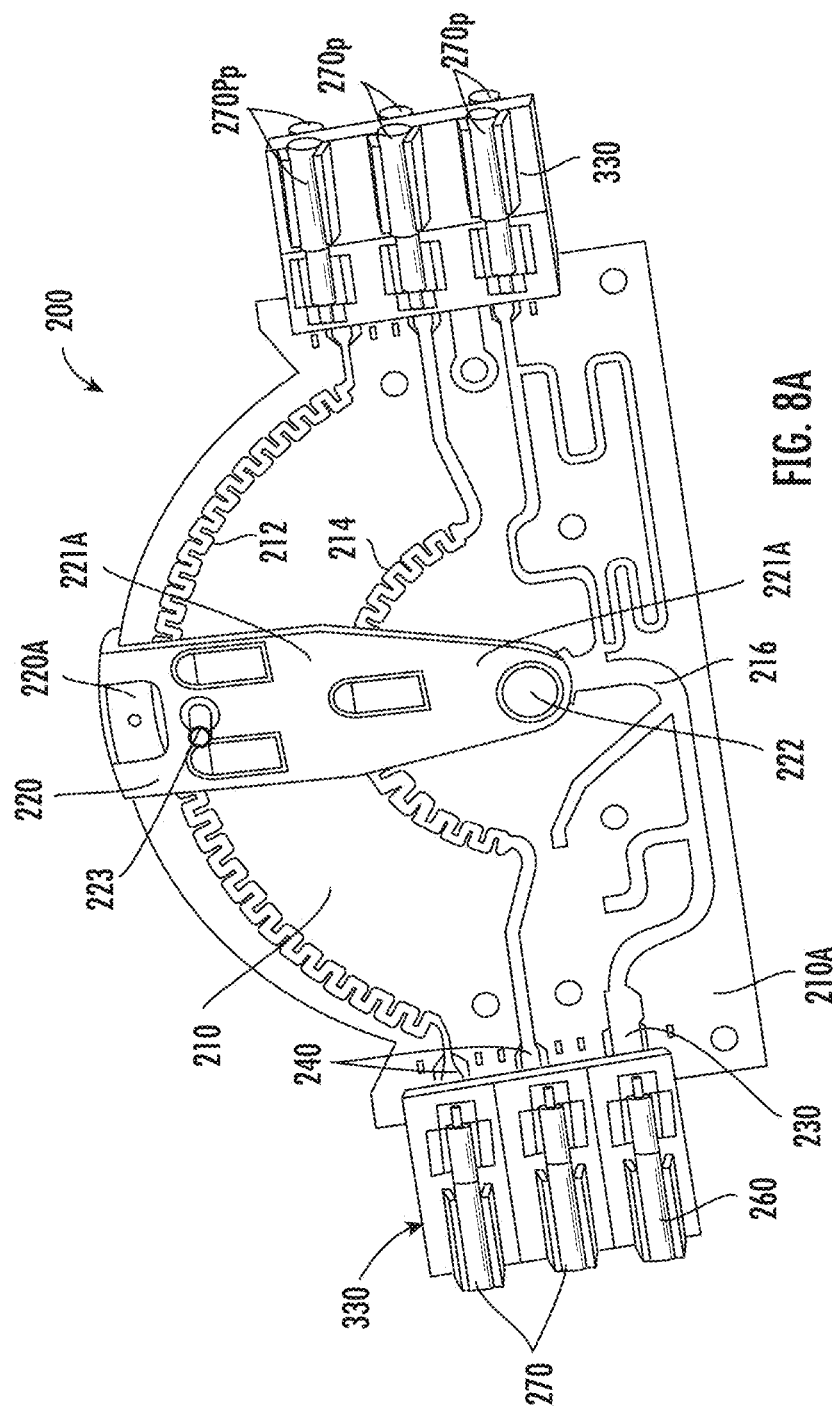

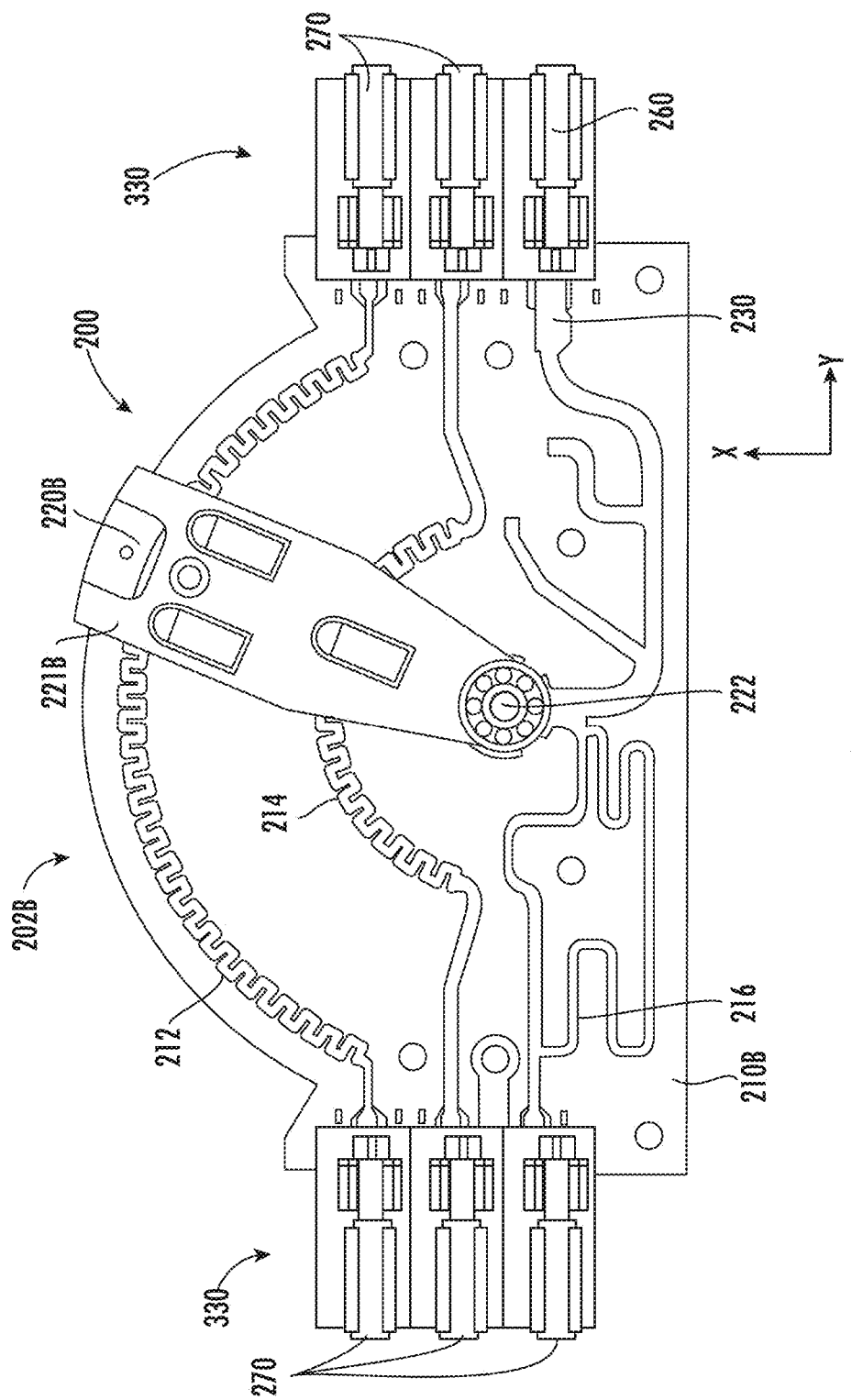

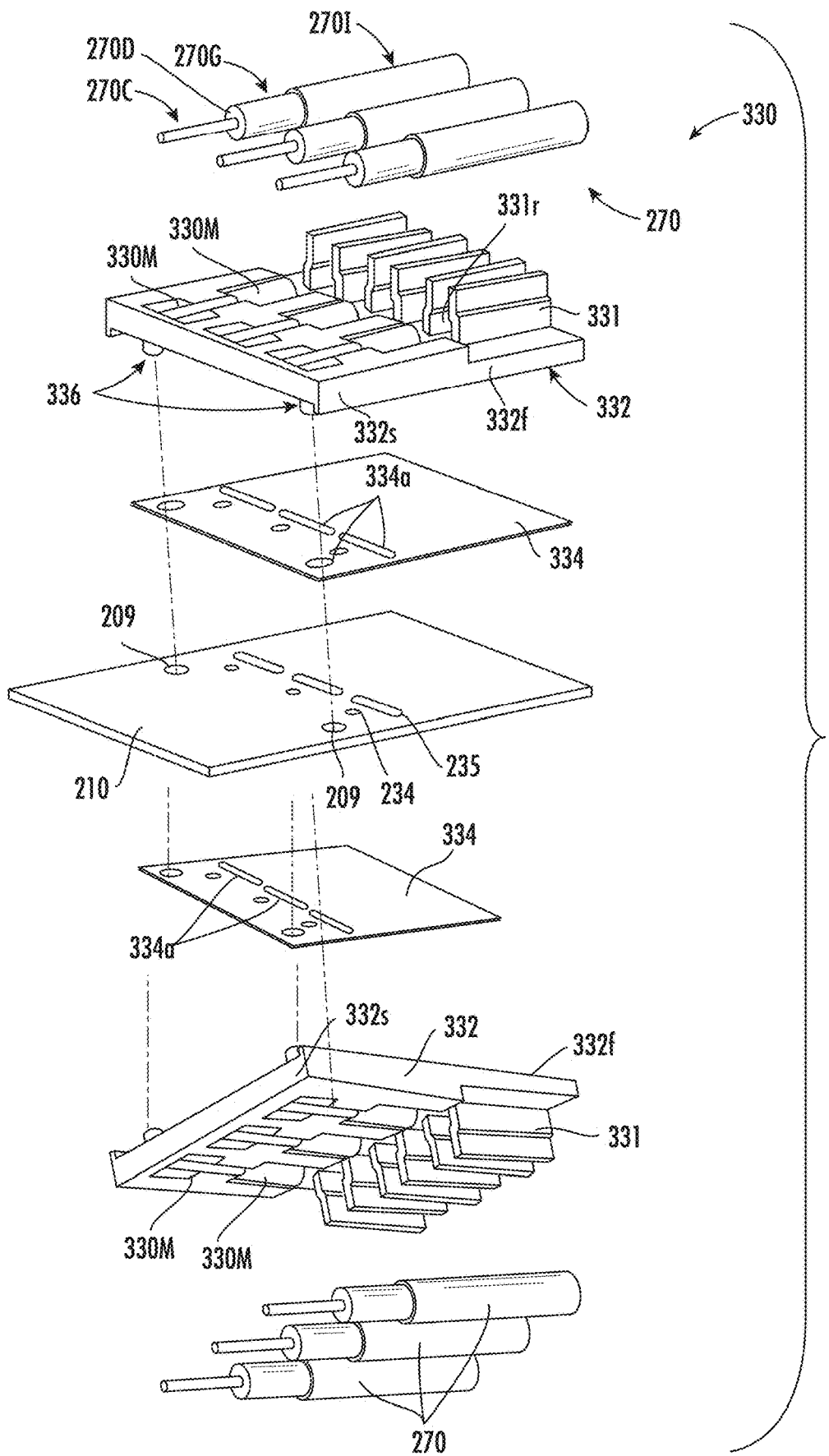

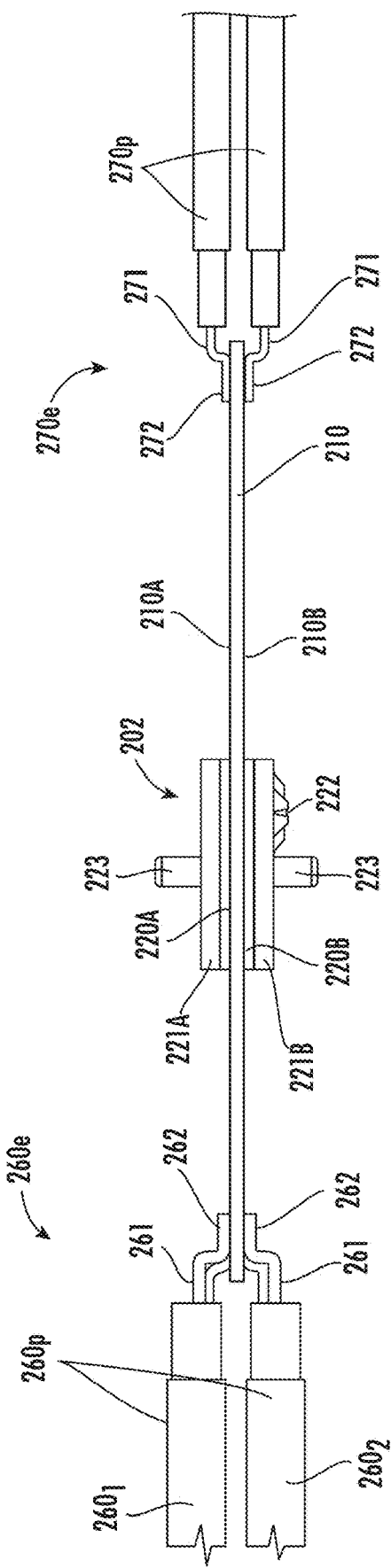
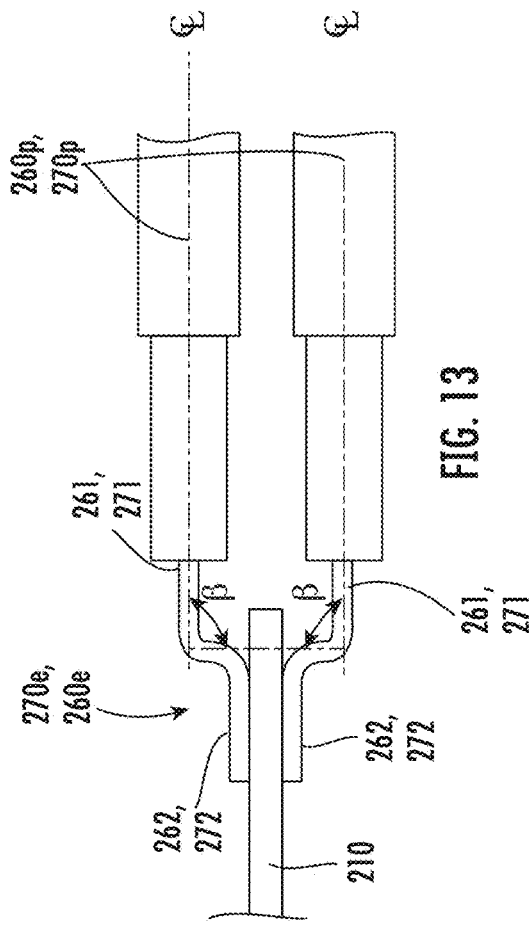
FIG. 12
FIG. 13

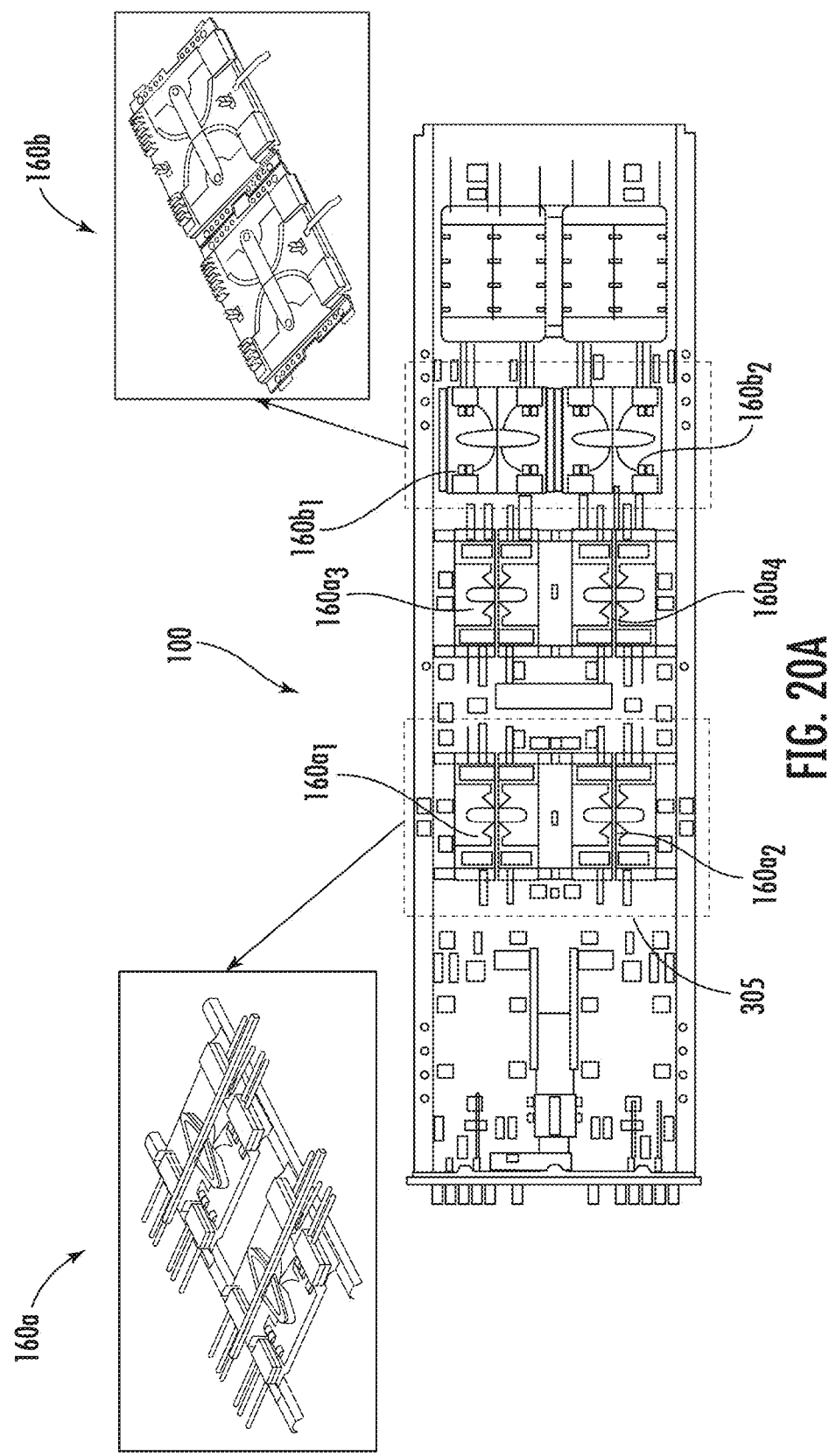

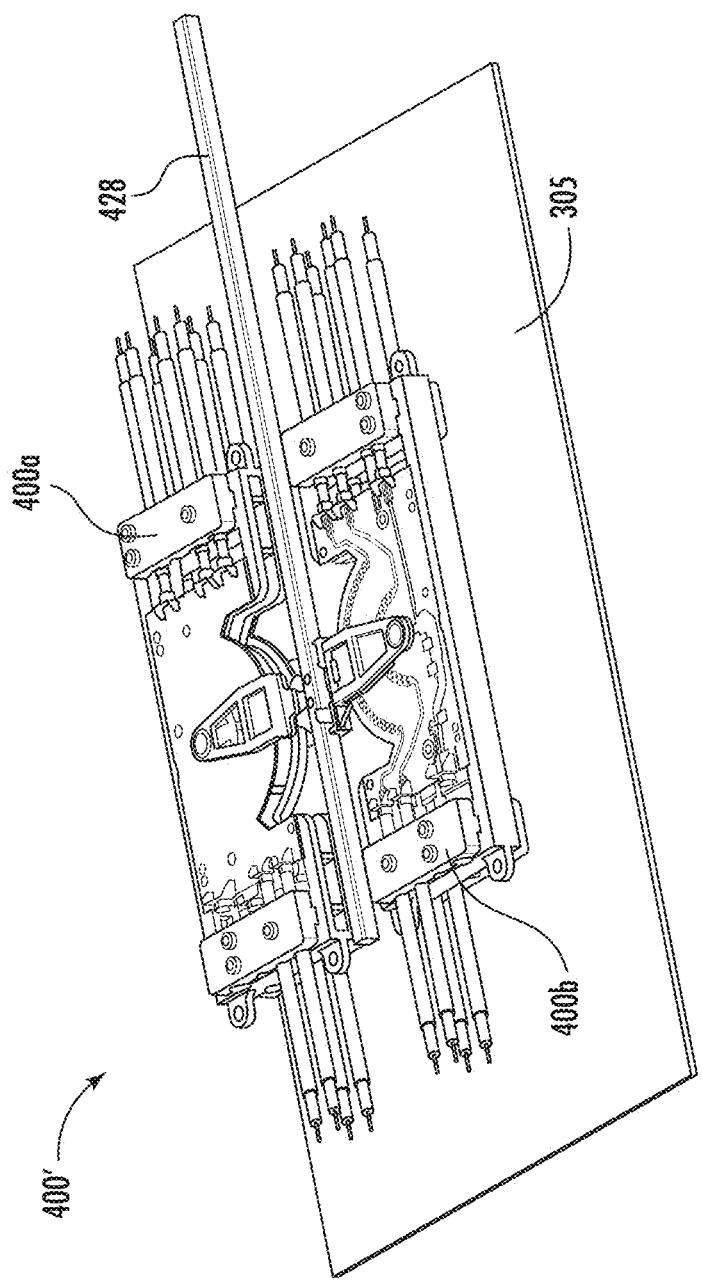

BASE STATION ANTENNAS HAVING DOUBLE-SIDED PHASE SHIFTERS AND/OR REARWARDLY EXTENDING PHASE SHIFTERS AND ASSOCIATED PHASE SHIFTER ASSEMBLIES

STATEMENT OF PRIORITY

The present application is a 35 U.S.C. § 371 national phase application of PCT Application No. PCT/US2019/051873 filed Sep. 19, 2019, which claims priority from and the benefit of U.S. Provisional Application No. 62/733,721, filed on Sep. 20, 2018, U.S. Provisional Application No. 62/828,831, filed Apr. 3, 2019, and U.S. Provisional Application No. 62/877,484, filed Jul. 23, 2019, the disclosures of which are hereby incorporated herein in their entirety.

FIELD

The present invention relates to communication systems and, in particular, to base station antennas having remote electronic tilt capabilities.

BACKGROUND

Cellular communications systems are used to provide wireless communications to fixed and mobile subscribers. A cellular communications system may include a plurality of base stations that each provides wireless cellular service for a specified coverage area that is typically referred to as a "cell." Each base station may include one or more base station antennas that are used to transmit radio frequency ("RF") signals to, and receive RF signals from, the subscribers that are within the cell served by the base station. Base station antennas are directional devices that can concentrate the RF energy that is transmitted in or received from certain directions. The "gain" of a base station antenna in a given direction is a measure of the ability of the antenna to concentrate the RF energy in that direction. The "radiation pattern" of a base station antenna—which is also referred to as an "antenna beam"—is a compilation of the gain of the antenna across all different directions. Each antenna beam may be designed to service a pre-defined coverage area such as the cell or a portion thereof that is referred to as a "sector." Each antenna beam may be designed to have minimum gain levels throughout the pre-defined coverage area, and to have much lower gain levels outside of the coverage area to reduce interference between neighboring cells/sectors. Base station antennas typically comprise a linear array of radiating elements such as patch, dipole or crossed dipole radiating elements. Many base station antennas now include multiple linear arrays of radiating elements, each of which generates its own antenna beam.

Early base station antennas generated antenna beams having fixed shapes, meaning that once a base station antenna was installed, its antenna beam(s) could not be changed unless a technician physically reconfigured the antenna. Many modern base station antennas now have antenna beams that can be electronically reconfigured from a remote location. The most common way in which an antenna beam may be reconfigured electronically is to change the pointing direction of the antenna beam (i.e., the direction in which the antenna beam has the highest gain), which is referred to as electronically "steering" the antenna beam. An antenna beam may be steered horizontally in the azimuth plane and/or vertically in the elevation plane. An antenna beam can be electronically steered by transmitting control signals to the antenna that cause the antenna to alter the phases of the sub-components of the RF signals that are transmitted and received by the individual radiating elements of the linear array that generates the antenna beam. Most modern base station antennas are configured so that the elevation or "tilt" angle of the antenna beams generated by the antenna can be electronically altered. Such antennas are commonly referred to as remote electronic tilt ("RET") antennas.

In order to electronically change the down tilt angle of an antenna beam generated by a linear array of radiating elements, a phase taper may be applied across the radiating elements of the array. Such a phase taper may be applied by adjusting the settings on a phase shifter that is positioned along the RF transmission path between a radio and the individual radiating elements of the linear array. One widely-used type of phase shifter is an electromechanical "wiper" phase shifter that includes a main printed circuit board and a "wiper" printed circuit board that may be rotated above the main printed circuit board. Such wiper phase shifters typically divide an input RF signal that is received at the main printed circuit board into a plurality of sub-components, and then couple at least some of these sub-components to the wiper printed circuit board. The sub-components of the RF signal may be coupled from the wiper printed circuit board back to the main printed circuit board along a plurality of arc-shaped traces, where each arc has a different diameter. Each end of each arc-shaped trace may be connected to a respective sub-group of one or more radiating elements. By physically (mechanically) rotating the wiper printed circuit board above the main printed circuit board, the locations where the sub-components of the RF signal couple back to the main printed circuit board may be changed, which thus changes the lengths of the transmission paths from the phase shifter to the respective sub-groups of radiating elements. The changes in these path lengths result in changes in the phases of the respective sub-components of the RF signal, and since the arcs have different radii, the phase changes along the different paths will be different. Typically, the phase taper is applied by applying positive phase shifts of various magnitudes (e.g., +X°, +2X° and +3X°) to some of the sub-components of the RF signal and by applying negative phase shifts of the same magnitudes (e.g., −X°, −2X° and −3X°) to additional of the sub-components of the RF signal. Exemplary phase shifters of this variety are discussed in U.S. Pat. No. 7,907,096 to Timofeev, the disclosure of which is hereby incorporated herein in its entirety. The wiper printed circuit board is typically moved using an electromechanical actuator such as a DC motor that is connected to the wiper printed circuit board via a mechanical linkage. These actuators are often referred to as "RET actuators." Both individual RET actuators that drive a single mechanical linkage and "multi-RET actuators" that have a plurality of output members that drive a plurality or respective mechanical linkages are commonly used in base station antennas.

SUMMARY

Pursuant to embodiments of the present invention, base station antennas and/or phase shifter assemblies suitable for base station antennas include double sided printed circuit boards (PCB) providing dual phase shifters, one on each side of the PCB.

Pursuant to embodiments of the present invention, base station antennas and/or phase shifter assemblies suitable for base station antennas comprise stacked pairs of PCBs with a back panel, with the back panel separating the pairs of PCB and with a wiper sub-assembly coupled to each respective pair of the PCBs.

Pursuant to embodiments of the present invention, base station antennas are provided that include pairs of PCBs that are mounted substantially perpendicular to a plane defined by a reflector of the base station antenna.

Embodiments of the invention are directed to a phase shifter assembly that includes a main printed circuit board comprising opposing first and second primary sides. The main printed circuit board has a plurality of radio frequency (RF) transmission paths on the first primary side and a plurality of RF transmission paths on the second primary side. The assembly also includes a first wiper arm rotatably coupled to the main printed circuit board and electrically coupled to at least some of the plurality of transmission paths on the first primary side of the main printed circuit board and a second wiper arm rotatably coupled to the main printed circuit board and electrically coupled to at least some of the plurality of transmission paths on the second primary side of the main printed circuit board.

The phase shifter assembly can further include a plurality of coaxial cables coupled to each of the first and second primary sides of the main printed circuit board.

The main printed circuit board can have a ground plane sandwiched between opposing dielectric layers.

The phase shifter assembly can further include a plurality of input and/or output pads coupled to the plurality of RF transmission paths on each of the first and second primary sides of the main printed circuit board.

The input and/or output pads on the first primary side can be laterally and/or longitudinally offset from the input and/or output pads on the second primary side.

The phase shifter assembly can further include a pivot pin extending through an aperture in the main printed circuit board defining a pivot point. The pivot pin can be coupled to both the first and second wiper arms.

The main printed circuit board can have an arcuate slot residing adjacent an arcuate segment of at least one of the plurality of RF transmission paths. The first and second wiper arms can cooperate with the slot and the pivot pin to rotate back and forth over the RF transmission paths.

The main printed circuit board can have an arcuate top side residing adjacent an arcuate segment of at least one of the plurality of RF transmission paths.

The phase shifter assembly can further include at least one connector block assembly attached to the main printed circuit board. The at least one connector block assembly can be configured to hold a plurality of coaxial cables in first and second stacked rows. The first row can hold the coaxial cables coupled to the first primary side of the main printed circuit board and the second row can hold the coaxial cables coupled to the second primary side of the main printed circuit board.

The phase shifter assembly can further include at least one transition block connector that can reside completely outside a boundary of the main printed circuit board and can couple a first pair of larger coaxial cables to a corresponding first pair of smaller outer diameter coaxial cables. One coaxial cable of the pair of the smaller outer diameter coaxial cables can couple to the first primary side of the main printed circuit board while another coaxial cable of the pair of the smaller outer diameter coaxial cables can couple to the second primary side of the main printed circuit board.

At least some of the coaxial cables can have end portions that have a first terminal end segment that merges into a second terminal end segment. The first terminal end segment can have an axially extending center line. The second terminal end segment can be bent to reside closer to the main printed circuit board than the first terminal end segment, optionally at an angle between 45 and 90 degrees from the axially extending center line of the first terminal end segment.

The main printed circuit board can have a thickness in a range of about 2 mm to about 10 mm, optionally a range of about 3 mm to about 5 mm.

The main printed circuit board can have a perimeter. The perimeter can include a pair of long sides and a pair of short sides, with one long side defining a bottom and one long side defining a top. The main printed circuit board can have input and/or output pads on the first primary side that can be offset in an X direction from input and/or output pads on the second primary side, with the X direction defined as extending in a direction between the top and bottom.

The main printed circuit board can have a perimeter. The perimeter can have a pair of long sides and a pair of short sides, with one long side defining a bottom and one long side defining a top. Input and/or output pads on the first and second primary surfaces can include a plurality of pads that can reside adjacent the top and a plurality of pads that can reside adjacent the bottom of the main printed circuit board.

The input pad on the first primary side can reside in a bottom corner or a top corner of the main printed circuit board. The input pad on the second primary side can reside in the other of the bottom corner or the top corner across a Y direction of the main printed circuit board. Optionally, the main printed circuit board can have an arcuate slot that resides adjacent an arcuate segment of one of the transmission lines.

The main printed circuit board can have a top and an opposing bottom. The top can be positioned closer to an outer edge of the first and second wiper arms than the bottom. The main printed circuit board can have input and/or output pads on the first primary side that can be above the slot and further away from the pivot pin closer to the wiper arm. The main printed circuit board can also have input and/or output pads on the second primary side that can be below the slot.

The pivot pin can reside at a medial location of the main printed circuit board, optionally centered in a Y direction where the Y direction corresponds to a lateral direction associated with a primary direction of the transmission paths.

The pivot pin can reside closer to a bottom side of the main printed circuit board than the top side of the main printed circuit board, optionally centered in a Y direction where the Y direction corresponds to a lateral direction associated with a primary direction of the transmission paths.

The first and second wiper arms can be coupled together at a respective outer edge portion.

Embodiments of the invention include a base station antenna with a housing enclosing the phase shifter assembly. Optionally (a) the phase shifter assembly can be held in a vertical orientation in the housing with the main printed circuit board vertically oriented; or (b) the phase shifter assembly can be held in a horizontal orientation in the housing with the main printed circuit board horizontally oriented.

Embodiments of the invention are directed to a base station antenna. The base station antenna includes: a plate (optionally a metal plate) comprising opposing first and second primary surfaces and a first slot; a first main printed circuit board comprising a plurality of radio frequency (RF)

transmission paths residing on the first primary surface of the plate; a second main printed circuit board comprising a plurality of RF transmission paths residing on the second primary surface of the plate, aligned with the first main printed circuit board; a first wiper arm rotatably coupled to the first main printed circuit board; and a second wiper arm rotatably coupled to the second main printed circuit board. The first and second wiper arms cooperate with the first slot in the plate and a pivot pin extending through the first and second main printed circuit boards and the plate to be able to rotate in concert relative to the first and second main printed circuit boards to thereby adjust lengths of RF transmission paths on respective first and second main printed circuit boards.

The plate can have a second slot adjacent the first slot. The base station antenna can further include: a third main printed circuit board residing adjacent the first main printed circuit board and on the first primary surface of the plate; a fourth main printed circuit board residing adjacent the second main printed circuit board and on the second primary surface of the plate; a third wiper arm rotatably coupled to the third main printed circuit board; and a fourth wiper arm rotatably coupled to the fourth main printed circuit board. The third and fourth wiper arms can cooperate with the second slot in the plate and a pivot pin extending through the third and fourth main printed circuit boards and the plate. The third and fourth wiper arms can rotate in concert relative to the third and fourth main printed circuit boards to thereby adjust lengths of RF transmission paths on respective third and fourth main printed circuit boards.

The base station antenna can further include a plurality of cable channels held by or defined by the plate that can route a plurality of coaxial cables to the first and second main printed circuit boards.

The first and second slots can be arcuate slots and can reside at a medial location of the plate. The first arcuate slot can have a first radius of curvature and the second arcuate slot can have a second radius of curvature. The first and second radius of curvatures can be the same but can be oriented to provide opposing arc segments.

The first, second, third and fourth main printed circuit boards can have a perimeter. The perimeter can have a pair of long sides and a pair of short sides. One long side of the pair of long sides can define a bottom and another long side of the pair of long sides can define a top. The tops of the first and third printed circuit boards can be arcuate and can reside adjacent each other with the first and second slots therebetween. The tops of the second and fourth printed circuit boards can be arcuate and can reside adjacent each other with the first and second slots therebetween.

The plurality of cable channels can be defined at least partially by a connector block assembly or a transition block connector.

The phase shifter assembly can be held in a vertical orientation with the plate and the first and second printed circuit boards parallel to each other and vertically oriented.

The phase shifter assembly can be held in a horizontal orientation with the plate and the first and second printed circuit boards parallel to each other and horizontally oriented.

Embodiments of the present invention are directed to a base station antenna. The base station antenna may include a reflector; and a plurality of rearwardly extending phase shifter assemblies, where each of the phase shifter assemblies are aligned substantially perpendicular to a plane defined by the reflector.

Each phase shifter assembly of the base station antenna may include a first and a second plate arranged back-to-back and extending parallel to each other. Each plate may include an outer surface, a first main printed circuit board residing on the outer surface of the first plate, the first main printed circuit board comprising a plurality of radio frequency (RF) transmission paths, a second main printed circuit board residing on the outer surface of the second plate, the second main printed circuit board including a plurality of RF transmission paths. The second main printed circuit board may be aligned with the first main printed circuit board, a first wiper rotatably coupled to the first main printed circuit board, the first wiper having a first attachment link, and a second wiper rotatably coupled to the second main printed circuit board, the second wiper having a second attachment link. The first attachment link of the first wiper and the second attachment link of the second wiper are each configured to couple their respective wiper to a drive shaft of a mechanical linkage, where the first and second wipers are configured to rotate in concert relative to the first and second main printed circuit boards to thereby adjust lengths of RF transmission paths on respective first and second main printed circuit boards.

Each phase shifter assembly of the base station antenna may include one or more mounting flanges, each mounting flange being configured to mount the phase shifter assembly to the reflector or a support member.

The plurality of phase shifter assemblies may be mounted to the reflector by the mounting flanges.

The plurality of phase shifter assemblies may be mounted on the support member by the mounting flanges.

The mechanical linkage of each phase shifter assembly may reside in the same transverse plane.

The base station antenna may include an AISG PING printed circuit board that extends perpendicular to the plurality of phase shifter assemblies.

The plurality of phase shifter assemblies may be coupled to the AISG PING printed circuit board through respective blind mated or cabled connections.

The base station antenna may include a calibration circuit board extending perpendicular to the plurality of phase shifter assemblies.

The plurality of phase shifter assemblies may be coupled to the calibration circuit board through respective blind mated or cabled connections.

The base station antenna may include about 10 to about 30 phase shifter assemblies.

Embodiments of the present invention are directed to a method of assembling a base station antenna. The method may include providing a plurality of phase shifter assemblies, each phase shifter assembly including a first plate and a second plate arranged back-to-back and extending parallel to each other, mounting each phase shifter assembly to a support member such that the first and second plates are oriented perpendicular to the support member, and integrating the support member including the plurality of phase shifter assemblies mounted thereon into the base station antenna.

The method may include integrating an AISG PING printed circuit board extending perpendicular to the plurality of phase shifter assemblies.

The method may include integrating a calibration printed circuit board extending perpendicular to the plurality of phase shifter assemblies.

Embodiments of the present invention are directed to a phase shifter assembly adapted for mitigating passive intermodulation within a base station antenna. The assembly may include a polymeric mounting base having opposing first and second primary sides, a first main printed circuit board residing on the first primary side, the first main printed circuit board including a plurality of radio frequency (RF) transmission paths, and a second main printed circuit board residing on the second primary side, the second main printed circuit board including a plurality of RF transmission paths. The second main printed circuit board is aligned with the first main printed circuit board. The assembly may further include a first wiper rotatably coupled to the first main printed circuit board, the first wiper having a first attachment link, and a second wiper rotatably coupled to the second main printed circuit board, the second wiper having a second attachment link. The first attachment link of the first wiper and the second attachment link of the second wiper are each configured to couple their respective wiper to a drive shaft of a mechanical linkage. The first and second wipers are configured to rotate in concert relative to the first and second main printed circuit boards to thereby adjust lengths of RF transmission paths on respective first and second main printed circuit boards.

The phase shifter assembly may have a depth in the range of about 25 mm to about 35 mm, a length in the range of about 180 mm to about 190 mm, and a width in the range of about 80 mm to about 90 mm.

Embodiments of the present invention are directed to a base station antenna. The base station antenna may include a reflector and a plurality of phase shifter assemblies. Each phase shifter assembly may include a polymeric mounting base comprising opposing first and second primary sides, a first main printed circuit board residing on the first primary side, the first main printed circuit board including a plurality of radio frequency (RF) transmission paths, and a second main printed circuit board residing on the second primary side, the second main printed circuit board including a plurality of RF transmission paths. The second main printed circuit board is aligned with the first main printed circuit board. Each phase shifter assembly may further include a first wiper rotatably coupled to the first main printed circuit board, the first wiper having a first attachment link and a second wiper rotatably coupled to the second main printed circuit board, the second wiper having a second attachment link. The first attachment link of the first wiper and the second attachment link of the second wiper are each configured to couple their respective wiper to a drive shaft of a mechanical linkage. The first and second wipers are configured to rotate in concert relative to the first and second main printed circuit boards to thereby adjust lengths of RF transmission paths on respective first and second main printed circuit boards.

The base station antenna may include at least two phase shifter assemblies. The first and second attachment links of one of the at least two phase shifter assemblies and the first and second attachment links of the second of the at least two phase shifter assemblies are configured to couple their respective wipers to a drive link that is coupled to the drive shaft of the mechanical linkage. The first and second wipers of each of the at least two phase shifter assemblies are configured to rotate in concert relative to their respective first and second main printed circuit boards to thereby adjust the phase of the base station antenna.

The polymeric mounting base of each phase shifter assembly may include mounting holes, and each of the phase shifter assemblies may be mounted to the reflector with nylon screws or rivets received through the mounting holes.

Each phase shifter assembly of the base station antenna may include mounting features integral with the polymeric mounting base and configured to be received by a plurality of mounting apertures in the reflector.

The mounting features of the mounting base may include a snap-lock or snap-fit feature.

BRIEF DESCRIPTION OF THE DRAWINGS

FIG. 1A is a perspective view of an example base station antenna according to embodiments of the present invention.

FIG. 6 is a partial primary side view of the device shown in FIG. 3A with a bracket and drive shaft according to embodiments of the present invention.

FIG. 7A is an enlarged minor side view of the device shown in FIG. 3A.

FIG. 7B is a greatly enlarged perspective view of the cable connector shown in FIG. 7A according to embodiments of the present invention.

FIG. 8A is a perspective first primary side view of electromechanical phase shifters that may be included in the base station antenna of FIGS. 1A-1B according to additional embodiments of the present invention

FIG. 9B is a bottom view of the second primary side of the device shown in FIG. 8A.

FIG. 10B is an exploded view of an example cable connector assembly for the device shown in FIG. 8A according to embodiments of the present invention.

FIG. 12 is a greatly enlarged perspective, minor side view of the device shown in FIG. 11A.

FIG. 13 is a greatly enlarged view of the PCB cable interface of the device shown in FIG. 12.

FIG. 19B is a side perspective view of another phase shifter assembly according to embodiments of the present invention.

FIG. 20A is a rear view of a base station antenna with the radome thereof removed showing a plurality of phase shifter assemblies in pairs aligned parallel with the reflector of the antenna.

FIG. 28 is a perspective view of another phase shifter assembly according to embodiments of the present invention including two phase shifter assemblies of FIG. 26A.

DETAILED DESCRIPTION

Figure 1B:
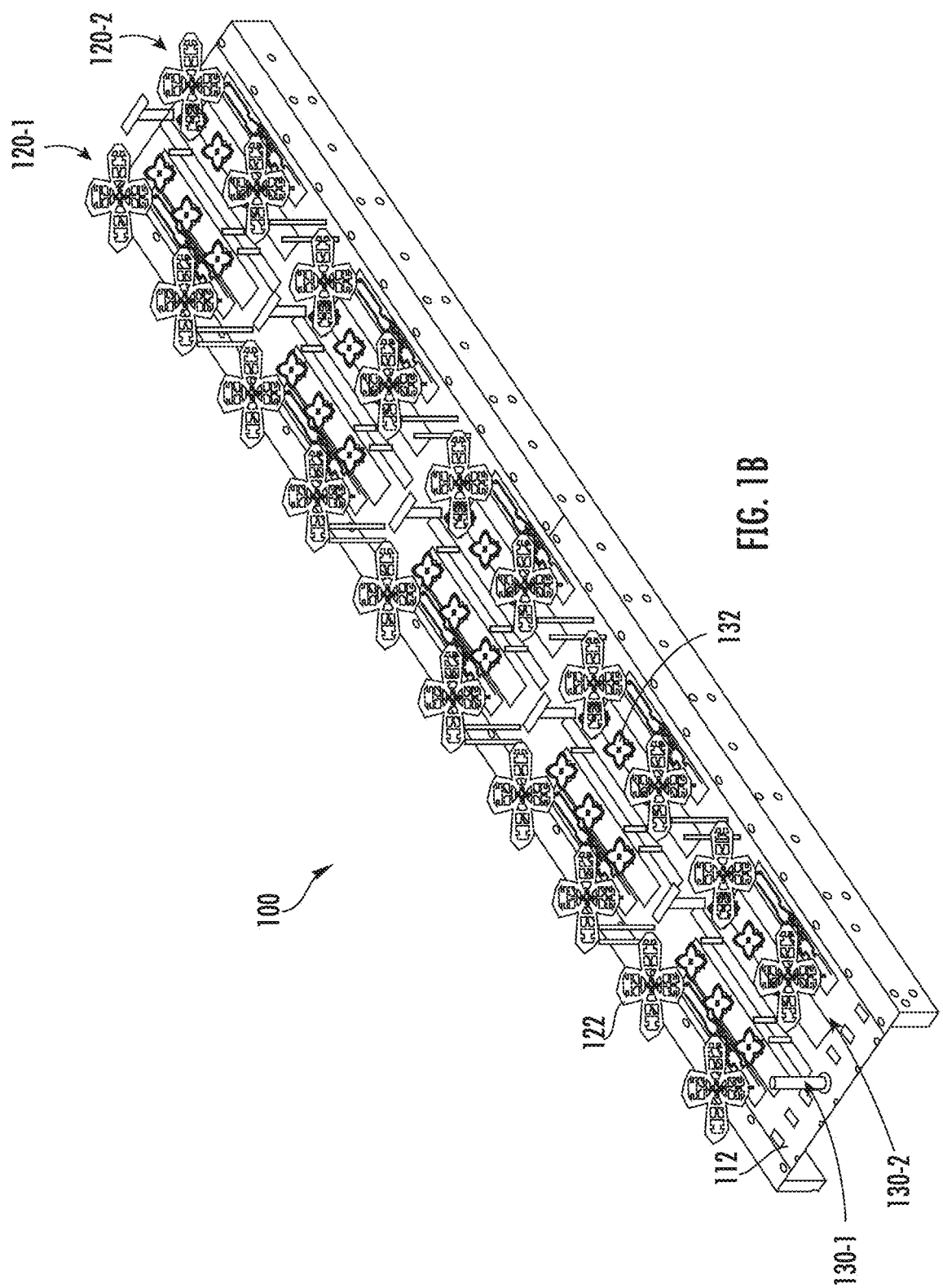
FIG. 1B is a perspective view of the base station antenna of FIG. 1A with the radome thereof removed.

Modern base station antennas often include two, three or more linear arrays of radiating elements, where each linear array has an electronically adjustable down tilt. The linear arrays typically include cross-polarized radiating elements, and a separate phase shifter is provided for electronically adjusting the down tilt of the antenna beam for each polarization, so that the antenna may include twice as many phase shifters as linear arrays. Moreover, in many antennas, separate transmit and receive phase shifters are provided so that the transmit and receive radiation patterns may be independently adjusted. This again doubles the number of phase shifters. Thus, it is not uncommon for a base station antenna to have eight, twelve or more phase shifters for applying remote electronic down tilts to the linear arrays. As described above, RET actuators are provided in the antenna that are used to adjust the phase shifters. While the same downtilt is typically applied to the phase shifters for the two different polarizations, allowing a single RET actuator and a single mechanical linkage to be used to adjust the phase shifters for both polarizations, modern base station antennas still often include four, six or more RET actuators (or, alternatively, one or two multi-RET actuators) and associated mechanical linkages.

In order to change the downtilt angle of an antenna beam generated by a linear array on a base station antenna, a control signal may be transmitted to the antenna that causes a RET actuator associated with the linear array to generate a desired amount of movement in an output member thereof. The movement may comprise, for example, linear movement or rotational movement. A mechanical linkage is used to translate the movement of the output member of the RET actuator to movement of a moveable element of a phase shifter (e.g., a wiper PCB) associated with the linear array. Accordingly, each mechanical linkage may extend between the output member of the RET actuator and the moveable element of the phase shifter. Typically, a mechanical linkage may comprise a series of longitudinally-extending plastic or fiberglass RET rods that are connected by RET linkages that extend in the width and/or depth directions of the antenna. The RET linkages connect the RET rods to each other and/or to the RET actuator or the phase shifter.

Pursuant to embodiments of the present invention, base station antennas with new phase shifter assemblies are provided that may reduce one or more of hardware, footprint requirements, volumetric space requirements, surface area requirements, mechanical stack up tolerances, and/or costs over conventional phase shifters. Embodiments of the invention may provide improved access to solder joints for service and/or installation ease.

Embodiments of the present invention will now be discussed in greater detail with reference to the drawings. In some cases, two-part reference numerals are used in the drawings. Herein, elements having such two-part reference numerals may be referred to individually by their full reference numeral (e.g., linear array 120-2) and may be referred to collectively by the first part of their reference numerals (e.g., the linear arrays 120). Like numbers refer to like elements throughout and different embodiments of like elements can be designated using a different number of superscript indicator apostrophes (e.g., 10, 10', 10").

FIG. 1A is a perspective view of a RET base station antenna 100 according to embodiments of the present invention. FIG. 1B is a perspective view of the base station antenna 100 with the radome removed to show the four linear arrays of radiating elements that are included in antenna 100.

As shown in FIG. 1A, the RET base station antenna 100 includes a radome 102, a mounting bracket 104, and a bottom end cap 106. A plurality of input/output ports 110 are mounted in the end cap 106. Coaxial cables (not shown) may be connected between the input/output ports 110 and the RF ports on one or more radios (not shown). These coaxial cables may carry RF signals between the radios and the base station antenna 100. The input/output ports 110 may also include control ports that carry control signals to the base station antenna 100 from a controller that is located remotely from base station antenna 100. These control signals may include control signals for electronically changing the tilt angle of the antenna beams generated by the base station antenna 100.

For ease of reference, FIG. 1A includes a coordinate system that defines the length (L), width (W) and depth (D) axes (or directions) of the base station antenna 100 that may be referred to in the application.

FIG. 1B is a perspective view of the base station antenna of FIG. 1A with the radome 102 removed. As shown in FIG. 1B, the base station antenna 100 includes two linear arrays 120-1, 120-2 of low-band radiating elements 122 (i.e., radiating elements that transmit and receive signals in a lower frequency band) and two linear arrays 130-1, 130-2 of high-band radiating elements 132 (i.e., radiating elements that transmit and receive signals in a higher frequency band). Each of the low-band radiating elements 122 is implemented as a cross-polarized radiating element that includes a first dipole that is oriented at an angle of −45° with respect to the azimuth plane and a second dipole that is oriented at an angle of +45° with respect to the azimuth plane. Similarly, each of the high-band radiating elements 132 is implemented as a cross-polarized radiating element that includes a first dipole that is oriented at an angle of −45° with respect to the azimuth plane and a second dipole that is oriented at an angle of +45° with respect to the azimuth plane. Since cross-polarized radiating elements are provided, each linear array 120-1, 120-2, 130-1, 130-2, for example, will generate two antenna beams, namely a first antenna beam generated by the −45° dipoles and a second antenna beam generated by the +45° dipoles. The radiating elements 122, 132 extend forwardly from a backplane 112 which may comprise, for example, a sheet of metal that serves as a ground plane for the radiating elements 122, 132.

Figure 2:
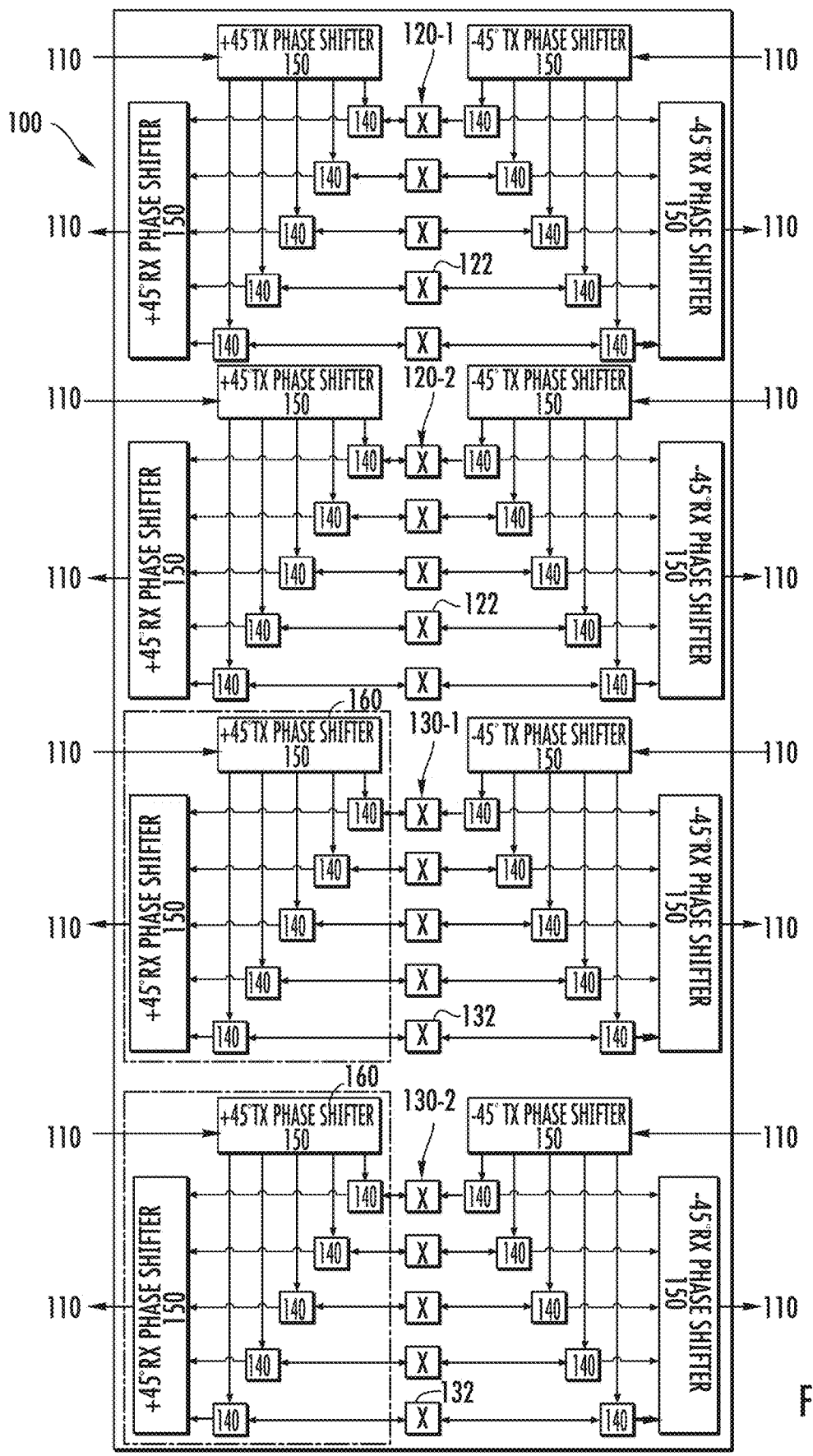
FIG. 2 is a schematic block diagram illustrating the electrical connections between various of the components of the base station antenna of FIGS. 1A-1B.

FIG. 2 is a schematic block diagram illustrating various additional components of the RET base station antenna 100 and the electrical connections therebetween. It should be noted that FIG. 2 does not show the actual location of the various elements on the antenna 100, but instead is drawn to merely show the electrical transmission paths between the various elements.

As shown in FIG. 2, each input/output port 110 may be connected to a phase shifter 150. The base station antenna 100 performs duplexing between the transmit and receive sub-bands for each linear array 120, 130 within the antenna (which allows different downtilts to be applied to the transmit and receive sub-bands), and hence each linear array 120, 130 includes both a transmit (input) port 110 and a receive (output) port 110. A first end of each transmit port 110 may be connected to the transmit port of a radio (not shown) such as a remote radio head. The other end of each transmit port 110 is coupled to a transmit phase shifter 150. Likewise, a first end of each receive port 110 may be connected to the receive port of a radio (not shown), and the other end of each receive port 110 is coupled to a receive phase shifter 150. Two transmit ports, two receive ports, two transmit phase shifters and two receive phase shifters are provided for each linear array 120, 130 to handle the two different polarizations.

Each transmit phase shifter 150 divides an RF signal input thereto into five sub-components, and applies a phase taper to these sub-components that sets the tilt (elevation) angle of the antenna beam generated by an associated linear array 120, 130 of radiating elements 122, 132. The five outputs of each transmit phase shifter 150 are coupled to five respective duplexers 140 that pass the sub-components of the RF signal output by the transmit phase shifter 150 to five respective sub-arrays of radiating elements 122, 132. In the example antenna 100 shown in FIG. 1A, FIG. 1B and FIG. 2, each low-band linear array 120 includes ten low-band radiating elements 122 that are grouped as five sub-arrays of two radiating elements 122 each. Each high-band linear array 130 includes fifteen high-band radiating elements 132 that are grouped as five sub-arrays of three radiating elements 132 each.

Each sub-array of radiating elements passes received RF signals to a respective one of the duplexers 140, which in turn route those received RF signals to the respective inputs of an associated receive phase shifter 150. The receive phase shifter 150 applies a phase taper to each received RF signal input thereto that sets the tilt angle for the receive antenna beam and then combines the received RF signals into a composite RF signal. The output of each receive phase shifter 150 is coupled to a respective receive port 110.

While FIG. 1B and FIG. 2 show an antenna having two linear arrays 120 of ten low-band radiating elements 122 each and two linear arrays 130 of fifteen high-band radiating elements 132 each, it will be appreciated that the number of linear arrays 120, 130 and the number of radiating elements 122, 132 included in each of the linear array 120, 130 may be varied. It will also be appreciated that duplexing may be done in the radios instead of in the antenna 100, that the number(s) of radiating elements 122, 132 per sub-array may be varied, that different types of radiating elements may be used (including single polarization radiating elements) and that numerous other changes may be made to the base station antenna 100 without departing from the scope of the present invention.

As can be seen from FIG. 2, the base station antenna 100 may include a total of sixteen phase shifters 150. While the two transmit phase shifters 150 for each linear array 120, 130 (i.e., one transmit phase shifter 150 for each polarization) may not need to be controlled independently (and the same is true with respect to the two receive phase shifters 150 for each linear array 120, 130), there still are eight sets of two phase shifters 150 each that should be independently controllable.

Each phase shifter 150 shown in FIG. 2 may be implemented, for example, as a rotating wiper phase shifter. The phase shifts imparted by a phase shifter 150 to each subcomponent of an RF signal may be controlled by a mechanical positioning system that physically changes the position of the rotating wiper of each phase shifter 150, as will be explained with reference to FIG. 3. It will be appreciated that other types of phase shifters may be used instead rotating wiper phase shifters such as, for example, trombone phase shifters, sliding dielectric phase shifters and the like.

Referring now to FIGS. 3A, 3B, 4A, 4B and 5, a wiper phase shifter assembly 200 is illustrated that may be used to implement, for example, two of the phase shifters 150 of FIG. 2. The wiper phase shifter assembly 200 includes first and second phase shifters 202A, 202B. To be clear, in the description, the two phase shifters 202A, 202B may be described as each being transmit phase shifters that have one input 230 and five outputs 240. It will be appreciated that if the phase shifters 202A, 202B are instead used as receive phase shifters then the terminology changes, because when used as receive phase shifters there are five inputs and a single output.

Figure 3A:
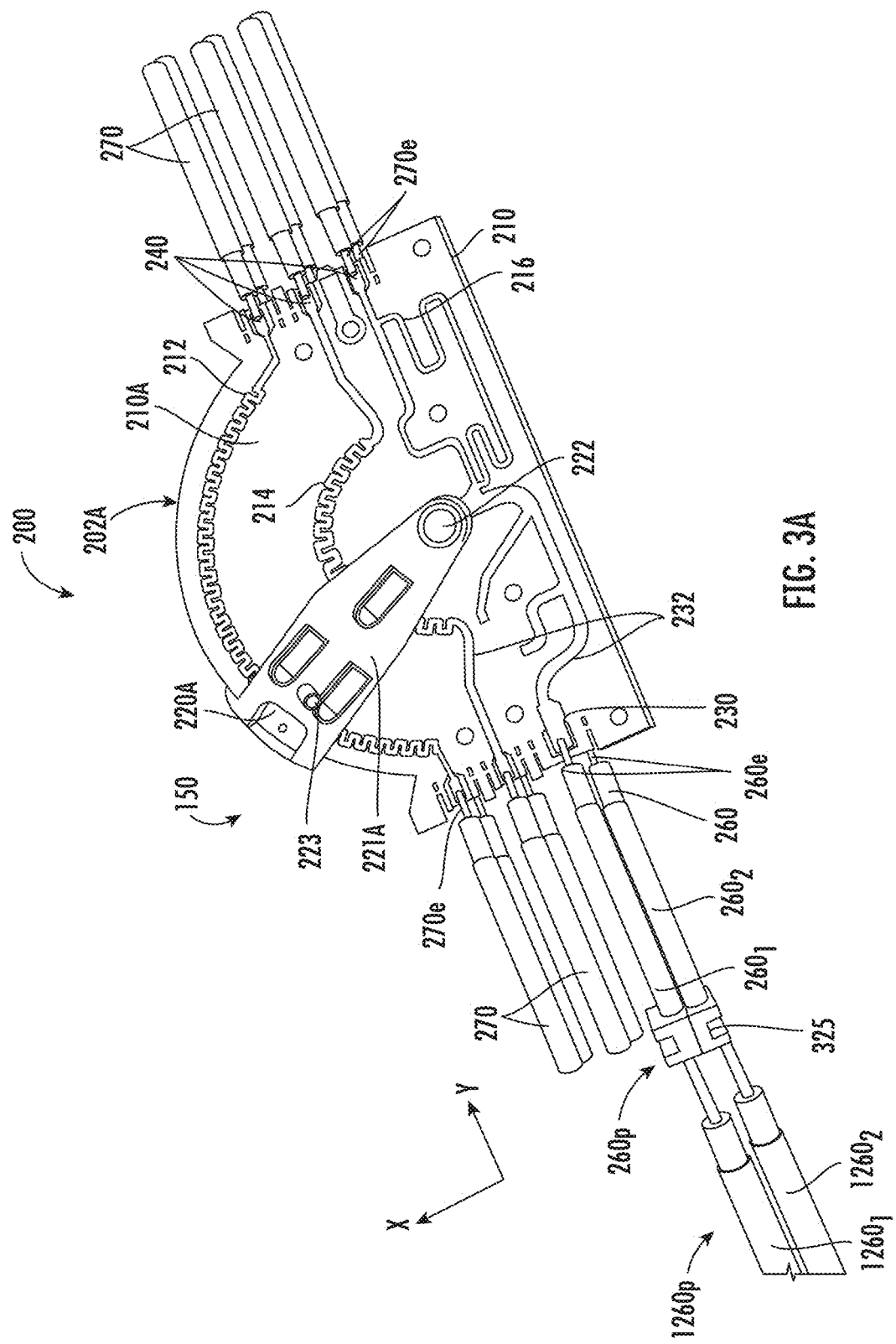
FIG. 3A is a perspective first primary side view of an electromechanical phase shifter assembly with phase shifters that may be included in the base station antenna of FIGS. 1A-1B according to embodiments of the present invention.

As shown in FIG. 3A, the phase shifter assembly 200 includes a single main (stationary) printed circuit board 210 (the term "printed circuit board" can be interchangeably referred to as "PCB" herein) that is double-sided providing different phase shifters 202A, 202B, respectively, one on each side of the main PCB 210. The main PCB 210 and can have a primary first side 210A (i.e., a primary first surface) with a plurality of transmission lines 212, 214, 216 and a primary opposing second side (i.e., a primary second surface) 210B with transmission lines 212, 214, 216. The dual phase shifter 200 also includes a rotatable wiper 220, shown as comprising first and second rotatable wiper printed circuit boards 220A, 220B that are each rotatably coupled to the single respective main printed circuit board 210, one of the wiper printed circuit boards on one side of the main PCB and the other parallel with an on the opposing side of the main PCB, with a ground plane 210G (FIG. 5) of the main PCB 210 therebetween. The wiper 220 can be pivotally mounted on the main printed circuit board 210 at a pivot joint provided by a pivot pin 222 so that both wiper printed circuit boards 220A, 220B rotate in concert in a desired direction relative to the main PCB 210.

As shown, in some embodiments, the main PCB 210 can have a perimeter 210p which can include one arcuate side and three straight linear sides. The outer end of the wiper 220e can extend outside of and about the arcuate side.

Figure 3B:
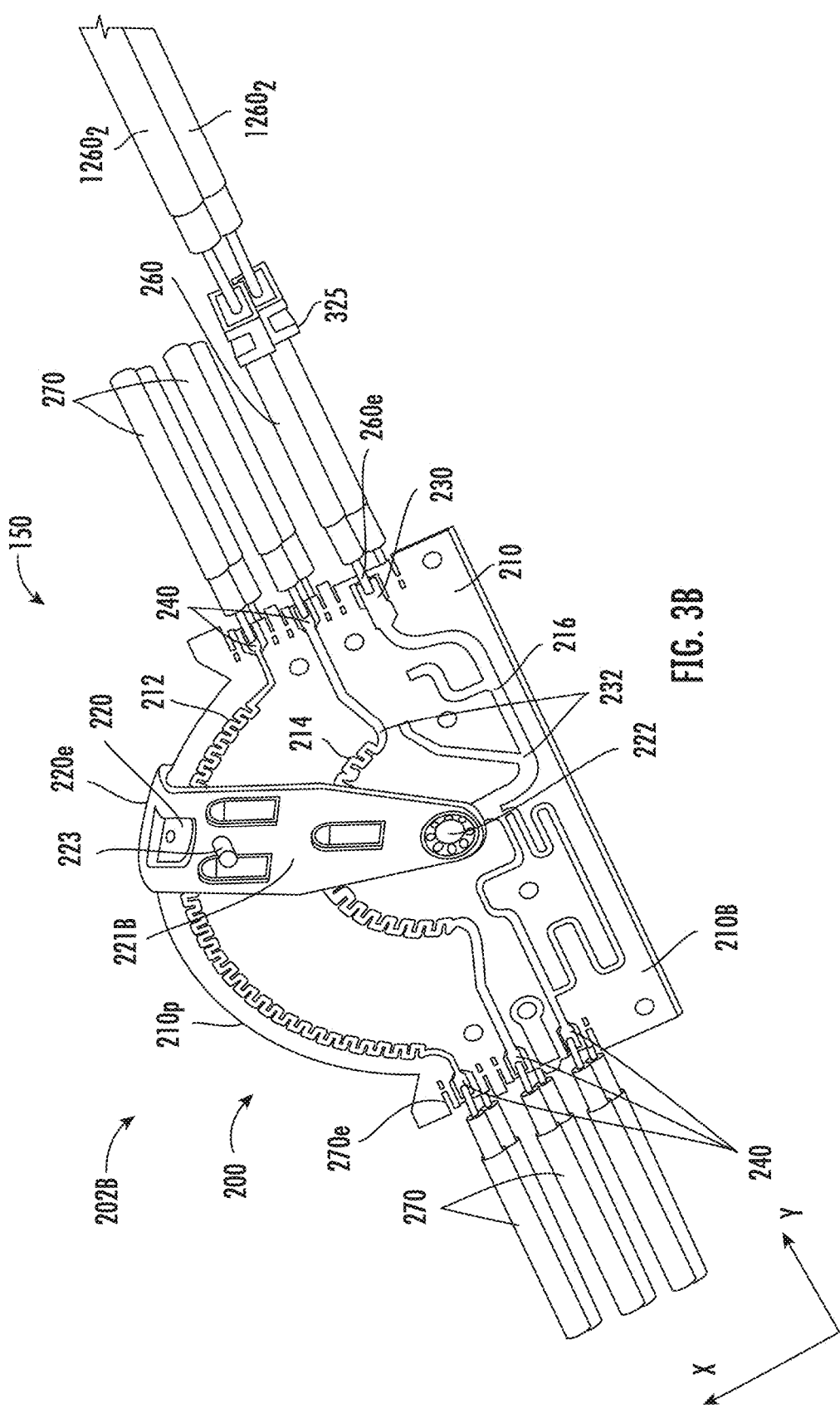
FIG. 3B is a perspective opposing second primary side view of the electromechanical phase shifters shown in FIG. 3A.
Figure 5:
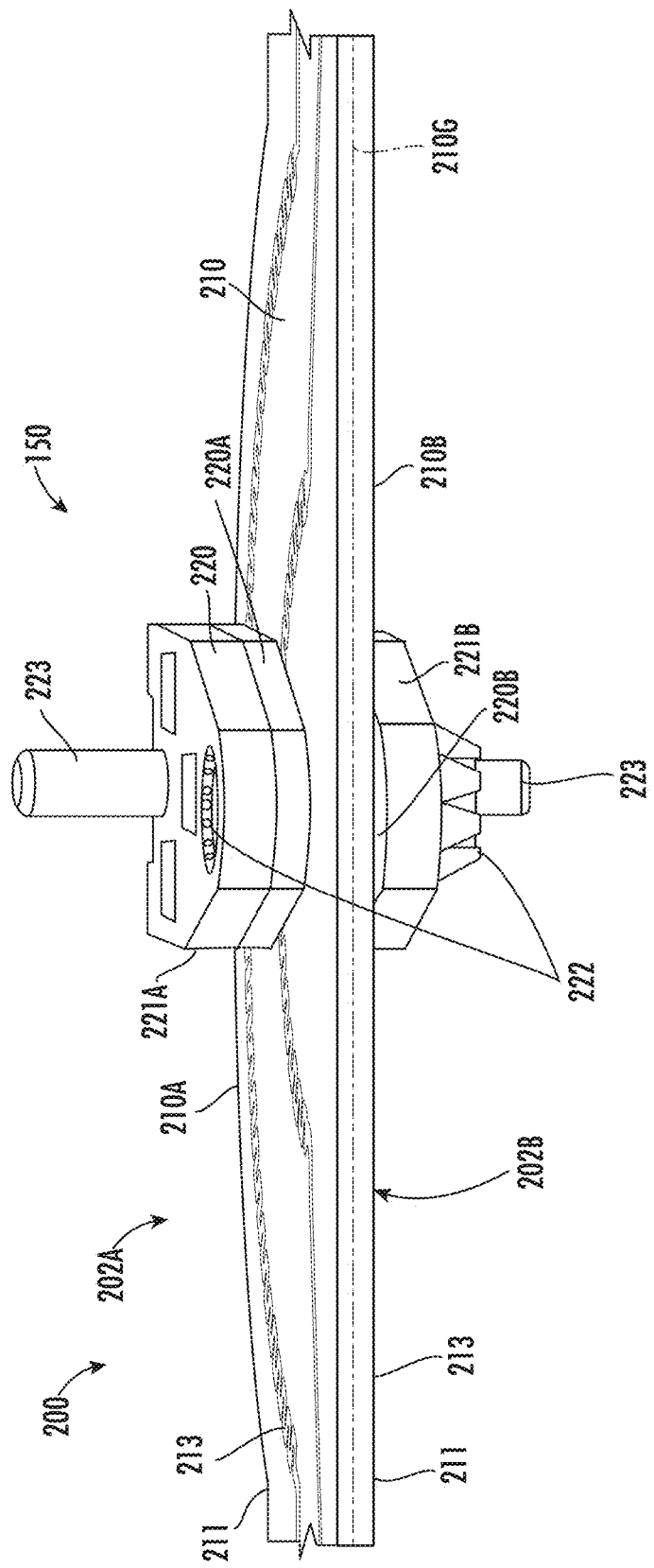
FIG. 5 is a greatly enlarged end view of the device shown in FIG. 3A, shown without the coaxial cables.
Figure 8B:
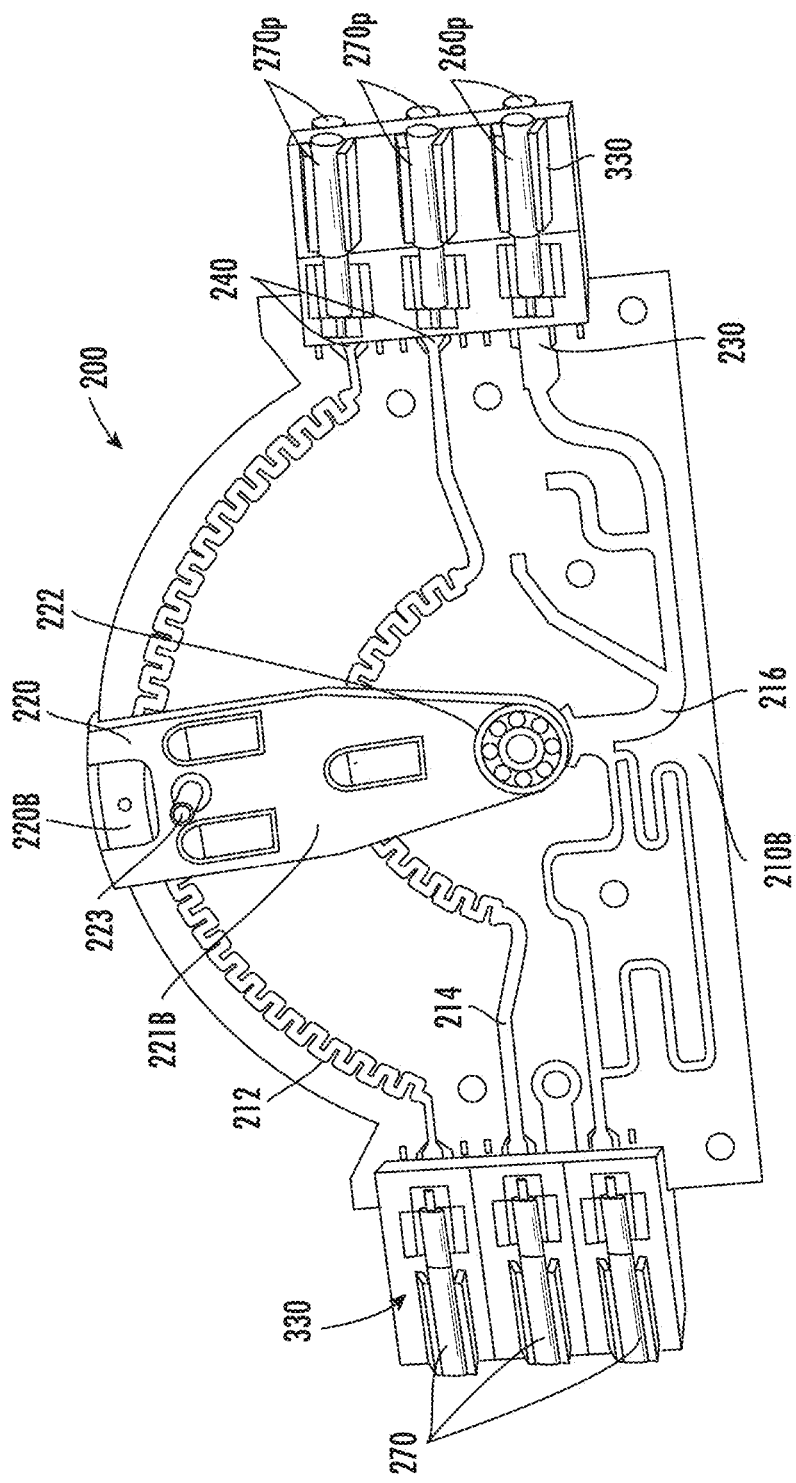
FIG. 8B is a perspective opposing second primary side view of the electromechanical phase shifters shown in FIG. 8A.
Figure 9A:
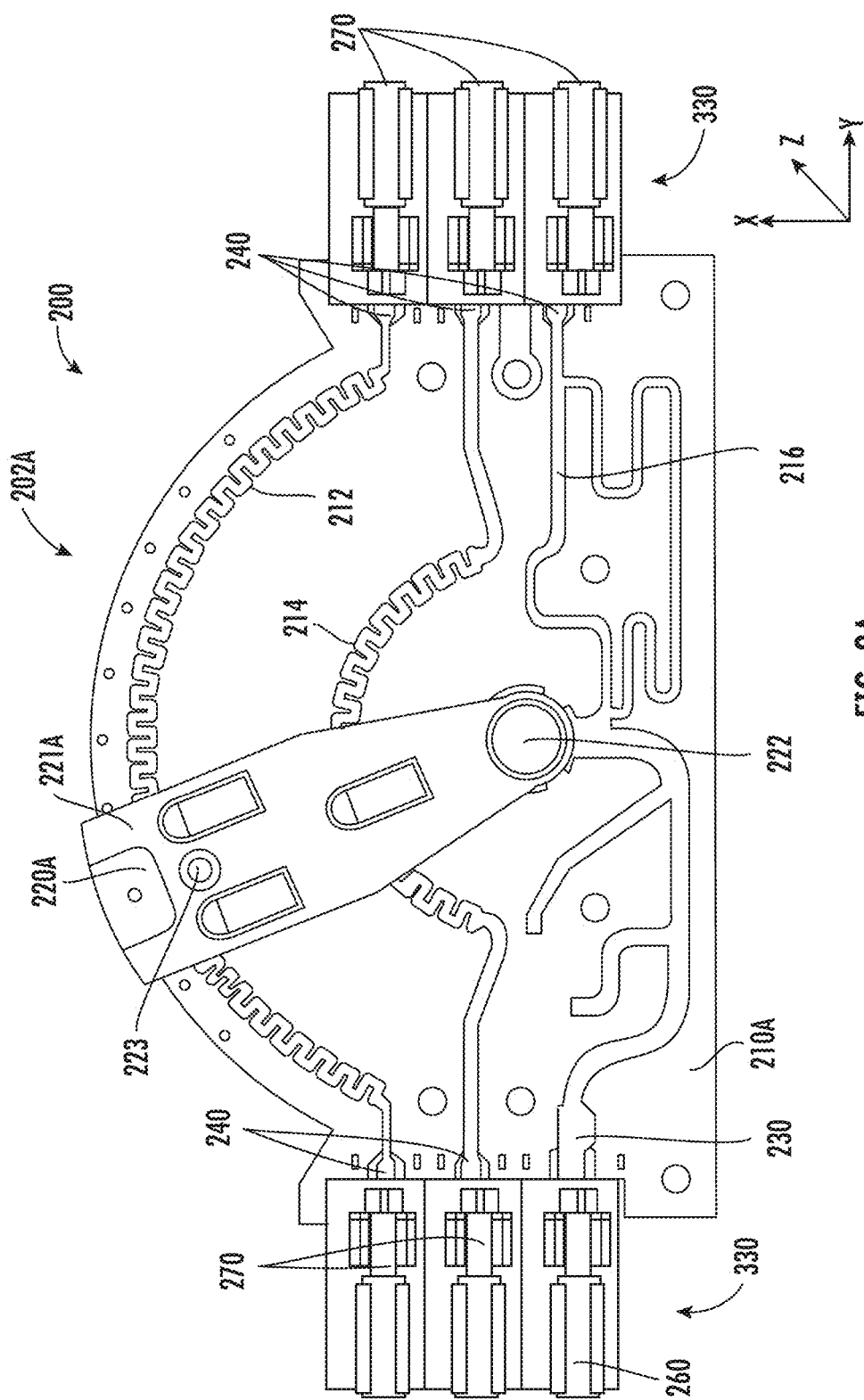
FIG. 9A is a top view of the first primary side of the device shown in FIG. 8A.

Referring to FIGS. 3B, 5 and 6, the wiper 220 can have a body with a closed outer end 220e that couples first and second wiper arms 221A, 221B that hold respective first and second wiper printed circuit boards 220A, 220B. The wiper 220 can have an attachment link 223 that can couple to a bracket 224 that connects to a drive shaft 228 of a mechanical linkage allowing the RET directional input for phase shift adjustment. Thus, the parallel wiper arms 221A, 221B may be joined together at their outer or distal ends via a bracket 224. However, the wiper arms 221A, 221B may be decoupled from each other and comprise different attachment links to connect to the same or a different drive shaft (not shown). As shown, the protruding attachment link 223 is orthogonal to the arms 221A, 221B and also extends outward from each of the arms 221A, 221B. However, the attachment link 223, where used, can protrude off a single one of the arms or a different attachment configuration can be used.

The position of each rotatable wiper printed circuit boards 220A, 220B relative to the main printed circuit board 210 is controlled by the position of a drive shaft 228 (partially shown in FIG. 6), the end of which may constitute one end of a mechanical linkage. The other end of the mechanical linkage (not shown) may be coupled to an output member of a RET actuator.

As discussed above, each side 210A, 210B of the main printed circuit board 210, 210a includes transmission line traces 212, 214. The transmission line traces 212, 214 can be curvilinear and include arcuate segments. In some embodiments, the transmission line traces 212, 214 may be disposed in a serpentine pattern to achieve a longer effective length. In the example illustrated in FIGS. 3A, 3B, 4A, 4B, and 6, for example, there are two curvilinear transmission lines with arcuate segment traces 212, 214 on each side 210A, 210B of the main printed circuit board 210. The first transmission line trace 212 can be disposed along an outer perimeter of one side of the printed circuit board 210 and the second transmission line trace 214 can be disposed more medially to the main PCB 210 typically on a shorter radius concentrically within the outer transmission line trace 212. A third transmission line trace 216 on each side 210A, 210B of the main printed circuit board 210 connects an input pad 230 to an output pad 240 that is not required to be subjected to an adjustable phase shift.

An arcuate segment of the first transmission line 212 can reside adjacent the arcuate side of the main PCB 210.

Referring to FIGS. 3A and 3B, the main PCB 210 includes one or more input traces 232 leading from the input pad 230 near an edge of the main printed circuit board 210 to the position where the pivot pin 222 is located. RF signals on a respective input trace 232 are coupled to a transmission line trace on a corresponding wiper printed circuit board 220A, 220B, typically via a capacitive connection. The transmission line trace on the respective wiper printed circuit board 220A, 220B may split into a plurality of (i.e., two) secondary transmission line traces (not shown). The RF signals can be capacitively coupled from the secondary transmission line traces on the wiper printed circuit board 220A, 220B to the transmission line traces 212, 214 on the main printed circuit board. Each end of each transmission line trace 212, 214 may be coupled to a respective output pad 240. A coaxial cable 260 or other RF transmission line component may be connected to input pad 230. A respective coaxial cable 270 or other RF transmission line component may be connected to each respective output pad 240. As the wiper printed circuit boards 220A, 220B move, an electrical path length from the input pad 230 of a respective phase shifter 202A, 202B to each corresponding output pad 240 changes.

For example, as each wiper printed circuit board 220A, 220B moves (in concert) to the left it shortens the electrical length of the path from a corresponding input pad 230 to a corresponding output pad 240 connected to the left side of transmission line trace 212 (which connects to a first sub-array of radiating elements), while the electrical length from the input pad 230 to the output pad 240 connected to the right side of transmission line trace 212 (which connects to a second sub-array of radiating elements) increases by a corresponding amount. These changes in path lengths result in phase shifts to the signals received at the output pads 240 connected to transmission line trace 212 relative to, for example, the output pad 240 connected to transmission line trace 216.

One or more of the transmission lines 212, 214, 216 on each side 210A, 210B of the main PCB 210 can be aligned in the X and Y direction, i.e., have a duplicate geometry that is symmetrically arranged, one above the other and spaced apart from each other the thickness of the main PCB 210.

In some embodiments, corresponding pairs of pads 230 and/or 240 on each side 210A, 210B of the main PCB 210 for each phase shifter 202A, 202B can be aligned in a Y direction and offset in an X direction. Thus, as shown in FIGS. 3A and 3B and FIGS. 4A and 4B, one input pad 230 on the first primary surface/side of the main PCB 210A (measured from a centerline thereof) can reside a distance $x_1$ from a bottom edge of the main PCB 210 and the other input pad 230 on the other primary surface/side of the main PCB 210B can reside a distance $x_2$ (also measured from the centerline thereof) from the bottom edge of the main PCB 210. This can allow pairs of the coaxial cables 260 and 270 that connect to input/output pads 230, 240 on each side of the main PCB to reside laterally adjacent each other rather than stacked one above the other for connection to the main PCB 210. The end portions 260e, 270e of the respective cables 260, 270 that engage the pads 230/240 can extend in a straight linear configuration forward over a respective pad 230/240 without interference between adjacent cables on the different sides 210A, 210B of the main PCB 210.

Figure 4A:
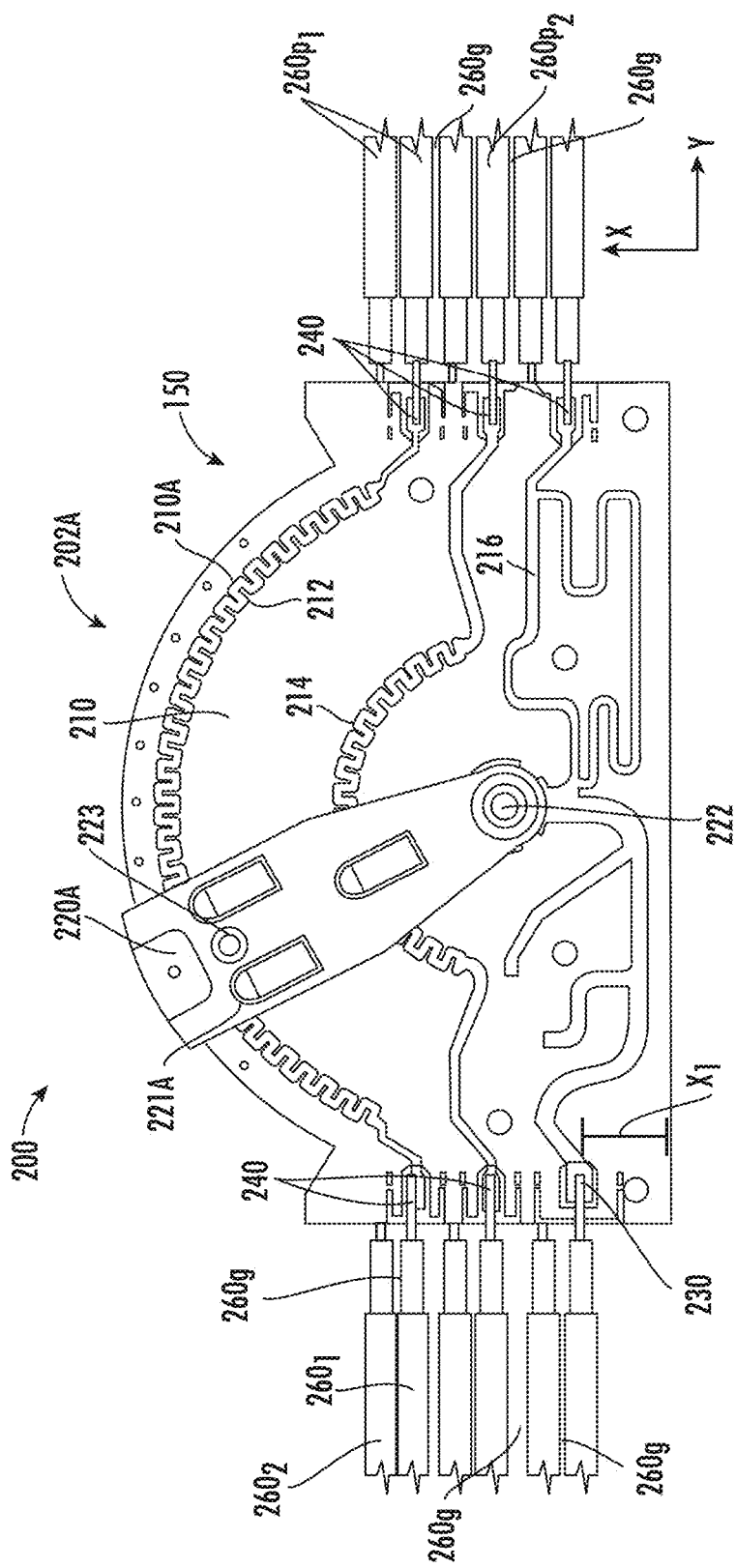
FIG. 4A is a top view of the first primary side of the device shown in FIG. 3A.
Figure 4B:
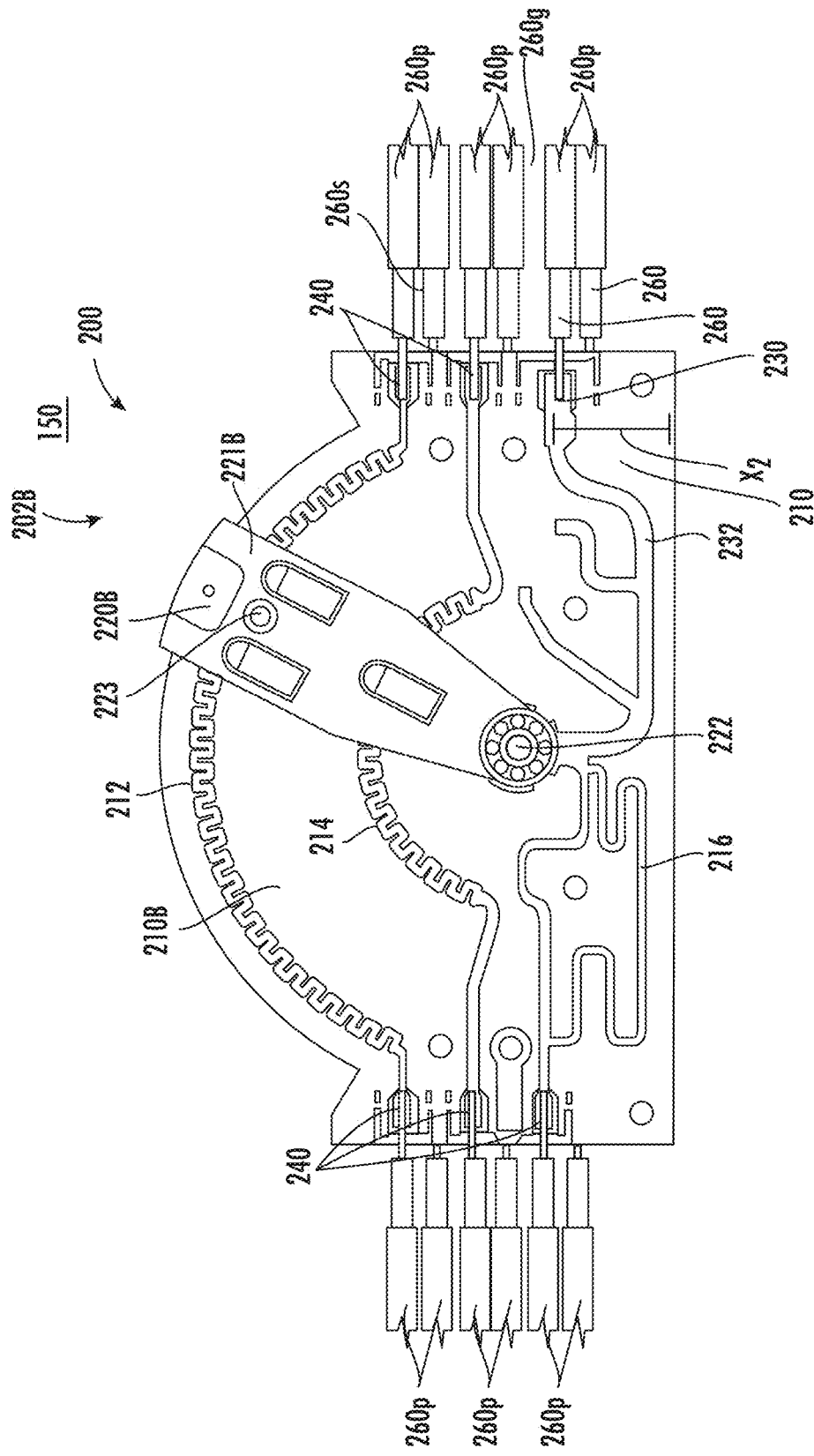
FIG. 4B is a bottom view of the second primary side of the device shown in FIG. 3A.

Referring to FIG. 4A, neighboring pairs of cables $260p_1$, $260p_2$ can be separated by a longitudinally extending gap 260g. The gap 260g can have an X direction dimension that is greater than an X direction dimension of a gap 260g between each cable $260_1$, $260_2$ of a respective cable pair 260p.

Depending on the thickness of the main PCB 210, different cable connection and/or PCB interfaces can be used. Other example embodiments will be discussed below.

Referring to FIG. 5, the main PCB 210 can comprise a ground plane 210G sandwiched between first and second dielectric layers 211 and with the conductive transmission lines 212, 214, 216 and pads 230, 240 provided as conductive trace layers 213 on outer surfaces of the first and second dielectric layers 211. In some embodiments, the main PCB 210 can have multiple layers, with one or more copper layers. Each respective copper layer can be sandwiched between dielectric material layers. In some embodiments, the main PCB 210 can comprise at least five layers (i.e., five, six, seven, eight, nine, ten or even more layers) and can have a thickness in a range of about 2 mm to about 10 mm, more typically a range of about 3 mm to about 5 mm.

Referring to FIGS. 3A, 3B, 7A and 7B, the phase shifter assembly 200 can include at least one transition block connector 325 that can reside outside a boundary of the main PCB 210 and can couple pairs 1260p of larger cables $1260_1$, $1260_2$ to corresponding pairs 260p of smaller outer diameter (and shorter length) coaxial cables $260_1$, $260_2$. The centerlines of the first and second larger cables $1260_1$, $1260_2$ can be closely spaced from each other, optionally offset a distance d1 in a depth (Z direction) and a distance d2 in the X direction. The transition block connector 325 can allow a suitable mechanical connection for cable size reduction to avoid physical interference at the main PCB 210. The transition block connector 325 can be configured to frictionally engage each of the two pairs of cables 260p, 1260p.

FIGS. 8A, 8B, 9A, 9B and 10A illustrate another embodiment of a phase shifter assembly 200. In this embodiment, one or more connector block assemblies 330 can be used to provide the interface connection of the coaxial cables 260, 270 to the main PCB 210. Each connector block assembly 330 can be configured to hold a plurality of pairs of cables 260p, 270p. The connector block assembly 330 can be configured to hold each pair of cables 260p, 270p stacked in the Z direction (one above another in the orientation of the main PCB 210 shown) and aligned in the X and Y directions. The connector block assembly 330 can hold a plurality of cables 260/270 in parallel rows, with one set of rows adjacent the first primary side 210A and a second set of rows adjacent the second primary side 210B to route and support respective coaxial cables 260/270 to the first and second primary sides of the main PCB 210.

The cable connector block assembly 330 may help restrict undesired movement of the antenna RF cables, and may strengthen electrical connections with the antenna RF cables, thereby improving performance of the associated base station antenna.

Referring to FIG. 10B, an example cable connector block assembly 330 is shown. The assembly 330 can include a plurality of cable retention clips 331. Each clip 331 can define a longitudinally extending channel or recess 331r that is sized and configured to receive and retain a respective RF cable 260 or 270. The clips 331 can hold the cables 260 or 270 in place during a soldering process and provide strain relief when a tower supporting a base station antenna that includes the cable connector block assembly 330 is subject to wind or other vibrations.

The clips 331 may be on a first end portion 332f of a connector block 332, further away from the main PCB 210 than a second end of the connector block 332. The cable connector block assembly 330 can also include metal members 330M in recessed portions of the connector block 332. A first set of the metal members 330M may be adjacent the clips 331, and a second set of the metal members 330M may be on the second end portion 332s of the connector block 332. FIG. 10B illustrates that an adhesive layer 334 may optionally be provided between the connector block 332 and the main PCB 210. The shape of, and openings 334a in, the adhesive layer 334 may conform to the main PCB 210.

The connector block assembly 330 can comprise one or more protruding portions 336 that can extend through respective openings 209 in the main PCB 210. The adhesive layer 334 and/or the protruding portion(s) 336 may help to keep the connector block 332 in a stationary position on the main PCB 210. The main PCB 210 may further include apertures 234, 235 that are configured to receive protruding portions of the different sets of metals 330M.

FIG. 10B also illustrates that each of the cables 270 may include four different portions: (1) a center conductor 270C, (2) a dielectric separator 270D, (3) a ground sleeve 270G, and (4) an insulating cover 270I. In some embodiments, the center conductor 270C may be referred to as an "inner" conductor or a "lead" conductor. The connector block assembly 330 can ground the cables 260, 270 directly to the main PCB 210 using the metal members 330M.

Figure 10A:
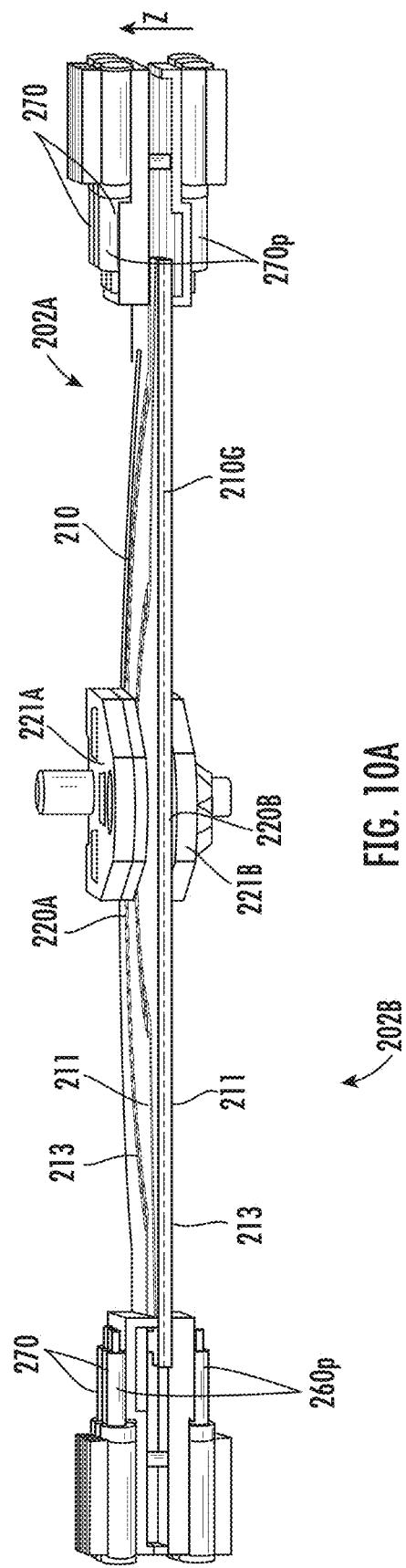
FIG. 10A is a greatly enlarged perspective, minor side view of the device shown in FIG. 8A.
Figure 11A:
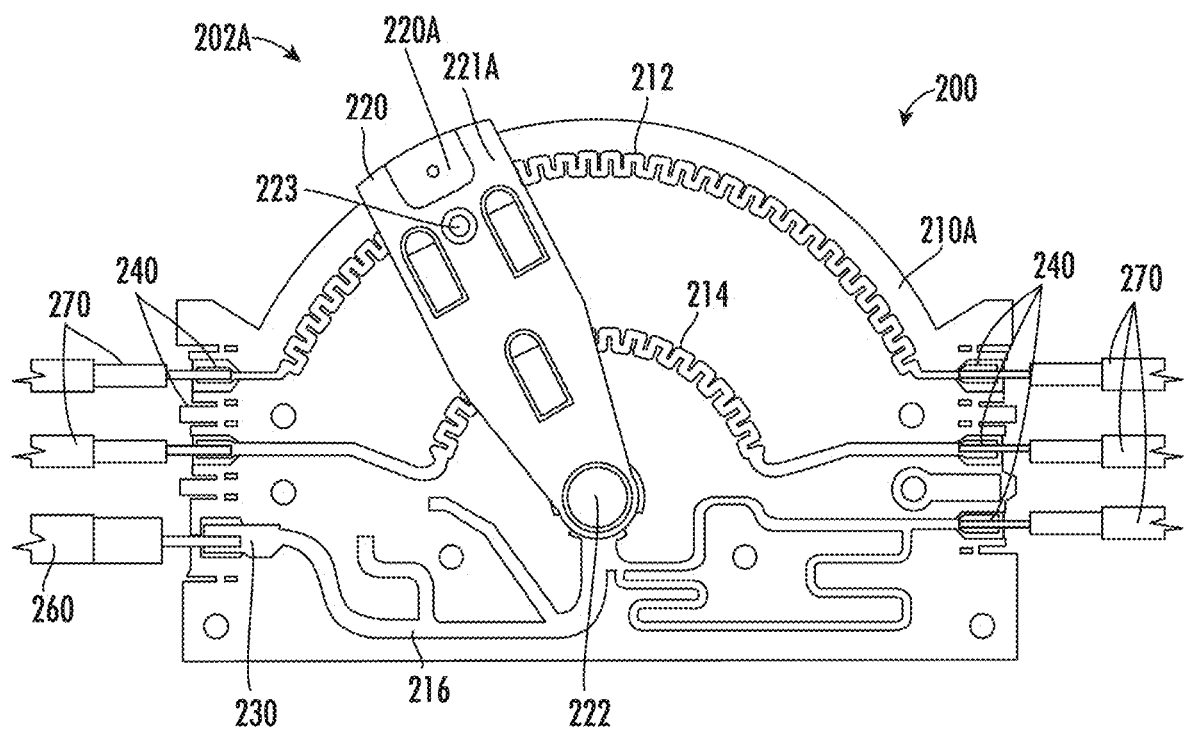
FIG. 11A is a perspective first primary side view of electromechanical phase shifters that may be included in the base station antenna of FIGS. 1A-1B according to additional embodiments of the present invention
Figure 11B:
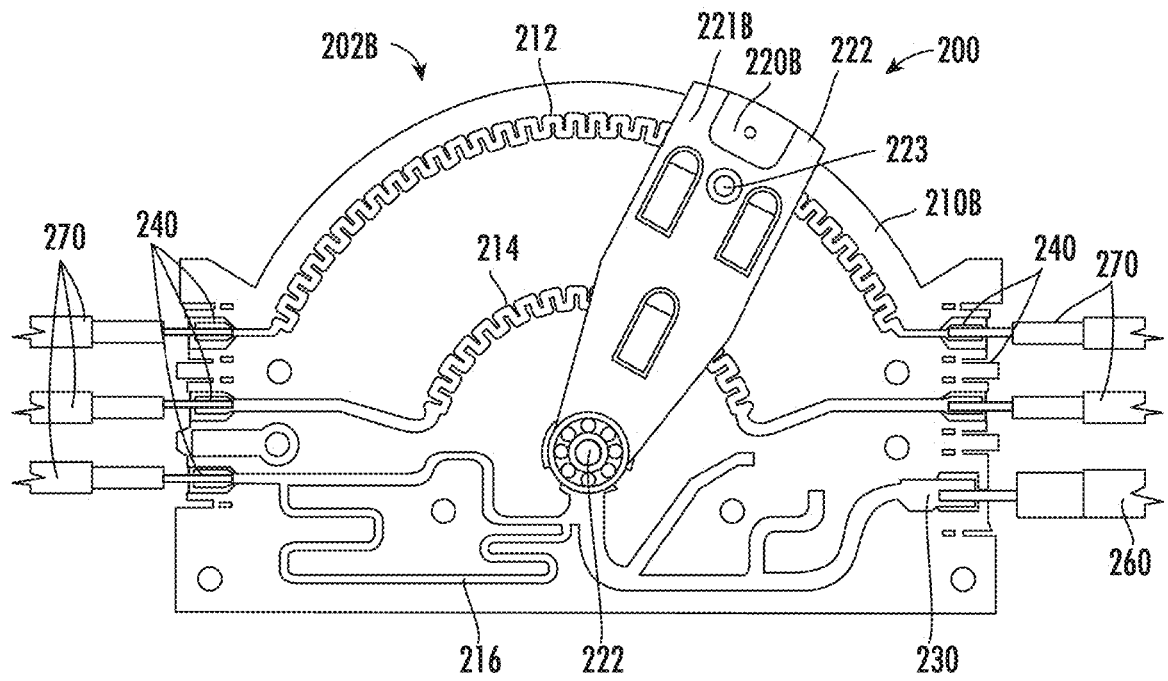
FIG. 11B is a perspective opposing second primary side view of the electromechanical phase shifters shown in FIG. 11A.
Figure 11C:
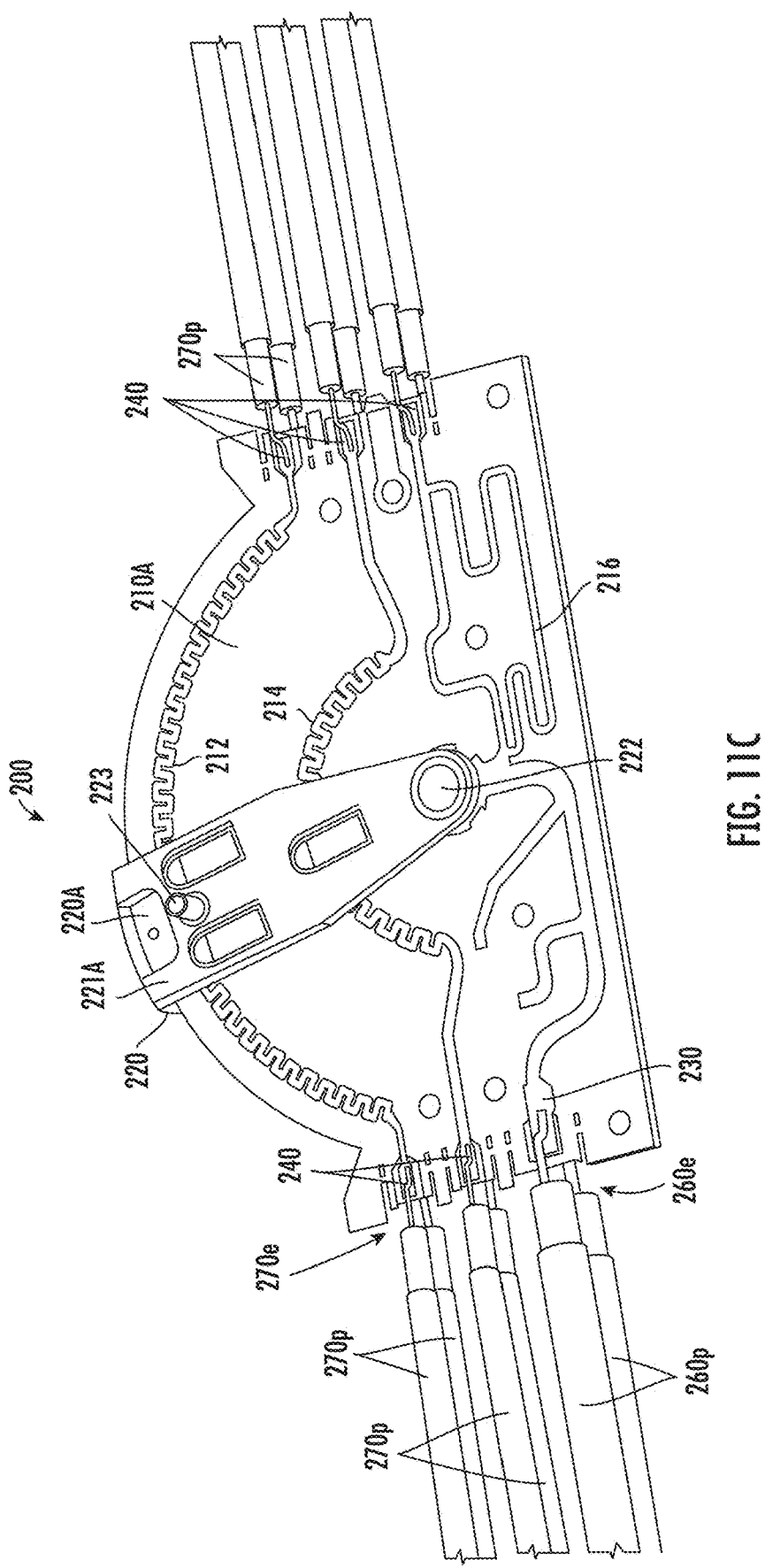
FIG. 11C is a side, top perspective view of the device shown in FIG. 11A.

Although three pairs of cables 270p are held by each connector block assembly 330, three cables 260/270 facing the first side of the main PCB 210A and three cables 260/270 facing a second side of the main PCB 210B, as illustrated in FIGS. 10A and 10B, the connector block 332 may be configured to receive more or fewer of the cables 270 and/or 260. For example, the connector block 332 may be configured to receive one, two, four, five, six, seven, eight, or more of the cables 270 and/or 260. For additional details of example connector block assemblies, see co-pending U.S. patent application Ser. No. 16/052,844, the contents of which are hereby incorporated by reference as if recited in full herein.

Referring now to FIGS. 11A, 11B, 11C, 12 and 13, another embodiment of a phase shifter assembly 200 is shown. In this embodiment, center conductors of pairs of cables 260p, 270p can each have an end portion 260e, 270e that is bent toward the other, across a thickness of the main PCB 210, to have a first terminal segment 261, 271 that merges into an adjacent second terminal segment 262, 272 configured to place the main body of the cable 260, 270 a distance away from the main PCB 210 with the second segment 262, 272 being planar and residing closer to the main PCB 210. Referring to FIG. 13, the second terminal segments 262, 272 can be parallel to the primary sides/surfaces 210A, 210B of the main PCB 210 and can reside at an angle β measured from an axially extending centerline (C/L) of the first terminal segment 261, 272 and/or primary body of the cable 260, 270. The angle β can be between 45 degrees and 90 degrees, more typically between 60-90 degrees. The cables 260, 270 can be provided for installation with the ends pre-bent or a tool may be provided to allow a technician to form the desired bend. The bent terminal end segments can eliminate any requirement to use offset traces or pads 230, 240 and each primary side 210A, 210B can be the mirror image of the other.

Figure 14A:
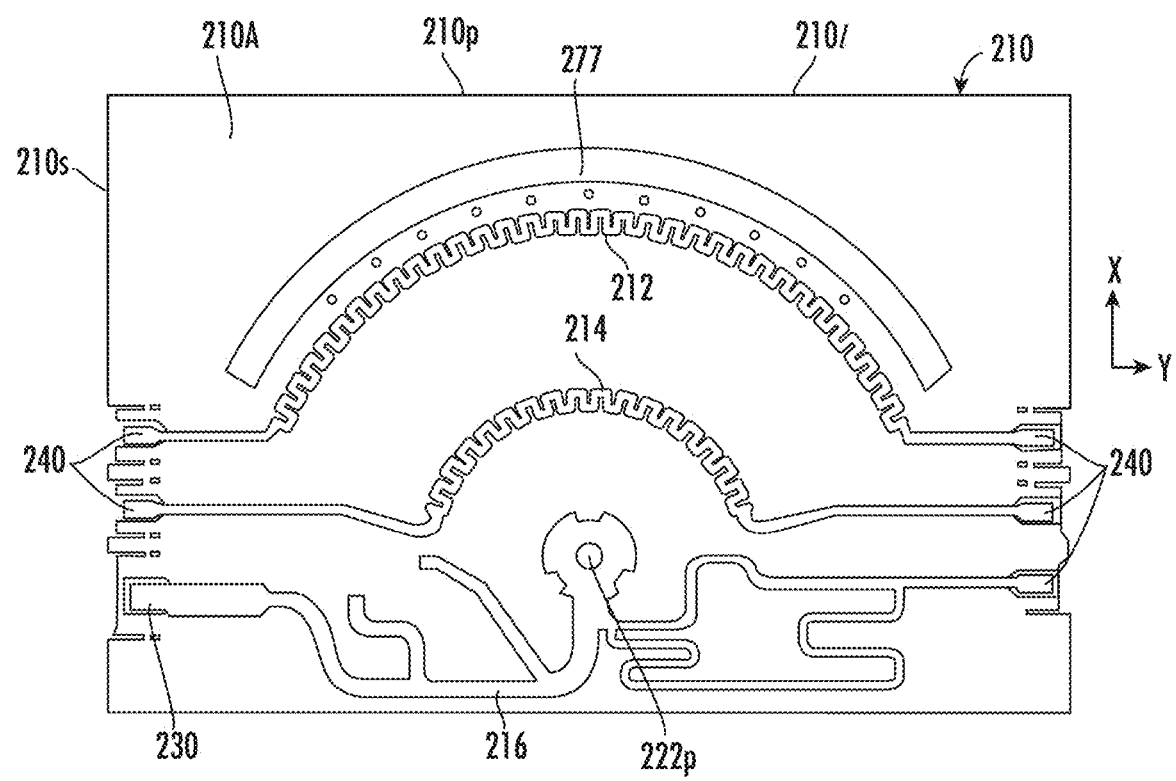
FIG. 14A is a top view of a first primary side of an example PCB for a phase shifter according to embodiments of the present invention.
Figure 14B:
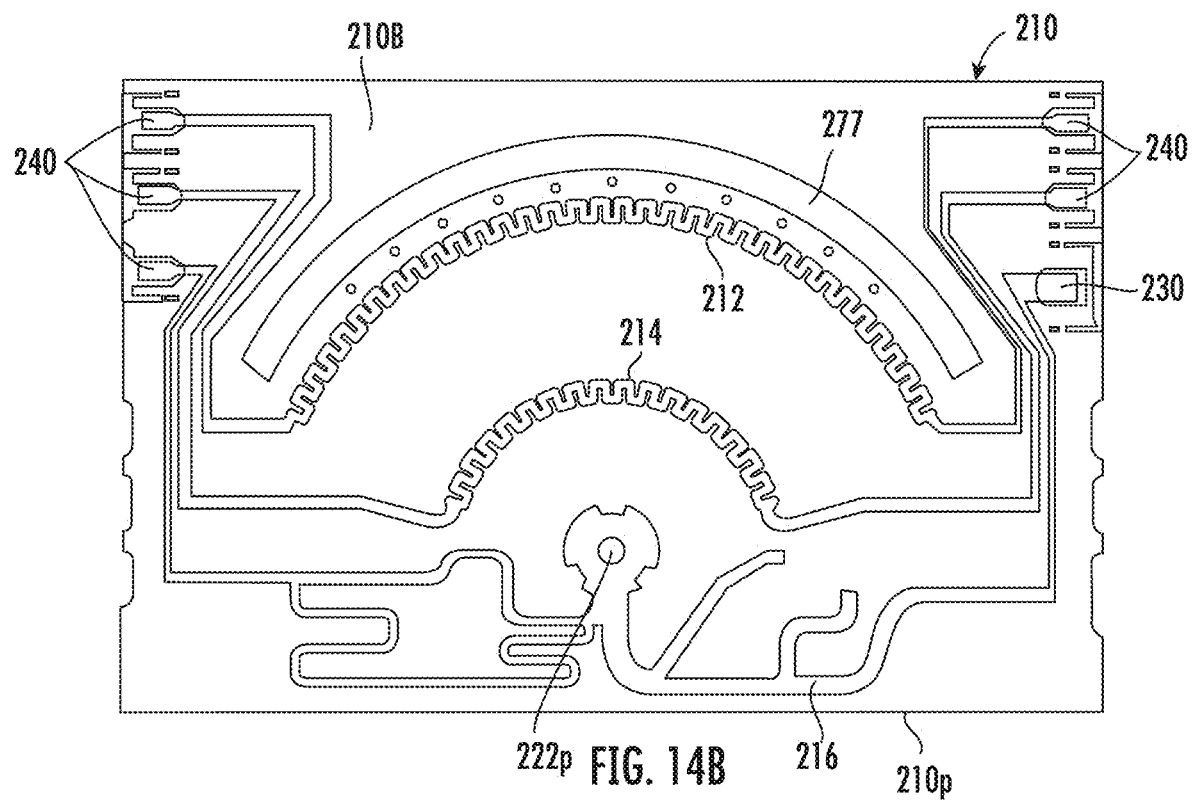
FIG. 14B is a bottom view of a second primary side of the example PCB shown in FIG. 14A.

FIGS. 14A and 14B illustrate that the main PCB 210 can have a perimeter 210p that is configured to provide offset pad traces. The main PCB 210 can have an arcuate slot 277 that allows the wiper 220 to rotate relative to the pivot joint 222p. The pads 230, 240 on the first primary side 210A can reside on one side of the slot 277 (shown as above the slot) and the pads 230, 240 on the other primary side 210B can reside offset from those on the first primary side, shown on an opposing side of the slot 277 (shown as below the slot). The main PCB 210 can have a perimeter 210p that is rectangular with a pair of long sides 210l and a pair of shorter sides 210s. The longer sides 210l can be in the Y dimension. The slot 277 can reside adjacent the arcuate segment of the first transmission line 212, closer to an outer edge of the perimeter of the main PCB 210 than the first transmission line 212. The pads 230, 240 can reside on outer edge portions of the short sides 210s. This configuration can extend the traces of the pads 230, 240 past the wiper 220.

Figure 15A:
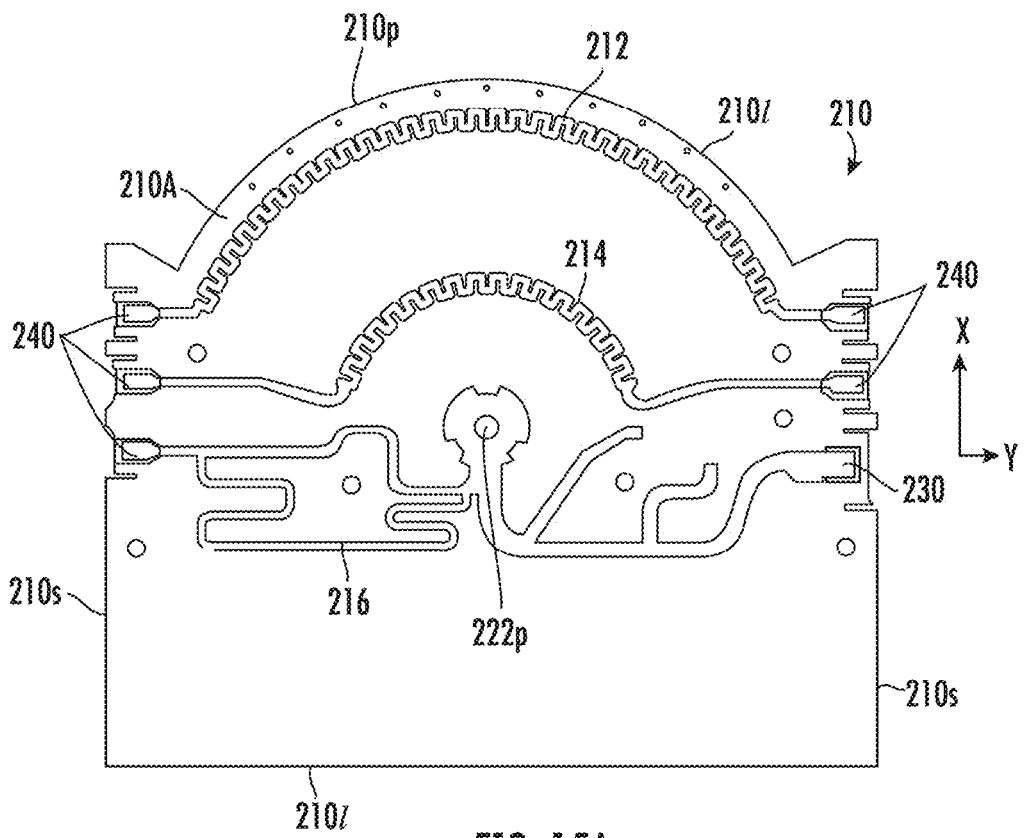
FIG. 15A is a top view of a first primary side of another example PCB for a phase shifter according to embodiments of the present invention.
Figure 15B:
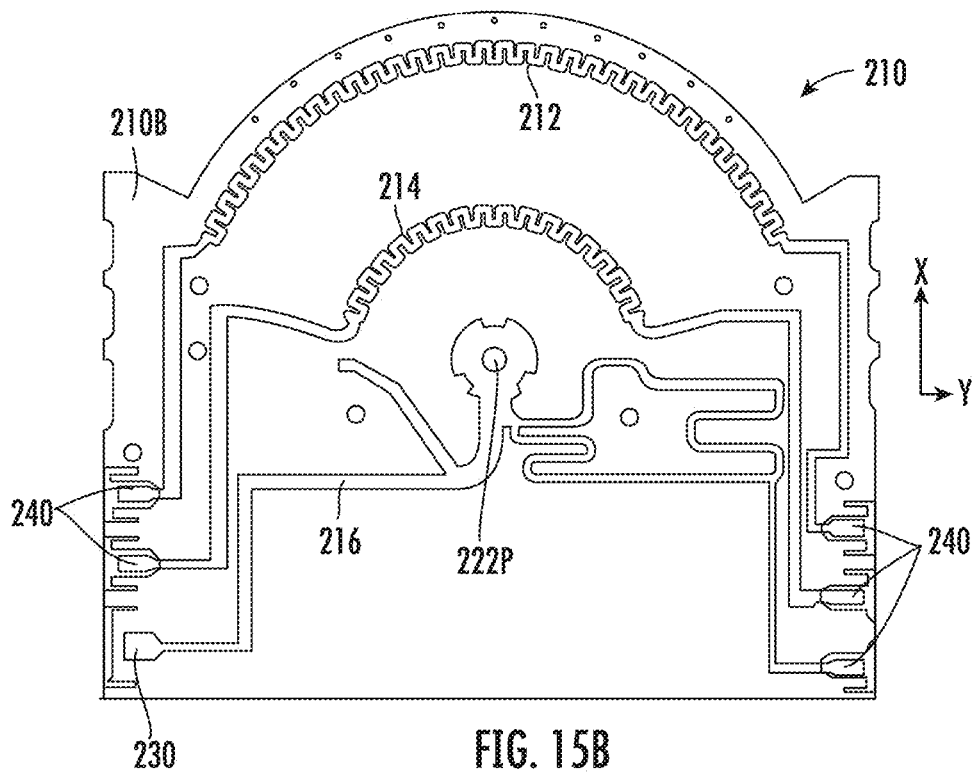
FIG. 15B is a bottom view of the second primary side of the example PCB shown in FIG. 15A.

FIGS. 15A and 15B illustrate another embodiment of the main PCB 210 that can provide offset pads 230, 240 and corresponding connection traces on each primary side 210A, 210B thereof. The primary transmission lines 212, 214 can have the same position and configuration on each primary side 210A, 210B of the main PCB 210. The perimeter 210p of the main PCB 210 can have a pair of long sides 210l and a pair of shorter sides 210s. One of the longer sides 210l can be arcuate. The arcuate segment of the first transmission line 212 can reside adjacent the arcuate (long) side of the main PCB 210. On one primary side of the main PCB 210, shown as the first primary side 210A, the terminal pads 230, 240 can reside closer to the arcuate side of the perimeter 210p of the main PCB 210 than the terminal pads 230, 240 on the opposing primary side, shown as the second primary side 210B. The terminal pads 230, 240 on the second primary side 210B can reside further away from the pivot point 222p than the pads 230, 240 on the first primary side 210A. The main PCB 210 can have a perimeter 210p with an increased length in the X direction relative to other shapes and to place the pivot 222p closer to a medial location of the main PCB 210, in the X and Y directions, relative to the main PCB 210 shown in other figures herein.

Figure 16A:
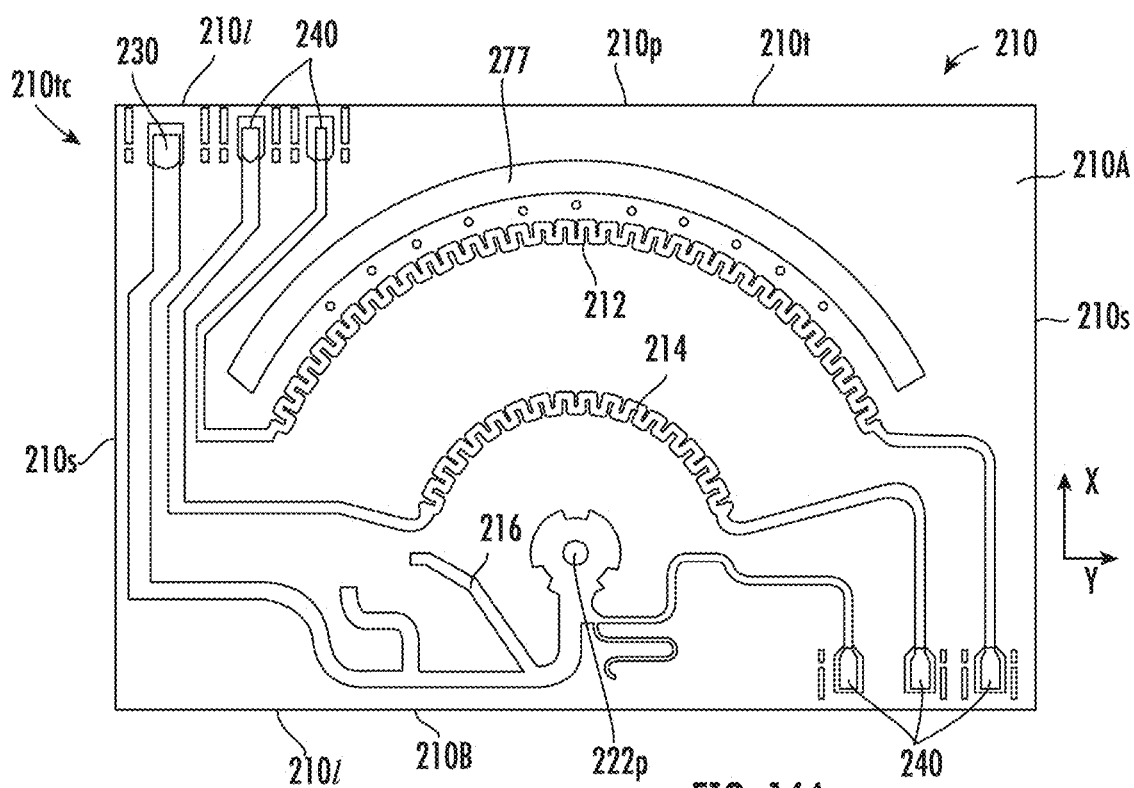
FIG. 16A is a top view of a first primary side of yet another example PCB for a phase shifter according to embodiments of the present invention.
Figure 16B:
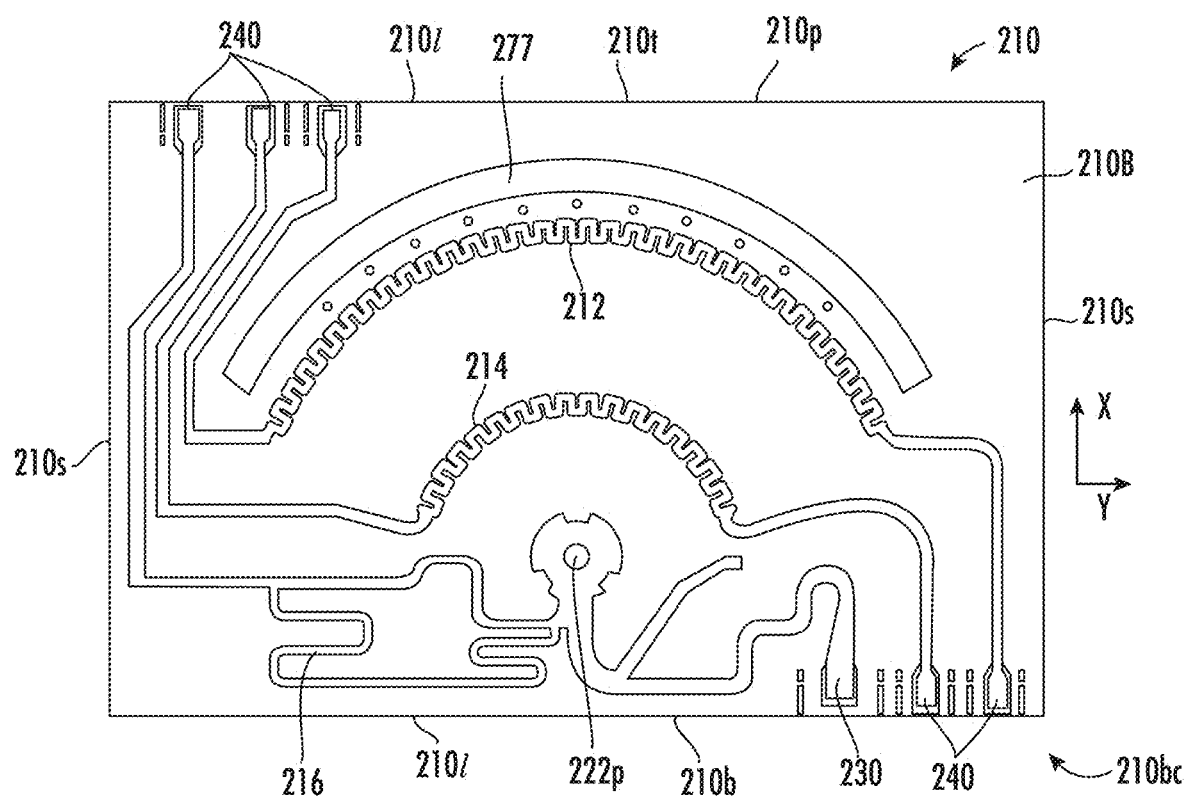
FIG. 16B is a bottom view of the second primary side of the example PCB shown in FIG. 16A.

FIGS. 16A and 16B illustrate another embodiment of the main PCB 210 that can provide input and/or output pads 230, 240 and corresponding connection traces on each primary side 210A, 210B. As shown, the main PCB 210 is configured with pads 230, 240 on the top and bottom rather than on the sides of the main PCB 210. The top and bottom can be long sides 210l of the main PCB 210. The main PCB 210 can include an arcuate slot 277 that is spaced apart but adjacent the top side 210t. The top 210t and the bottom 210b can have a straight linear shape. The first side 210A and the second side 210B can place a plurality of pads 230, 240 on the top 210t and a plurality of pads 240 on the bottom 210b. The pads on the top 210t can reside above the slot 277. The pads 230, 240 on the bottom 210b can reside below the slot 277. The input pad 230 on the first side 210A can reside adjacent a top corner 210tc and the input pad on the second side 210B can reside adjacent a bottom corner 210bc. The input pad 230 on the first primary side 210A can be an outermost pad in the top corner 210tc. The input pad 230 on the bottom corner 210bc can be an innermost pad in the bottom corner. The pivot point 222p can reside closer to the bottom 210b than the top 210t. The slot 277 can allow the wiper 220 to rotate while held by a pin 222 (FIG. 3A) at the pivot point 222p.

Figure 17A:
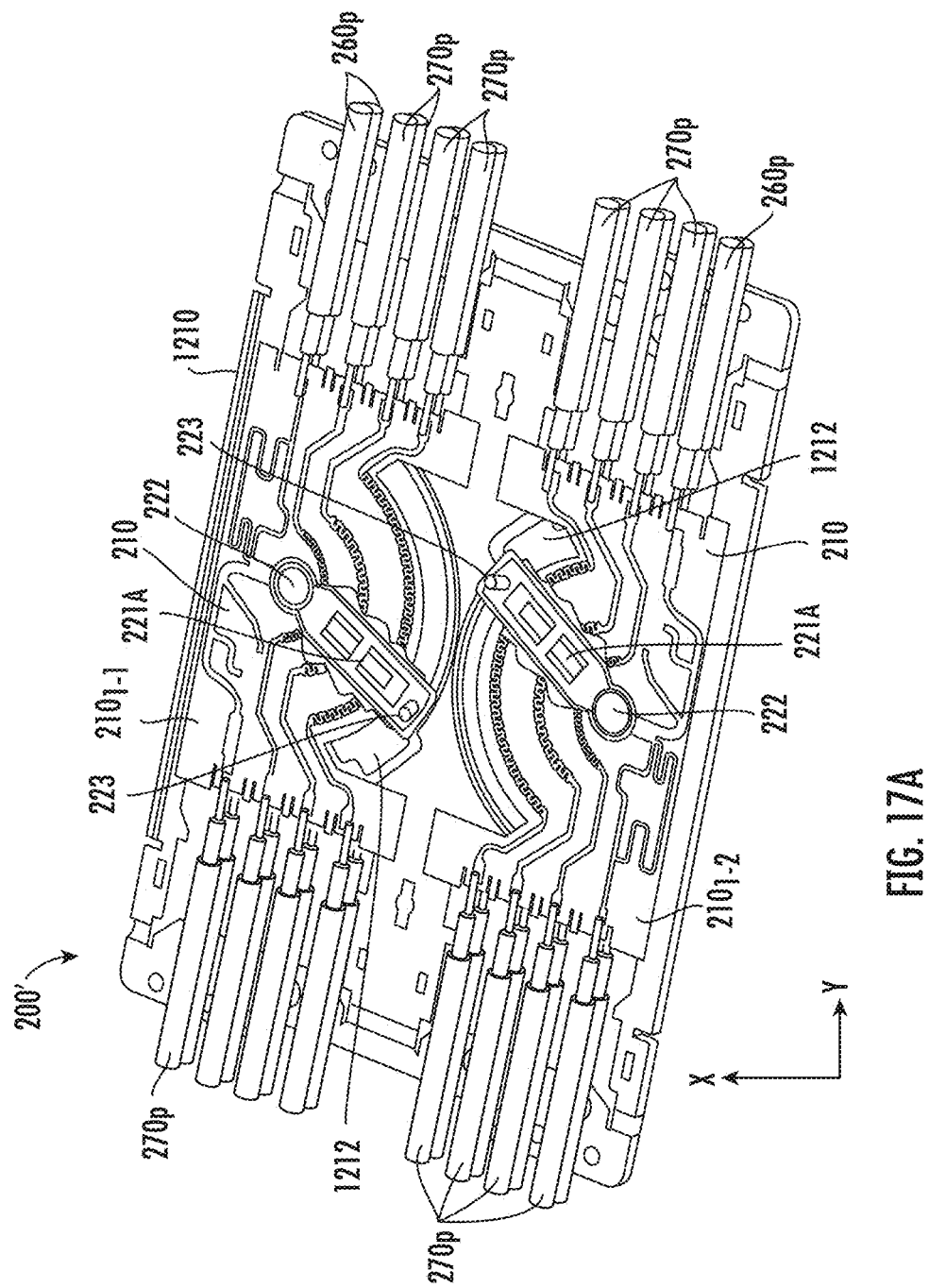
FIG. 17A is a top perspective view of a first primary side of another embodiment of a phase shifter assembly with phase shifters according to embodiments of the present invention.
Figure 17B:
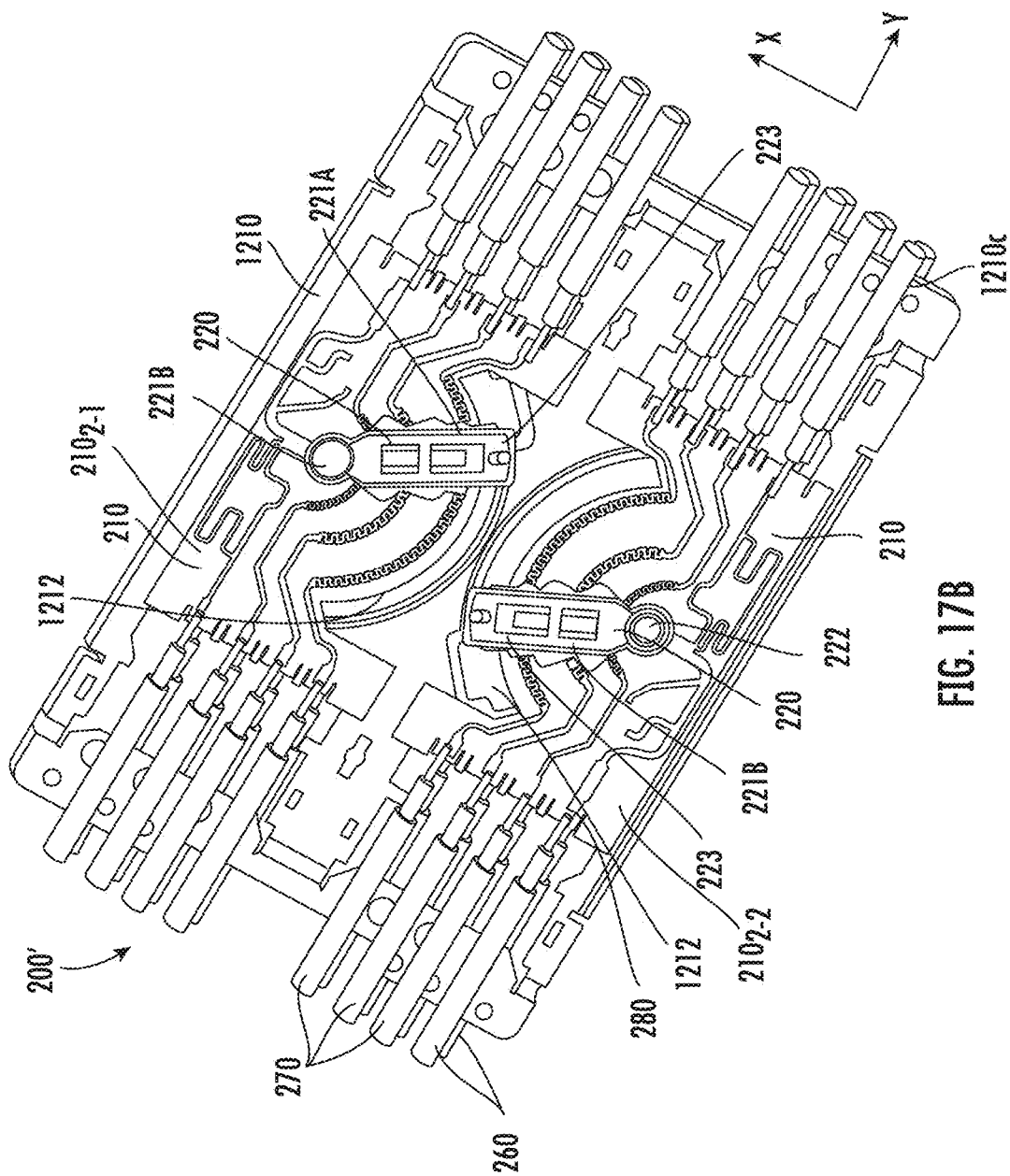
FIG. 17B is a bottom perspective view of a second primary side of the device shown in FIG. 17A.
Figure 17C:
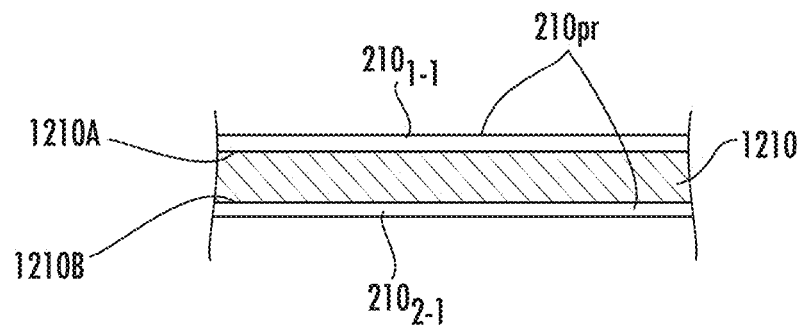
FIG. 17C is a schematic partial section view of the device shown in FIG. 17C.
Figure 17D:
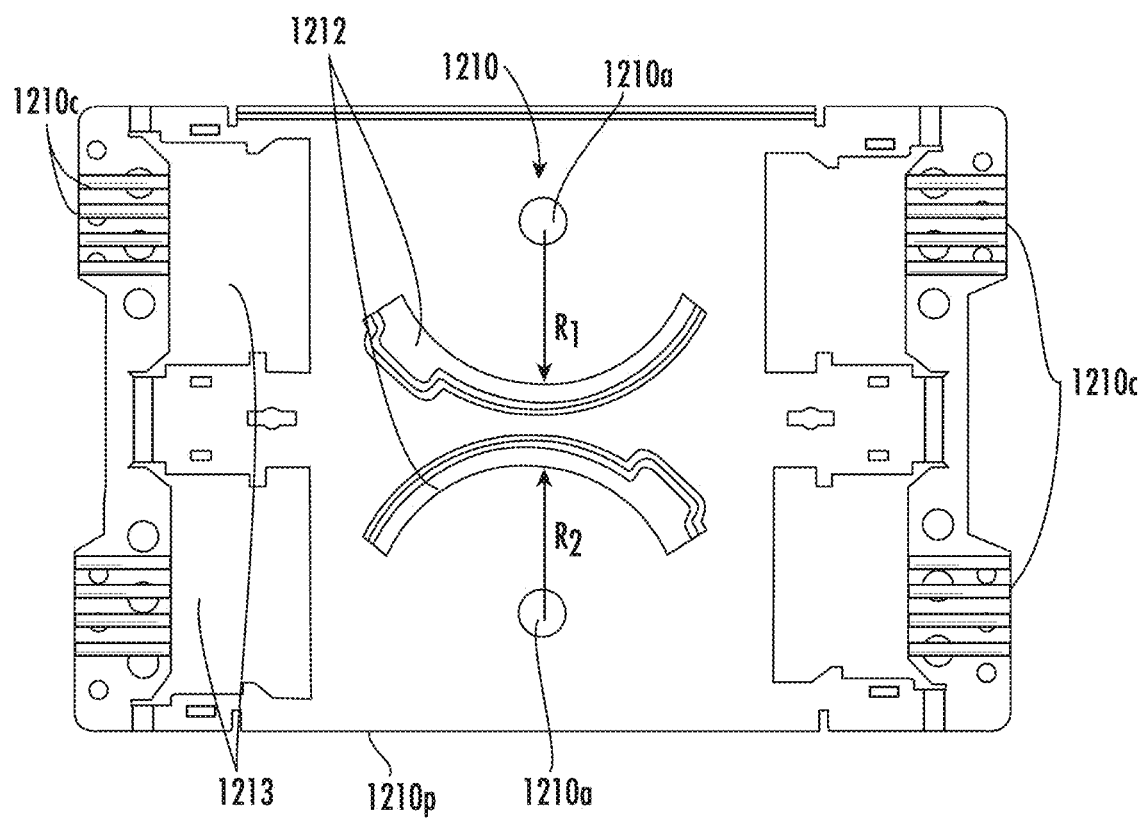
FIG. 17D is a schematic top view of an example metal panel of the device shown in FIG. 17A.
Figure 18A:
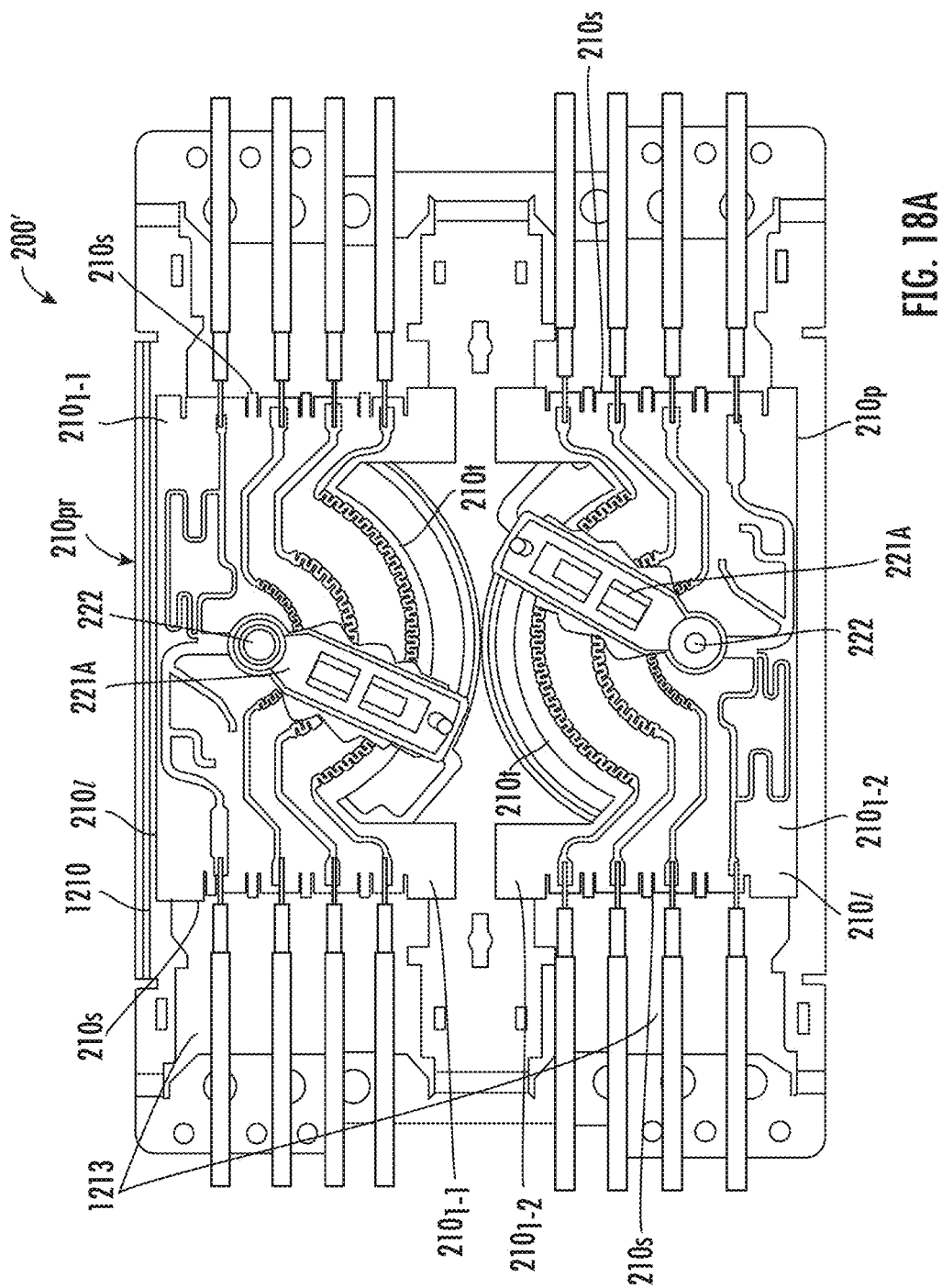
FIG. 18A is a top view of the first primary side of the device shown in FIG. 17A.
Figure 18B:
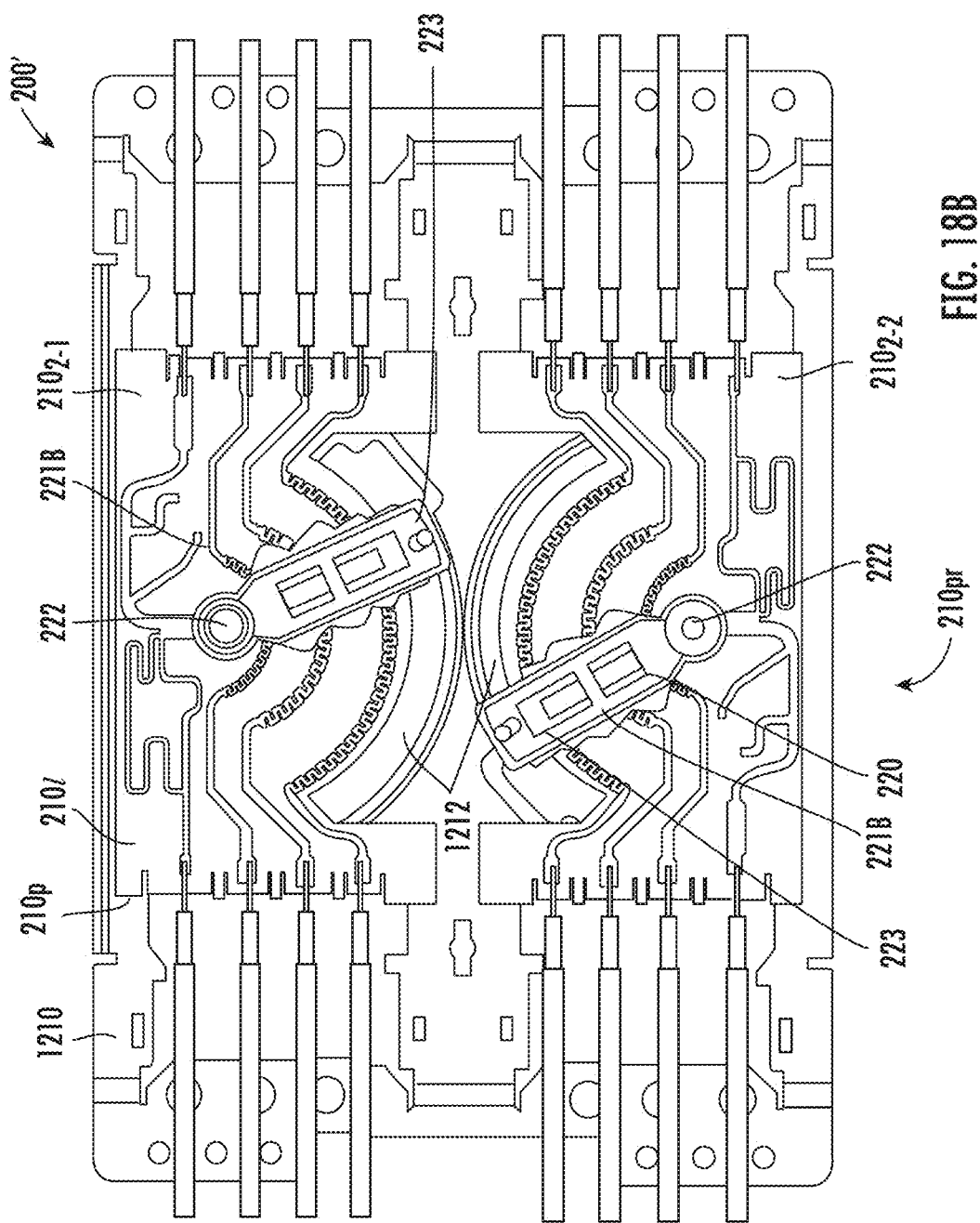
FIG. 18B is a bottom view of the second primary side of the device shown in FIG. 18A.

Turning now to FIGS. 17A-17C, 18A and 18B, yet another embodiment of a phase shifter assembly 200' is shown. In this embodiment, first and second $210_{1-1}$, $210_{1-2}$ co-planar laterally spaced apart and adjacent main PCBs 210 reside on one primary side 1210A of a plate (e.g., panel) 1210 (FIG. 17A, 18A) and first $210_{2-1}$ and second $210_{2-2}$ co-planar laterally spaced apart adjacent main PCBs 210 reside on an opposing primary side 1210B of the plate 1210 (FIGS. 17B, 18B). The main PCBs 210 can each abut the plate 1210. The main PCBs 210 can each be attached mechanically or adhesively to the plate 1210. A pivot pin 222 can extend through an aligned pair 210pr of first and second main PCBs $210_1$, $210_2$ and an aperture 1210a in the plate 1210 (FIG. 17D) to allow the pivot arms 221A, 221B to rotate about the pair of main PCBs 210.

The plate 1210 can be a metal plate. The plate. 1210 can comprise aluminum, stainless steel, other metals or metal alloys. The plate 1210 can comprise first and second slots 1212. The slots 1212 can be arcuate and reside adjacent each other along a medial portion of the plate 1210. The phase shifter assembly 200' can include a wiper 220 with pairs of the wiper arms 221A, 221B configured to rotate in concert about aligned and parallel pairs of the main PCBs $210_1$, $210_2$. As shown by FIG. 17C, aligned parallel pairs of the main PCBs $210_1$, $210_2$ can reside one on each primary side 1210A, 1210B of the plate 1210. The main PCBs $210_1$, $210_2$ can each be single sided with the conductive traces 212, 214, 216 and pads 230, 240 on only one primary side/surface 210A and oriented to face away from the plate 1210.

As shown in FIG. 17D, the first and second arcuate slots reside at a medial location of the plate 1210 and the first slot 1212 has a first radius of curvature R1 and the second slot has a second radius of curvature R2. R1 can be equal to R2 but oriented to provide opposing rather than concentric arc segments.

As shown in FIGS. 17A and 17B, the perimeter of the main PCB 210 can have an arcuate side that faces an arcuate side of the adjacent PCB 210. The pivot pins 222 can be aligned in the Y direction and spaced apart in the X direction. As shown in FIGS. 17A, 17B and 17D, pairs of the conductors 260p, 270p can be held in channels 1210c coupled to or formed by the plate 1210 to be able to support and/or route the cables 260, 270 to couple to respective pads 230, 240 of the aligned first and second (shown as upper and lower) PCBs $210_1$, $210_2$. The plate 1210 can have (four) spaced apart open spaces 1213 residing between an outer perimeter 1210p thereof and the slots 1212 as shown. The wiper arms 221A, 221B can include an open or closed end segment facing away from the pivot pin 222 and a protruding attachment link 223 that is orthogonal to the arms 221A, 221B.

Thus, referring to FIGS. 18A and 18B, the phase shifter assembly 200' can include four printed circuit boards 210 that can be identified as first $210_{1-1}$, second $210_{2-1}$, third $210_{1-2}$ and fourth $210_{2-1}$ main printed circuit boards 210, each having a perimeter 210p. The perimeter 210p can have a pair of long sides 210l and a pair of short sides 210s, with one long side defining a bottom 210b and one long side defining a top 210t. The tops 210t of the first $210_{1-1}$ and third $210_{1-2}$ printed circuit boards 210 can be arcuate and reside adjacent each other with the first and second slots 1212 therebetween. The tops 210t of the second $210_{2-1}$ and fourth $210_{2-2}$ printed circuit boards can be arcuate and reside adjacent each other with the first and second slots 1212 therebetween.

The plate 1210 can couple to the transition block connector 325 (FIGS. 7A and 7B) and/or the transition block connector 325 can be integrated with the plate 1210 as a unitary member. The transition block connector 325 can define at least part of the cable channels 1210c (FIG. 17D).

The plate 1210 can couple to the connector block assembly 330 (FIGS. 8A and 8B) or these components can be integrated to form a unitary member. The transition block connector 325 can define at least part of the cable channels 1210c (FIG. 17D).

The phase shifter assembly 200, 200' can be oriented in a base station antenna housing either vertically or horizontally.

Figure 19A:
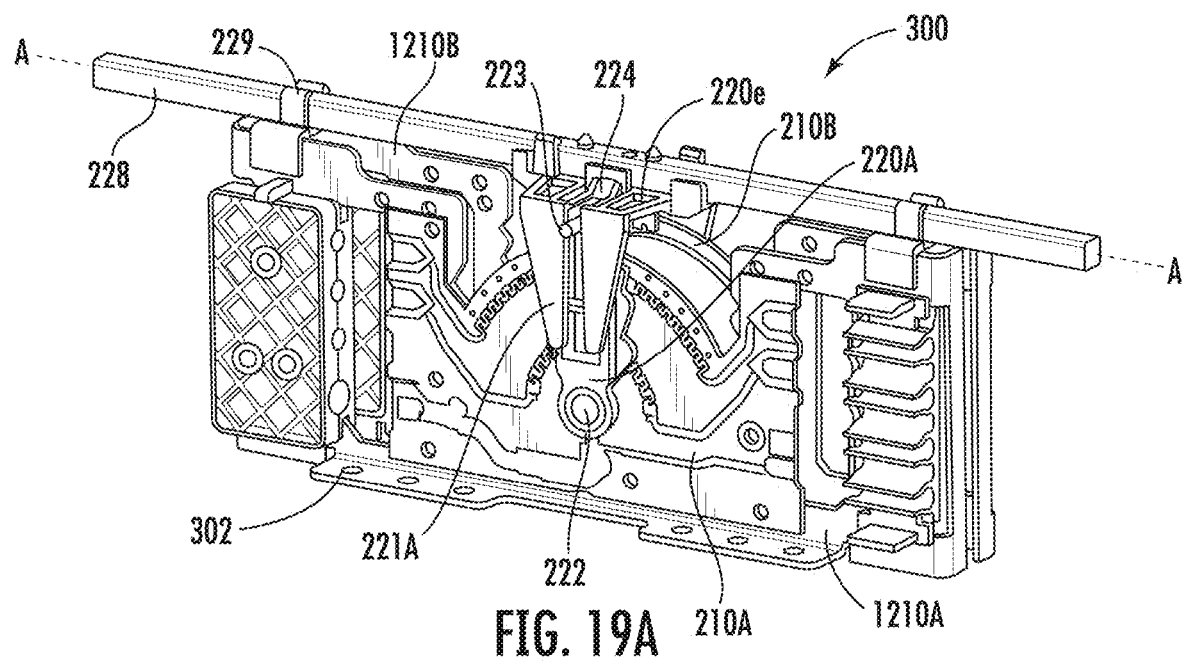
FIG. 19A is a side perspective view of a phase shifter assembly according to embodiments of the present invention.
Figure 19A:
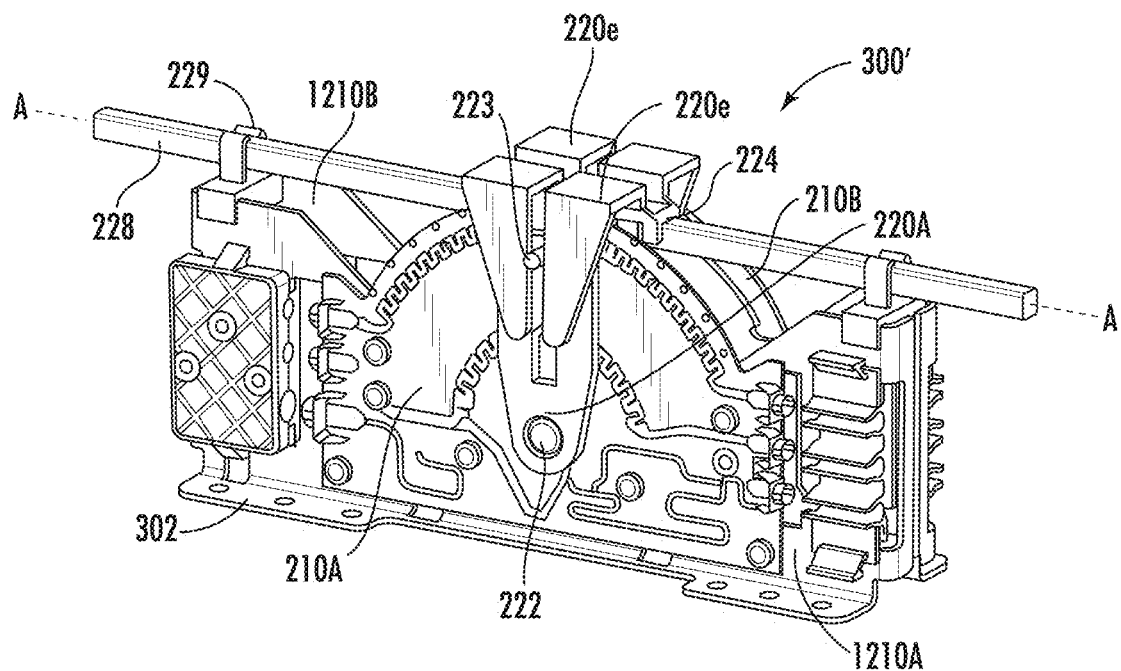

Referring now to FIGS. 19A-25, additional embodiments of the present invention are illustrated. FIG. 19A is a side perspective view of a phase shifter assembly 300 having a pair of phase shifters extending parallel to each other according to embodiments of the present invention. FIG. 19B is a side perspective view of another phase shifter assembly 300' according to embodiments of the present invention that has a similar construction to the phase shifter assembly 300 of FIG. 19A. The phase shifter assemblies 300, 300' may have many of the same or similar components as described above with respect to phase shifter assemblies 200, 200'.

As shown in FIGS. 19A-19B, the phase shifter assemblies 300, 300' have a pair of main PCBs 210A, 210B. Each main PCB 210A, 210B resides on a respective plate (e.g., panel) 1210A, 1210B. The plates 1210A, 1210B are arranged back-to-back and extend parallel to each other. The main PCBs 210A, 210B can each be attached mechanically or adhesively to their respective plates 1210A, 1210B. Similar to embodiments discussed above, a pivot pin 222 (or a pair of pivot pins 222) allows wiper arms 221A, 221B to rotate about the pair of main PCBs 210A, 210B.

The wipers 220A, 220B can have a body with a closed outer end 220e. The ends 220e of the wipers 220A, 220B can have an attachment link 223 that can be coupled to a bracket 224 that connects both wipers 220A, 220B to a drive shaft 228 of a mechanical linkage. The parallel wipers 220A, 220B may be joined together at their outer or distal ends 220e via the bracket 224. As shown in FIGS. 19A-19B, the plates 1210A, 1210B (and main PCBs 210A, 210B) extend parallel to each other.

As discussed above, the radiating elements 122, 132 of the base station antenna 100 extend forwardly from a backplane 112 (see, e.g., FIG. 1B). In some embodiments, as will be discussed in further detail below, the phase shifter assemblies 300, 300' may be oriented in the base station antenna 100 such that the phase shifter assemblies 300, 300' extend rearwardly from the backplane 112 (e.g., a reflector 305 of the antenna 100). The reflector 305 defines a plane that is oriented typically parallel with the front, of the antenna 100 (the side of the antenna that is opposite the mounting bracket 104 as shown in FIG. 1A). Thus, the phase shifter assemblies 300, 300' (i.e., the plates 1210A, 1210B and main PCBs 210A, 210B) may be aligned substantially perpendicular to the plane defined by the reflector 305 of the antenna 100. Herein, a phase shifter assembly is considered to be oriented perpendicular to the plane defined by the reflector, if the main surfaces of the one or more main PCBs included in the phase shifter assembly extend perpendicular to the plane defined by the reflector. As used herein, "substantially perpendicular" means at an angle of 90 degrees to a given line, plane, or surface (+10 degrees).

Still referring to FIGS. 19A-19B, in some embodiments, the phase shifter assemblies 300, 300' may include one or more mounting flanges 302. The mounting flanges 302 may be coupled to or integral with the plates 1210A, 1210B of the phase shifter assemblies 300, 300'. In some embodiments, the mounting flanges 302 may be configured to mount a respective phase shifter assembly 300, 300' (i.e., the plates 1210A, 1210B) to the reflector 305 of the antenna 100. In some embodiments, the mounting flanges 302 may be configured to mount the phase shifter assembly 300, 300' to a support member 304 (e.g., a tray) (see, e.g., FIG. 21B). The mounting flanges 302 are configured such that, when the phase shifter assemblies 300, 300' are mounted to the reflector 305 or support member 304, each phase shifter assembly 300, 300' extends rearwardly from the reflector 305 or support member 304. In other words, the mounting flanges 302 are configured such that the rearwardly extending phase shifter assemblies 300, 300' (i.e., the plates 1210A, 1210B) are oriented substantially perpendicular to the plane defined by the reflector 305 or support member 304 when mounted thereon.

According to some embodiments of the present invention, the rearwardly extending phase shifter assemblies 300, 300' may provide for reduced manufacturing costs and/or improved performance, for example, when compared to assemblies that are aligned parallel to the reflector 305 of the antenna 100. For example, in some embodiments, the rearwardly extending phase shifter assemblies 300, 300' of the present invention may use a single bracket 224 to couple both wipers 220A, 220B of the phase shifter assembly 300, 300' to the drive shaft 228 rather than using two separate pins for each wiper 220A, 220B which are typically used for phase shifter assemblies that are aligned in parallel with the reflector 305. This reduction in the number of parts may provide for a reduction in manufacturing costs for base station antennas 100 having the rearwardly extending phase shifter assemblies 300, 300' of the present invention. In addition, the use of a single bracket 224 for the phase shifter assemblies 300, 300' of the present invention allows for the wipers 220A, 220B to rotate in concert which may provide for better accuracy in phase adjustments of the base station antenna 100.

In some embodiments, each phase shifter assembly 300, 300' may further comprise rod supports 229. The rod supports 229 may be configured to couple the plates 1210A, 1210B together. The rod supports 229 may also provide additional support to the drive shaft 228 and help maintain the drive shaft 228 aligned within the ends 220e of the wipers 220A, 220B.

Referring now to FIGS. 20A-20B and 21A-21B, according to some embodiments of the present invention, when the phase shifter assemblies 300, 300' of the present invention are oriented substantially perpendicular to the plane defined by the reflector 305, this orientation may allow for more phase shifter assemblies 300, 300' to fit within the base station antenna 100 without having to increase the size of the antenna 100.

Figure 20B:
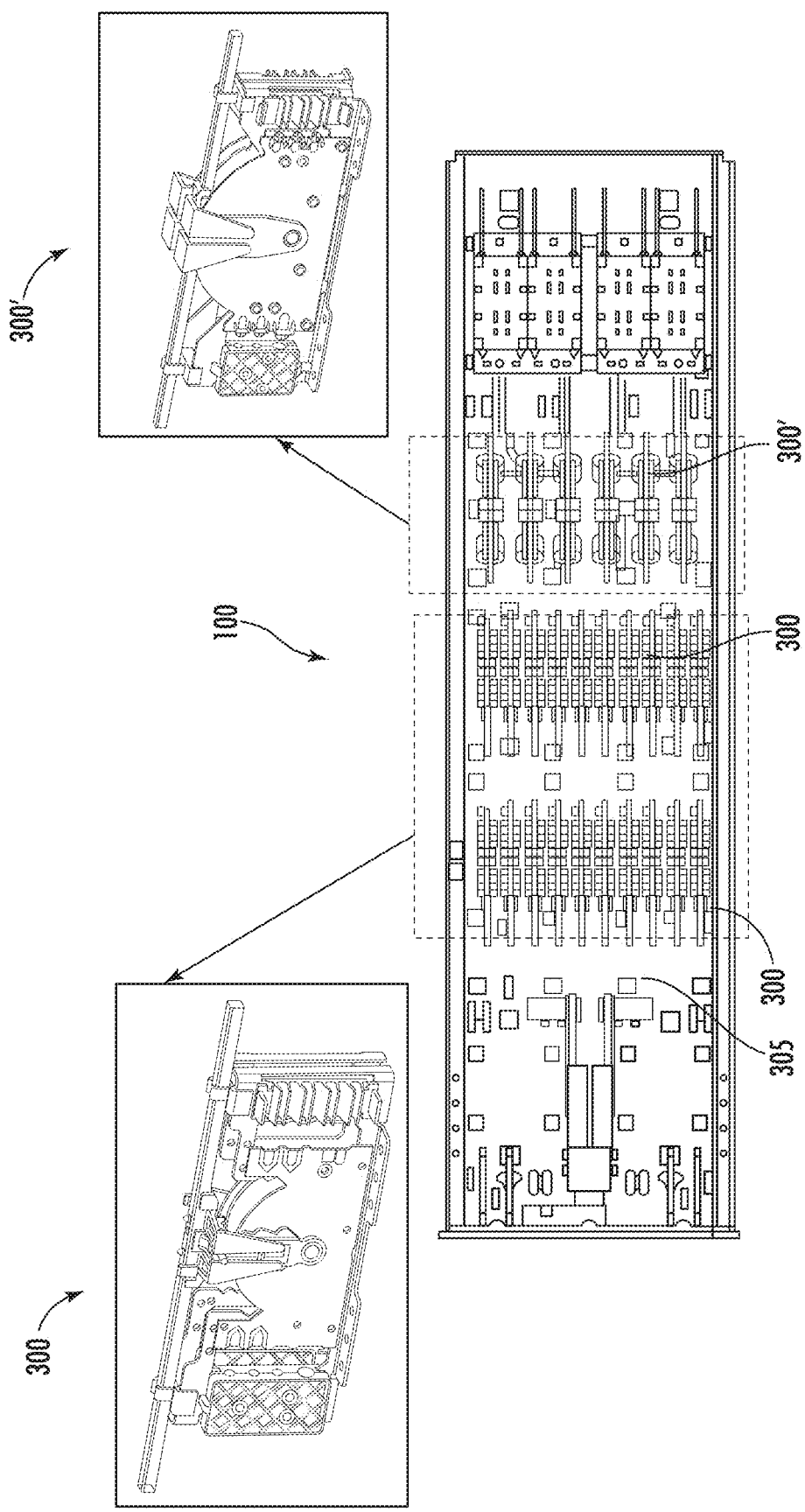
FIG. 20B is a rear view of a base station antenna with the radome thereof removed showing a plurality of phase shifter assemblies aligned perpendicular to the reflector of the antenna according to embodiments of the present invention.
Figure 21A:
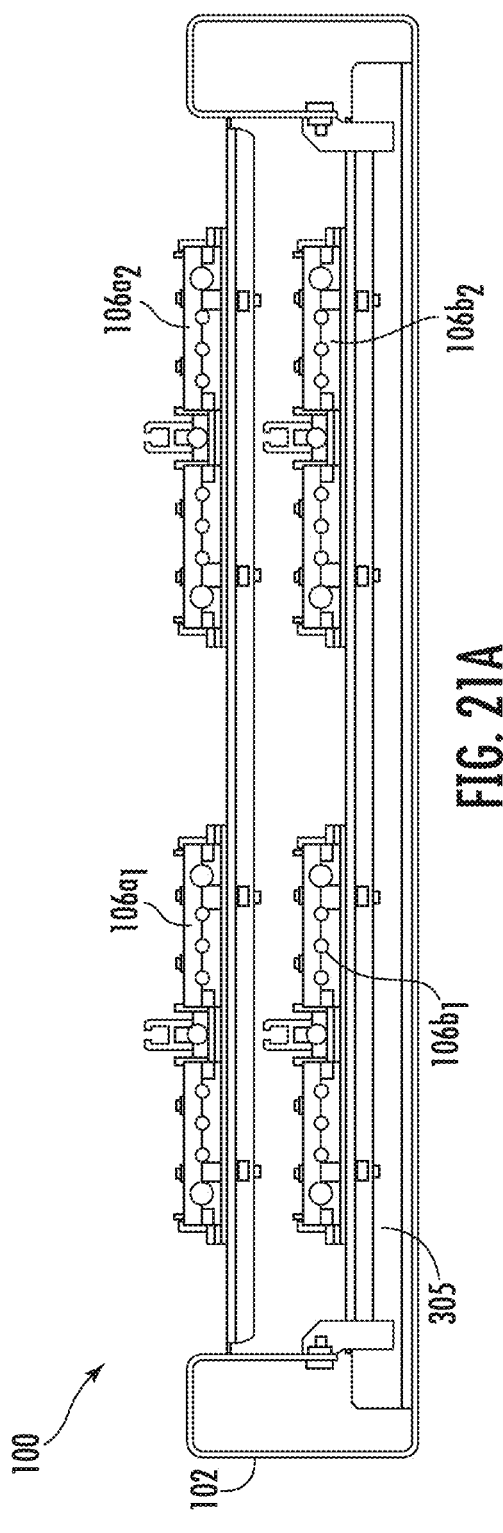
FIG. 21A is a schematic cross-sectional view of the base station antenna of FIG. 20A.
Figure 21B:
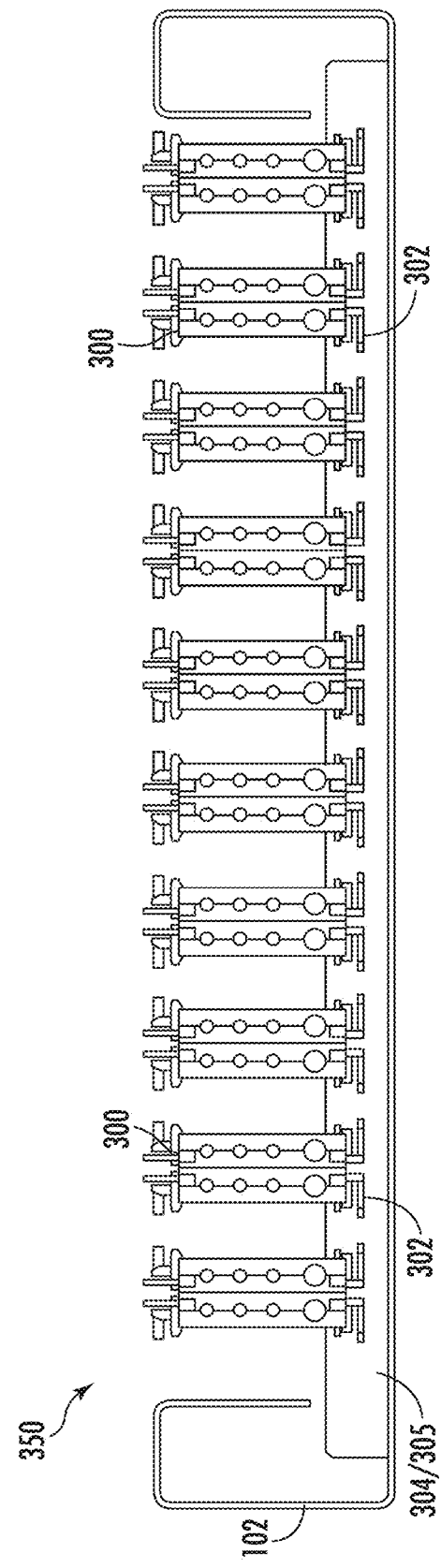
FIG. 21B is a schematic cross-sectional view of the base station antenna of FIG. 20B.

FIG. 20A is a rear view of a base station antenna 100 with the radome 102 thereof removed showing a plurality of phase shifter assemblies 160a, 160b in pairs and oriented parallel to the plane defined by the reflector 305 of the antenna 100. FIG. 20B is a rear view of a base station antenna 100 with the radome 102 thereof removed showing a plurality of phase shifter assemblies 300, 300' oriented substantially perpendicular to the plane defined by the reflector 305 of the antenna 100 according to embodiments of the present invention. FIG. 21A is a schematic cross-sectional view of a base station antenna 100 showing the phase shifter assemblies 160a, 160b aligned parallel to the reflector 305 and stacked on top of each other (i.e., extending rearwardly from the reflector 305). FIG. 21B is a schematic cross-sectional view of a base station antenna 100 showing an array of rearwardly extending phase shifter assemblies 300, 300' (i.e., oriented substantially perpendicular to the reflector 305) according to embodiments of the present invention.

Referring to FIGS. 20A-20B, FIG. 20A shows the interior of a base station antenna 100 having four high band phase shifter assemblies $160a_1$, $160a_2$, $160a_3$, $160a_4$ and two low band phase shifter assemblies $160b_1$, $160b_2$. The phase shifter assemblies $160a_1$, $160a_2$, $160a_3$, $160a_4$, $160b_1$, $160b_2$ are arranged in pairs and oriented parallel with the reflector 305. As shown in FIG. 20B, in some embodiments, a base station antenna 100 may have two, three, four times, or more rearwardly extending phase shifter assemblies 300, 300' within a similarly sized antenna 100 when the phase shifter assemblies 300, 300' are mounted perpendicular to the plane defined by the reflector 305. For example, in some embodiments, the base station antenna 100 may have 2, 4, 6, 8, 10, 12, 14, 16, 18, 20, 22, 24, 26, 28, 30 or more phase shifter assemblies 300, 300' mounted perpendicularly to the reflector 305. The orientation of the assemblies 300, 300' of the present invention allows for a more efficient arrangement of mechanical linkages within the antenna 100. Thus, more phase shifter assemblies 300, 300' may fit in the additional space within an antenna 100 that is no longer being occupied by the mechanical linkages. As shown in FIG. 20B, in some embodiments, the base station antenna 100 may have twenty-six phase shifter assemblies 300, 300' (e.g., twenty high band assemblies 300 and six low band phase shifter assemblies 300').

As shown in FIGS. 21A-21B, the phase shifter assemblies 300, 300' of the present invention may eliminate the need to stack phase shifter assemblies 160a, 160b within a base station antenna 100 in planes parallel to the reflector 305. The rearwardly extending phase shifter assemblies 300, 300' of the present invention may allow for a more efficient arrangement and organization (e.g., mechanical linkages) within the base station antenna 100, thereby creating more space within the antenna 100. As compared to traditional stacking of phase shifter assemblies 160a, 160b within a base station antenna 100, which may lead to design issues, such as, for example, spacing issues within the base station antenna 100 and/or complex mechanical linkage designs, which can lead to more parts and/or higher manufacturing costs.

The phase shifter assemblies 300, 300' of the present invention may help to alleviate these issues. For example, FIG. 21A shows phase shifter assemblies 160a, 160b aligned parallel with the reflector 305 and stacked on top of each other (rearwardly extending from the reflector 305) within a base station antenna 100. The base station antenna 100 shown in FIG. 21B, according to some embodiments, illustrates rearwardly extending phase shifter assemblies 300, 300' oriented such that the assemblies 300, 300' are perpendicular to the reflector 305 which may fit more phase shifter assemblies 300, 300' within the same space as the stacked phase shifter assemblies 160a, 160b that are oriented parallel to the reflector 305 (FIG. 21A). Thus, as shown in FIG. 21B, the phase shifter assemblies 300, 300' of the present invention may help to eliminate the need to stack phase shifter assemblies 160a, 160b within the base station antenna 100 in planes parallel to the reflector 305, thereby reducing spacing issues and allowing for less complex mechanical linkage designs.

Figure 22:
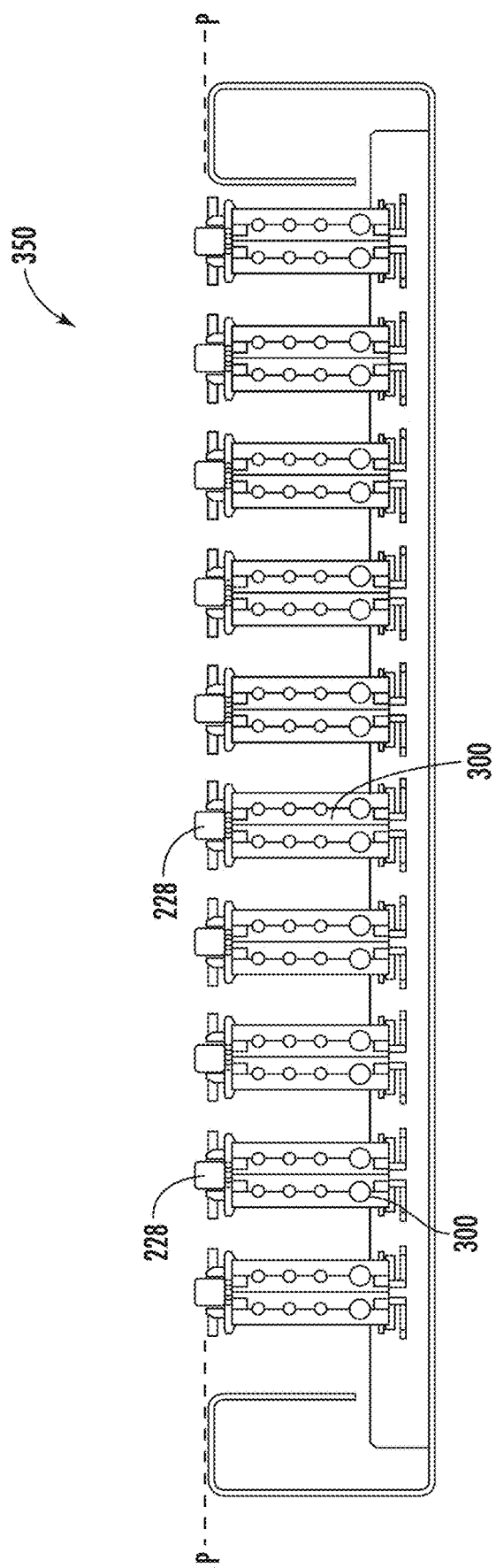
FIG. 22 is a schematic cross-sectional view of the base station antenna of FIG. 20B showing the mechanical linkages for each phase shifter assembly aligned in the same transverse plane according to embodiments of the present invention.

As shown in FIG. 22, in some embodiments, the rearwardly extending phase shifter assemblies 300, 300' of the present invention may have all of the mechanical linkages (e.g., attached to drive shafts 228) aligned along the same transverse plane (P). Having all the mechanical linkages aligned along the same plane (P) will allow for simple straight linkages to be utilized within the base station antenna 100, which will help to simplify mechanical linkage designs within the antenna 100.

In some embodiments, the rearwardly extending phase shifter assemblies 300, 300' of the present invention may be formed into a modular design. For example, the phase shifter assemblies 300, 300' may be subdivided into smaller arrays of phase shifter assemblies 350, i.e., "modules." In some embodiments, an array of phase shifters assemblies 350 may be built/assembled separately from the base station antenna 100 as a module (e.g., on a support member 304) and then added to the base station antenna 100 later in the assembly process. According to some embodiments, the modular design of the present invention may allow for the phase shifter assemblies 300, 300' to be built and tested prior to being integrated into the base station antenna 100. For example, in some embodiments, the each phase shifter assembly 300, 300' may be mounted on a support member via the mounting flanges 302 such that the phase shifter assemblies 300, 300' are oriented substantially perpendicularly to a plane defined by the support member 304. The support member 304 with the array of phase shifter assemblies 300, 300' mounted thereon may then be mounted within the base station antenna 100. This modular design may allow for multiple phase shifter assemblies 300, 300' of the present invention to be integrated into a base station antenna 100 as one unit, which may provide for a more efficient and cost effective way to assemble a base station antenna 100.

Figure 23:
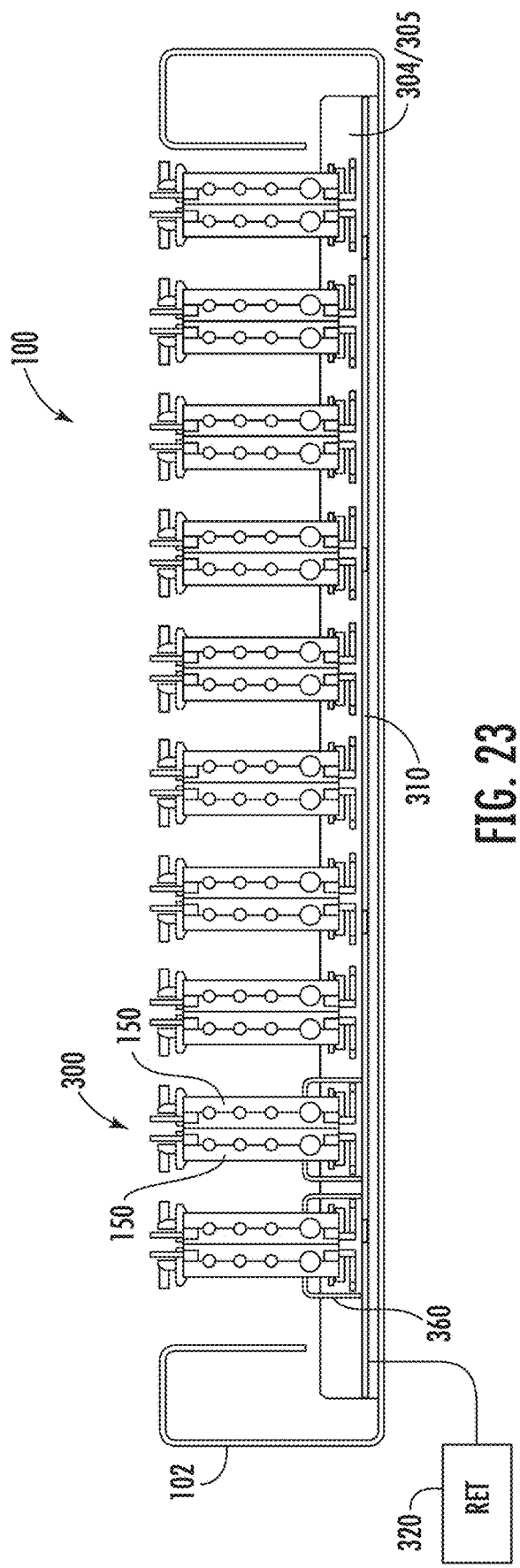
FIG. 23 is a schematic cross-sectional view of the base station antenna of FIG. 20B including a PING printed circuit board extending perpendicular to the phase shifter assemblies according to embodiments of the present invention.

Referring now to FIG. 23, according to some embodiments of the present invention, a base station antenna 100 may have a PING printed circuit board (PCB) 310 that extends perpendicular to the phase shifter assemblies 300, 300'.

As the number of RF ports at the bottom of an antenna continue to increase, it is becoming harder and harder for technicians to install base station antennas. The increased numbers of RF ports are leading to technicians more frequently crisscrossing cables between antennas and radio. Currently, most antennas typically include color coding located near the RF ports to help guide technicians (with visual inspection) make the correct cable connections.

To further reduce the frequency of crisscrossed cable connections, the Antenna Interface Standards Group ("AISG") recently released a new standard that would require every RF port of a new base station antenna 100 have the ability to receive a PING signal ("AISG PING signal"). See, e.g., AISG Standard v3.0 (Nov. 5, 2018). Incorporating a PING printed circuit board 310 within the base station antenna 100 will allow an operator to send an AISG PING signal from a radio into the antenna 100 for a specific RF port (see, e.g., FIG. 24). In response to the AISG PING signal, identifying information about the specific RF port will be returned, e.g., information that the RF port is a low band port with a −45 degree polarization. An installer will be able to use this identifying information to confirm the correct cable connections are being made.

Grouping an array of phase shifters 150 in a single location according to embodiments of the present invention, e.g., using the modular design of the phase shifter assemblies 300, 300' discussed above, will allow for the implementation of a PING feature into a base station antenna 100 in a cost effective matter. As shown in FIG. 23, a plurality of phase shifter assemblies 300, 300' may be serially connected to a PING printed circuit board (PCB) 310. The PING PCB 310 may be mounted on the reflector 305 or support member 304 with the rearwardly extending phase shifter assemblies 300, 300'. In some embodiments, each phase shifter 150 may be coupled to the PING PCB 310 through a respective blind mated or cabled connection 360. In a cabled connection 360, having the PING PCB 310 extending perpendicularly to the rearwardly extending phase shifter assemblies 300, 300' will allow for shorter cables to be used. In operation, the PING PCB 310 selectively-distributes an AISG PING signal from a RET controller 320 to each phase shifter 150 as desired to implement the AISG PING feature.

Figure 24:
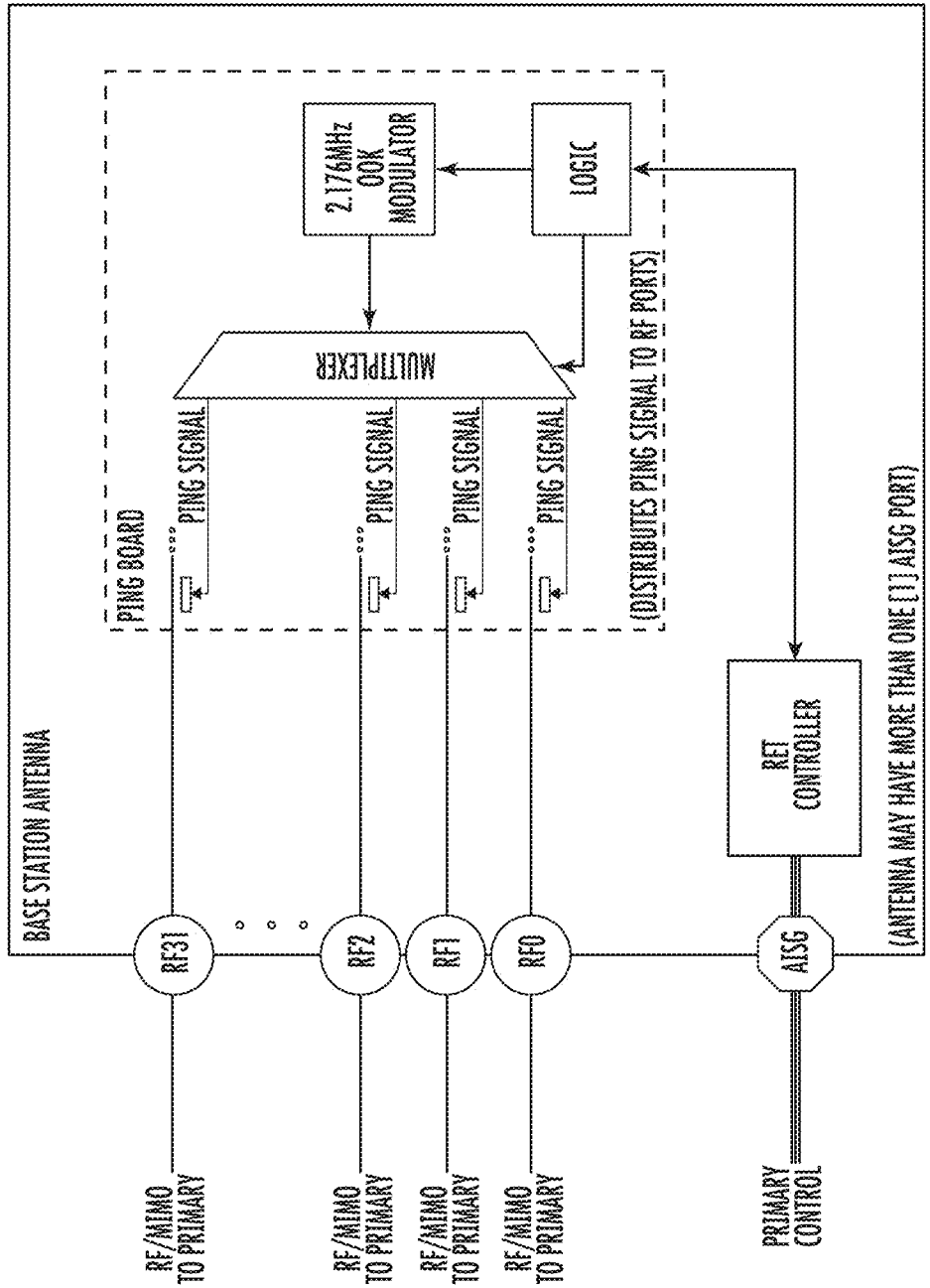
FIG. 24 is a schematic block diagram illustrating the electrical connections for the PING printed circuit board of FIG. 23 according to embodiments of the present invention.

FIG. 24 is a schematic block diagram illustrating an exemplary electrical connection for the PING PCB 310 according to embodiments of the present invention. As shown in FIG. 24, the PING PCB 310 includes a multiplexer. In a typical base station antenna 100, e.g., where the phase shifter assemblies 160a, 160b are oriented parallel to the reflector 305, the PING PCB 310 is most likely located at an end of the antenna 100. This layout within an antenna 100 requires long cables to connect the phase shifter assemblies 160a, 160b to the multiplexer of the PING PCB 310. In some embodiments of the present invention, extending the PING PCB 310 perpendicularly to the rearwardly extending phase shifter assemblies 300, 300' allows for shorter cables to be used (e.g., with a cabled connection 360), which may help to enhance performance, such as, for example, mitigating signal loss, as well as, reducing the cost and weight of the antenna 100.

Figure 25:
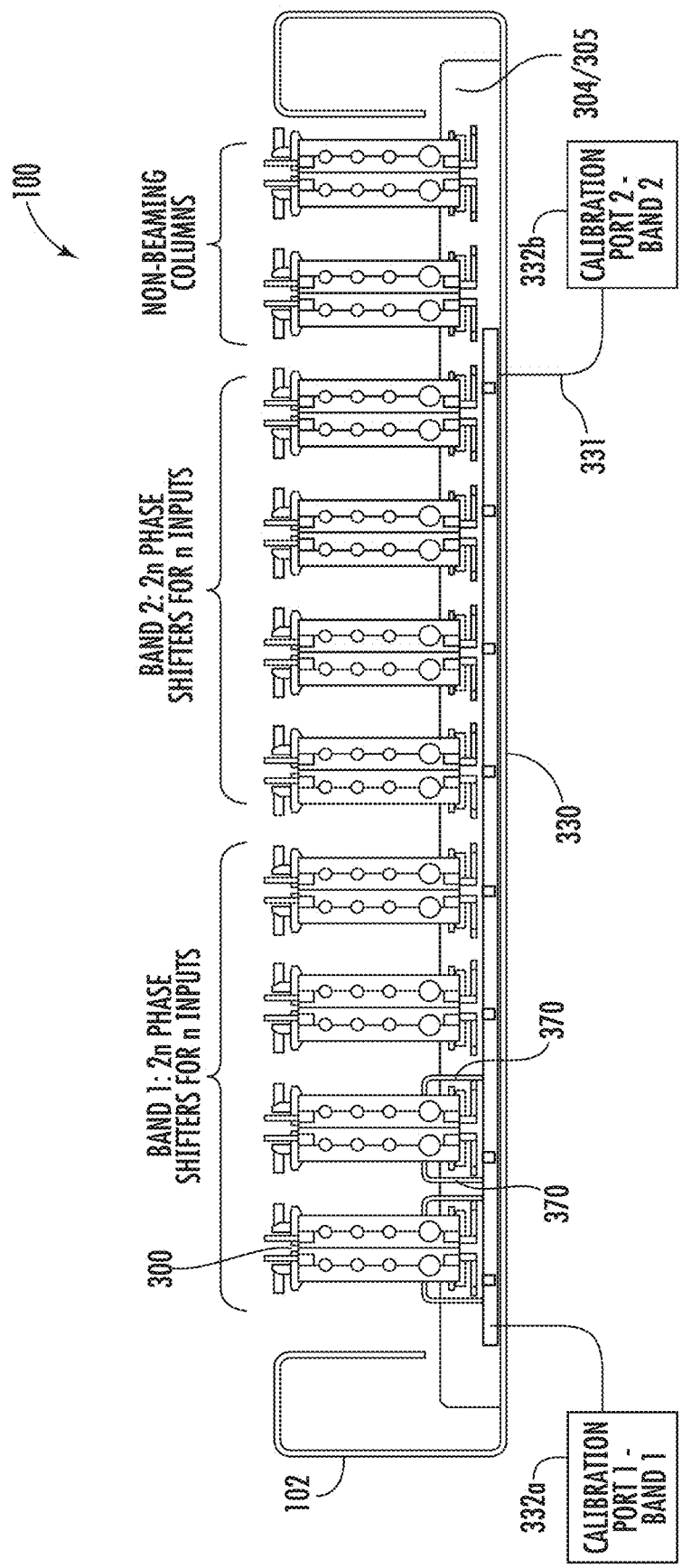
FIG. 25 is a schematic cross-sectional view of the base station antenna of FIG. 20B including a calibration printed circuit board extending perpendicular to the phase shifter assemblies according to embodiments of the present invention.

Referring now to FIG. 25, in some embodiments, a base station antenna 100 may have a calibration PCB 330 extending perpendicularly to the phase shifter assemblies 300, 300'. In order to reduce the impact of amplitude and phase variations, beam-forming antennas may include a calibration circuit that samples the RF signals and passes these samples back to the radio. The calibration circuit may comprise a plurality of directional couplers, each of which is configured to tap RF energy from a respective one of the RF transmission paths that extend between the RF ports and the respective columns of radiating elements, as well as a calibration combiner that is used to combine the RF energy tapped off of each of these RF transmission paths. The output of the calibration combiner is coupled to a calibration port on the antenna, which in turn is coupled back to the radio. The radio may use the samples of each RF signal to determine the relative amplitude and/or phase variations along each transmission path, and may then adjust the applied amplitude and phase weights to account for these variations.

Typically, the calibration printed circuit board (PCB) 330 is located at an end of the antenna 100. Similar to the PING PCB 310 discussed above, this configuration requires long cables to be routed from each phase shifter 150 to the calibration PCB 330. For example, a Nokia massive MIMO style calibration board would require 32 long cables routed from the phase shifters 150 (typically located in the center of the antenna 100) to the calibration PCB 330 (typically located at an end of the antenna 100).

As shown in FIG. 25, a calibration PCB 330 extending perpendicular to the rearwardly extending phase shifter assemblies 300, 300' will allow for 32 shorter cables 370 to be routed from the perpendicularly mounted phase shifters 150 (relative to the reflector 305 and/or support member 304) of the rearwardly extending phase shifter assemblies 300, 300' to the calibration PCB 330. The plurality of phase shifter assemblies 300, 300' may be serially connected to the calibration PCB 330. The calibration PCB 330 may be mounted on the reflector 305 or support member 304 with the rearwardly extending phase shifter assemblies 300, 300'. In some embodiments, each phase shifter 150 may be coupled to the calibration PCB 330 through a respective blind mated or cabled connection 370. Single cables 331 may then be routed from the calibration PCB 330 to the calibration ports 332a, 332b, thereby saving space within the base station antenna 100 and providing for a more accurate calibration of the antenna beams (e.g., mitigating signal loss).

In some embodiments, the PING PCB 310 and the calibration PCB 330 may be combined into a single printed circuit board. In some embodiments, a base station antenna 100 may have a combined printed circuit board extending perpendicular to the phase shifter assemblies 300, 300' to utilize shorter cables as discussed above.

As shown above, the rearwardly extending phase shifter assemblies 300, 300' of the present invention may be advantageous over traditional configurations where the phase shifter assemblies 160a, 160b are oriented parallel to the reflector 305 within the base station antenna 100. Some advantages may include, but are not limited to, providing for a modular design for manufacturing and assembling base station antennas 100, allowing for less complex mechanical linkage designs within the antenna 100, eliminating the need to stack the phase shifter assemblies 160a, 160b within the antenna 100, allowing for more phase shifter assemblies to fit within a similarly sized antenna 100, reducing the number of parts (i.e., reducing manufacturing costs), saving space within the antenna 100, and providing for more accurate calibration of antenna beams (e.g., mitigating signal loss).

Another example of a phase shifter assembly 400 according to embodiments of the present invention is illustrated in FIGS. 26-29D. Features of the phase shifter assembly 400, for example, individual components of the phase shifters such as inputs and outputs, transmission line traces, printed circuit boards, etc., may be as described above and duplicate discussion thereof may be omitted for the purposes of discussing FIGS. 26-29D.

Figure 26A:
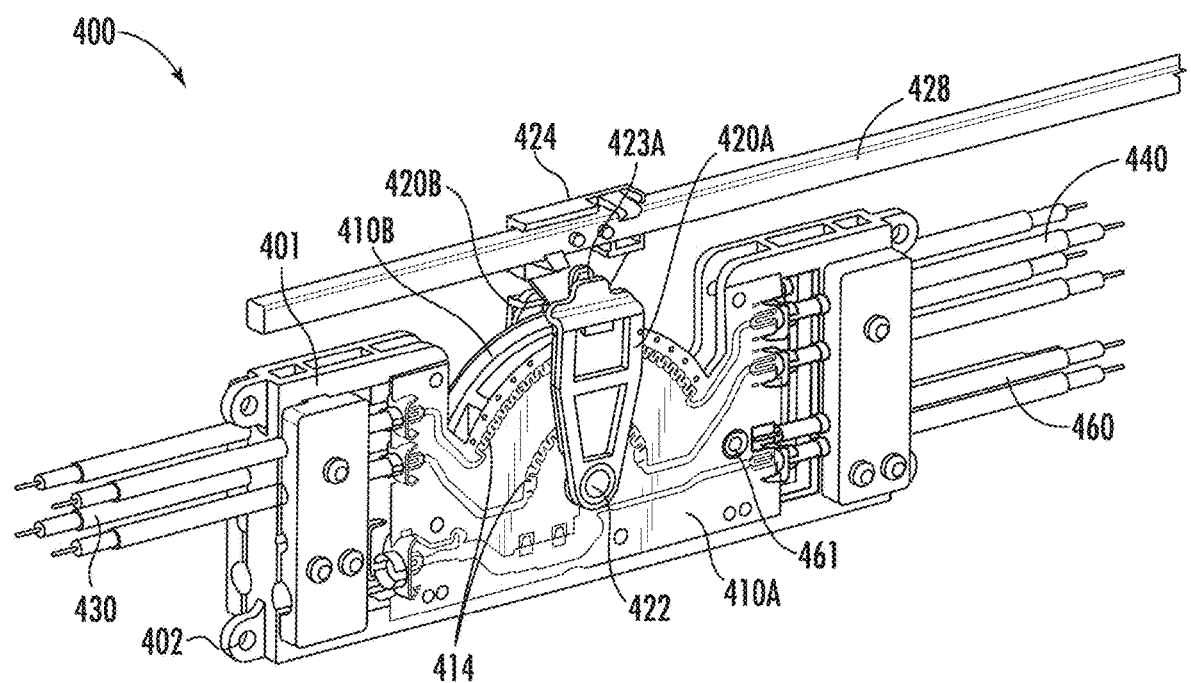
FIG. 26A is a perspective view of a phase shifter assembly according to embodiments of the present invention.
Figure 26B:
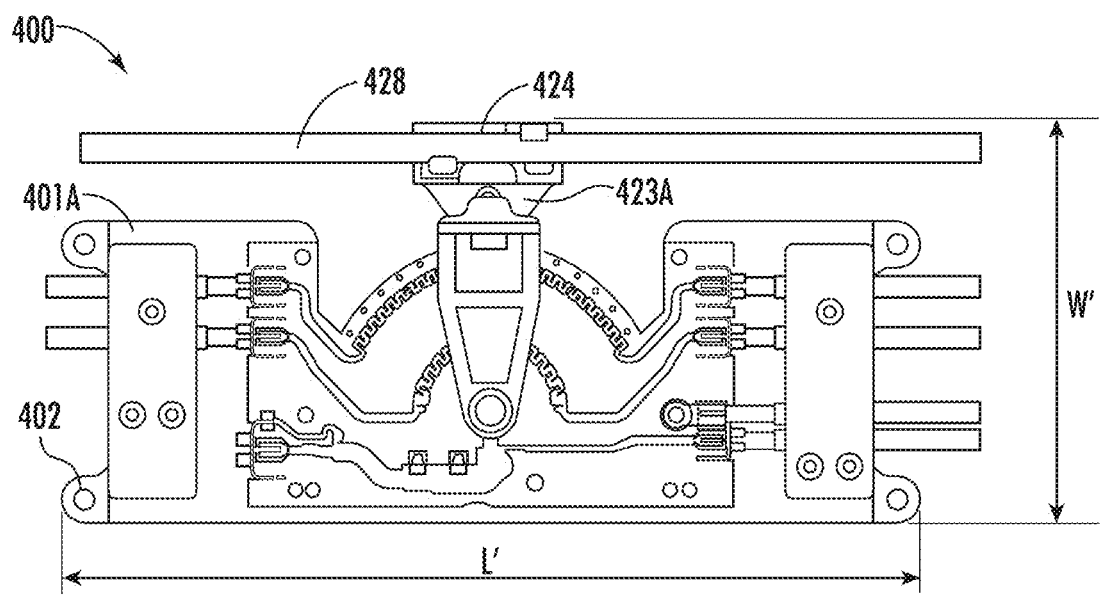
FIG. 26B is a top view of the phase shifter assembly of FIG. 26A.
Figure 26C:
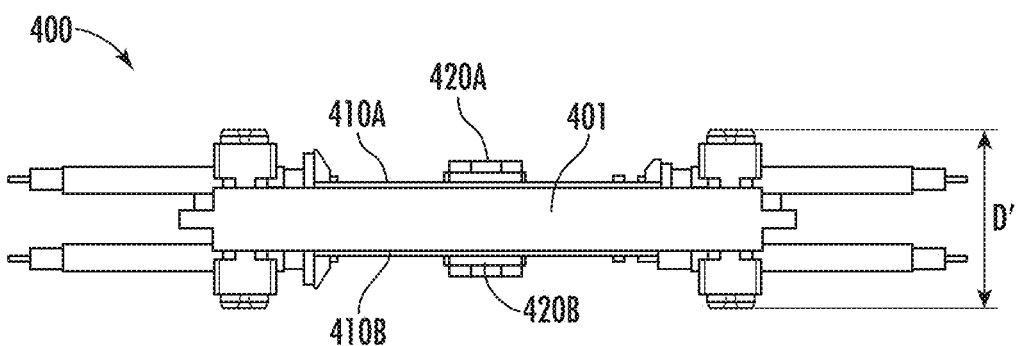
FIG. 26C is a side view of the phase shifter assembly of FIG. 26A.
Figure 27:
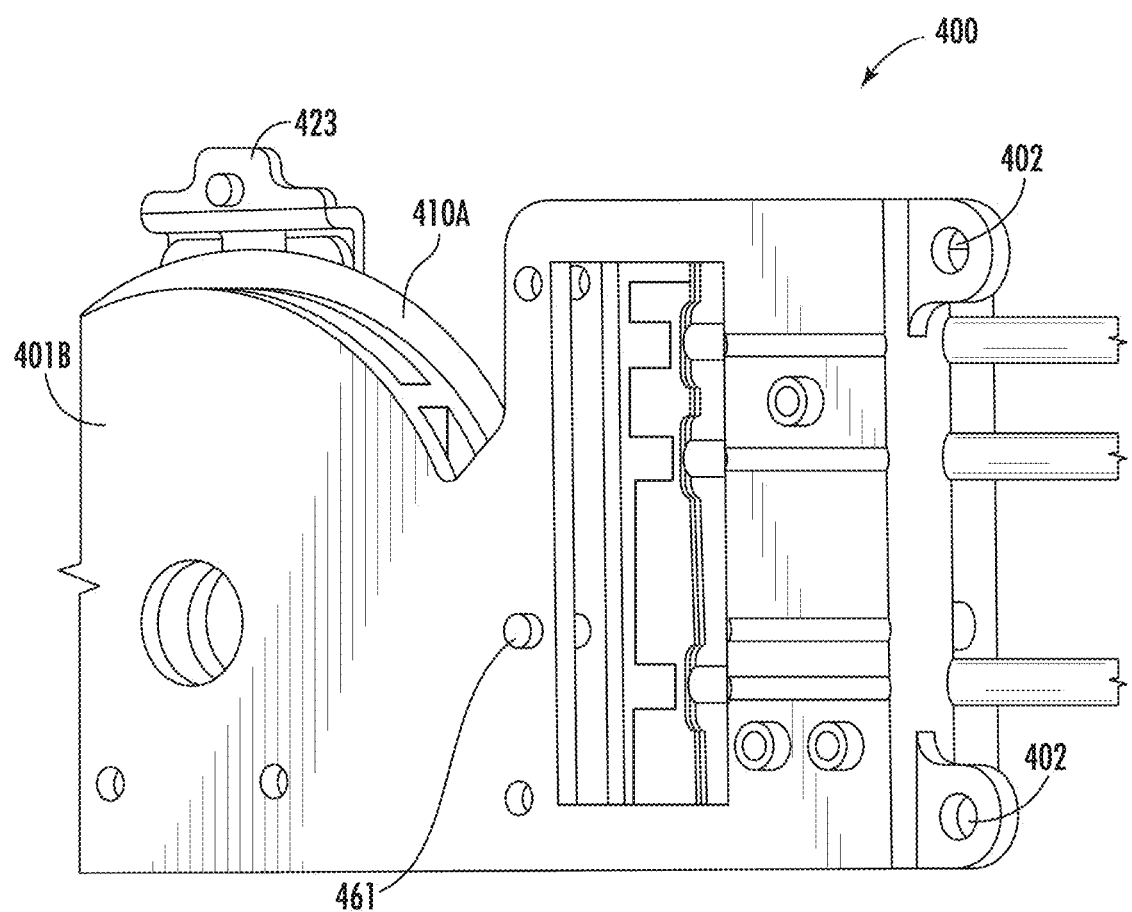
FIG. 27 is an enlarged bottom perspective view of the phase shifter assembly of FIG. 26A with the bottom phase shifter printed circuit board omitted to show the grounding pin.

Referring to FIGS. 26A-27, a phase shifter assembly 400 of the present invention may comprise a mounting base 401 formed of a polymeric material having opposing first and second primary sides 401A, 401B. In some embodiments, the polymeric mounting base 401 may comprise nylon, acetal, ABS, polycarbonate or polypropylene. In some embodiments, the mounting base 401 may be formed by injection molding. Forming the mounting base 401 from a non-metallic material helps to eliminate some of the metal-to-metal interfaces within a base station antenna 100 which may reduce internal sources of passive intermodulation (PIM). In addition, changing the mounting base 401 of the phase shifter assembly 400 from a metallic material (e.g., typically aluminum in existing designs) to a plastic injected molded part will reduce the weight of the component as well as reduce manufacturing costs.

As shown in FIGS. 26A-26C, the phase shifter assembly 400 further comprises a first main printed circuit board (PCB) 410A residing on the first primary side 401A. Similar to printed circuit boards discussed above, the first main PCB 410A may comprise a plurality of radio frequency (RF) transmission paths 414 and a first wiper 420A rotatably coupled to the first main PCB 410A. The first wiper 420A may comprise a first attachment link 423A.

The phase shifter assembly 400 further comprises a second main PCB 410B residing on the second primary side 401B. The second main PCB 410B may comprise a plurality of RF transmission paths 414 and a second wiper 420B rotatably coupled to the second main PCB 410B. The second wiper 420B may comprise a second attachment link 423B.

As shown in FIG. 26A, the second main PCB 410B is aligned with the first main PCB 410A. In some embodiments, the first attachment link 423A of the first wiper 420A and the second attachment link 423B of the second wiper 420B are each configured to couple their respective wiper 420A, 420B to a drive link 424. The drive link 424 is coupled to a drive shaft 428 of a mechanical linkage (not shown). In some embodiments, the first and second wipers 420A, 420B are configured to rotate in concert relative to the first and second main PCB 410A, 410B to thereby adjust lengths of RF transmission paths on respective first and second main PCBs 410A, 410B.

As shown in FIGS. 26A and 26B, the polymeric mounting base 401 may comprise a plurality of mounting apertures 402. The mounting apertures 402 allow the mounting base 401 to be mounted to the reflector 305 of the antenna 100, for example, with nylon screws or rivets. Alternative mounting features may also be incorporated into the phase shifter assembly 400. For example, in some embodiments, snap fitting features or non-metallic standoffs may be integrated into the mounting base 401.

As shown in FIGS. 26A and 26B, the mounting apertures 402 are configured to allow horizontal mounting of the phase shifter assembly 400 within the antenna 100 (i.e., parallel to the plane defined by the reflector 305). Note that the phase shifter assembly 400 of the present invention may be configured to be vertically mounted to the reflector 305 (i.e., perpendicular) within a base station antenna 100 utilizing a modified mounting base 401, for example, a mounting base 401 further comprising mounting flanges 302 (see, e.g., FIGS. 19A and 19B).

As shown in FIGS. 26B and 26C, the phase shifter assembly 400 has a length (L'), a width (W') and a depth (D'). In addition to being adapted for mitigating PIM within a base station antenna 100, the phase shifter assembly 400 according to embodiments of the present invention, provides a more compact size compared to existing phase shifter assemblies. For example, in some embodiments, the phase shifter assembly 400 may have a length (L') in the range of about 180 mm to about 190 mm. In some embodiments, the phase shifter assembly 400 may have a width (W') in the range of about 80 mm to about 90 mm. In some embodiments, the phase shifter assembly 400 may have a depth (D') in the range of about 25 mm to about 35 mm.

In some embodiments, the phase shifter assembly 400 consumes about half of the space within a base station antenna 100 compared to existing phase shifter assembly designs. Thus, the phase shifter assembly 400 of the present invention may be used in narrow reflector antennas or in larger port antennas where space on the reflector 305 is a constraint.

Referring now to FIG. 27, in some embodiments, the phase shifter assembly 400 further comprises a grounding pin 461 (see also, FIG. 26A). FIG. 27 is an enlarged bottom perspective view of the phase shifter assembly 400 with the bottom phase shifter printed circuit board (i.e., the second main PCB 410B) omitted to show the grounding pin 461. As shown in FIG. 27, the grounding pin 461 extends through the mounting base 401 and is coupled (e.g., soldered) to the first and second main PCBs 410A, 410B. A grounding cable 460 connects the grounding pin 461 to the reflector 305 or other grounding point, thereby providing a ground for the phase shifter assembly 400.

Figure 29A:
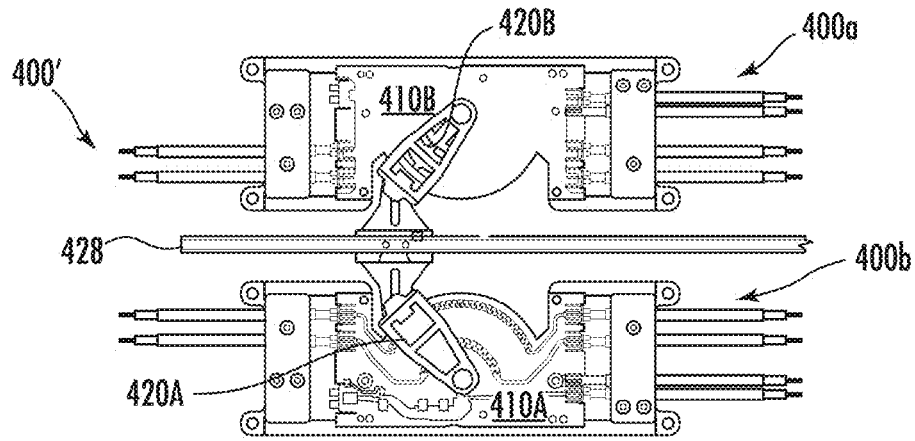
FIG. 29A is a top view of the phase shifter assembly of FIG. 28 showing maximum tilt.
Figure 29B:
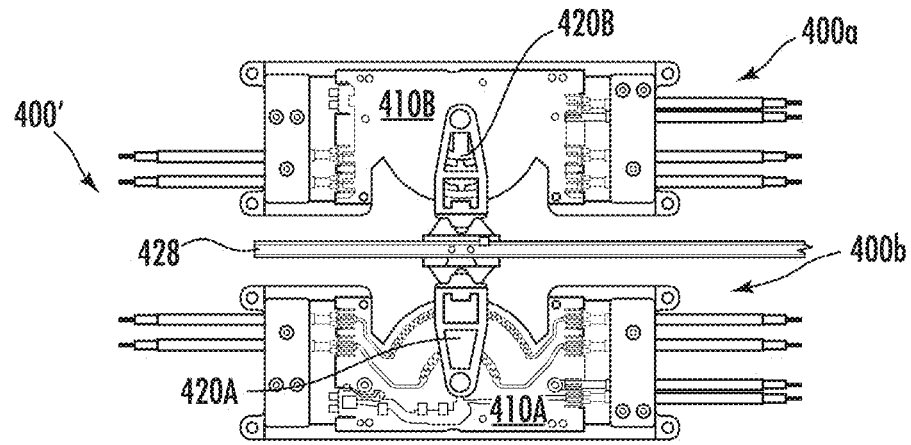
FIG. 29B is a top view of the phase shifter assembly of FIG. 28 showing middle tilt.
Figure 29C:
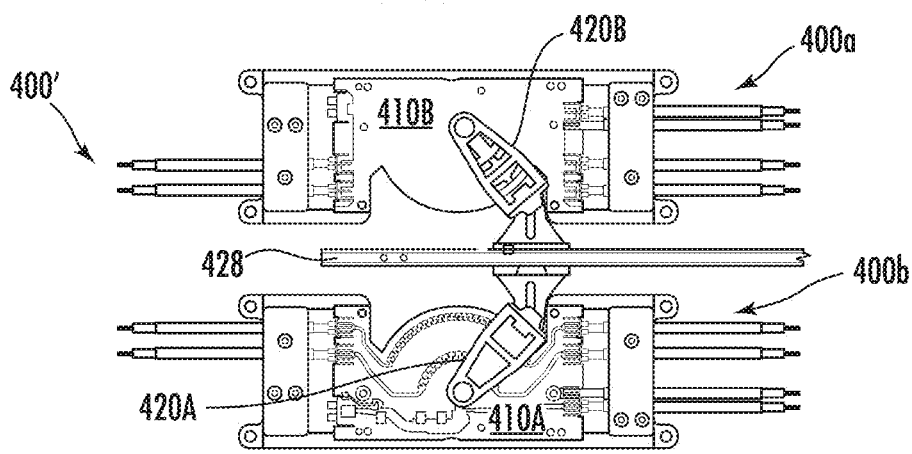
FIG. 29C is a top view of the phase shifter assembly of FIG. 28 showing minimum tilt.

Referring now to FIGS. 28-29C, another phase shifter assembly 400' according to embodiments of the present invention is illustrated. As shown in FIG. 28, the phase shifter assembly 400' comprises at least two phase shifter assemblies 400 (i.e., 400a, 400b) described above mounted horizontally on the reflector 305. The phase shifter assembly 400' can be operated using a single drive shaft 428 (e.g., square rod) without the need for additional mechanical linkages. In some embodiments, a base station antenna 100 may comprise a plurality of phase shifter assemblies 400', for example, in beam-forming antennas.

Referring now to FIGS. 29A-29C, in some embodiments, a base station antenna 100 of the present invention may comprise at least two phase shifter assemblies 400a, 400b. In some embodiments, the wipers 420A, 420B of the four phase shifters (i.e., two phase shifter assemblies 400a, 400b) may be configured to rotate in concert relative to the first and second main PCBs 410A, 410B of their respective phase shifter assembly 400a, 400b to adjust the phase (or tilt) of the antenna 100. The first and second attachment links 423A, 423B of the first and second wipers 420A, 420B of one of the phase shifter assemblies 400a and the first and second attachment links 423A, 423B of the first and second wipers 420A, 420B of the second phase shifter assemblies 400b may be configured to couple their respective wipers 420A, 420B to the drive link 424 which is coupled to the drive shaft 428 of a mechanical linkage. The first and second wipers 420A, 420B of each of the at least two phase shifter assemblies 400a, 400b may be configured to rotate in concert relative to their respective first and second main printed circuit boards 410A, 410B to thereby adjust the phase of the base station antenna 100.

FIG. 29A illustrates the phase shifter assembly 400' applying minimum tilt, FIG. 29B illustrates the phase shifter assembly 400' applying middle tilt, and FIG. 29C illustrates the phase shifter assembly 400' applying maximum tilt.

Referring now to FIGS. 30A-32C, another mounting base 401' according to embodiments of the present invention is illustrated. The mounting base 401' comprises an alternative option for mounting the phase shifter assembly 400' to the reflector 305' of a base station antenna 100.

Figure 30A:
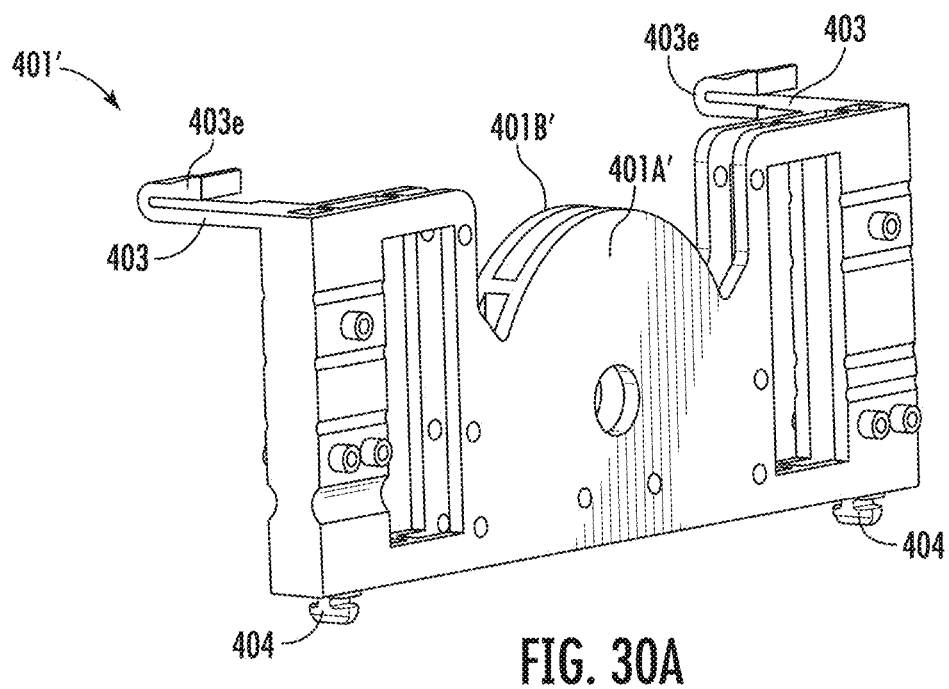
FIG. 30A is a top perspective view of a mounting base of the phase shifter assembly FIG. 26A having alternative mounting features according to embodiments of the present invention.
Figure 30B:
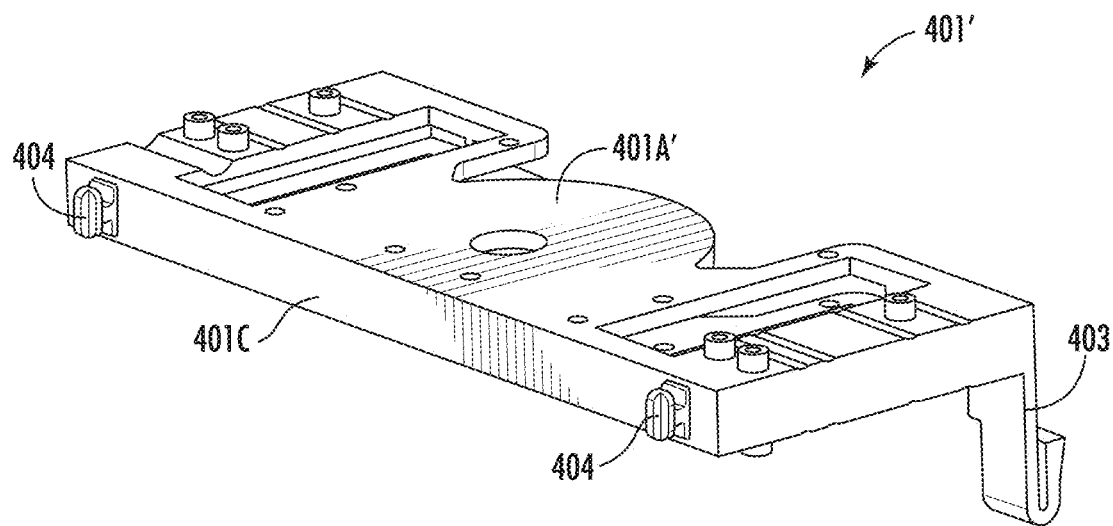
FIG. 30B is a perspective view of the mounting base of FIG. 30A.
Figure 31:
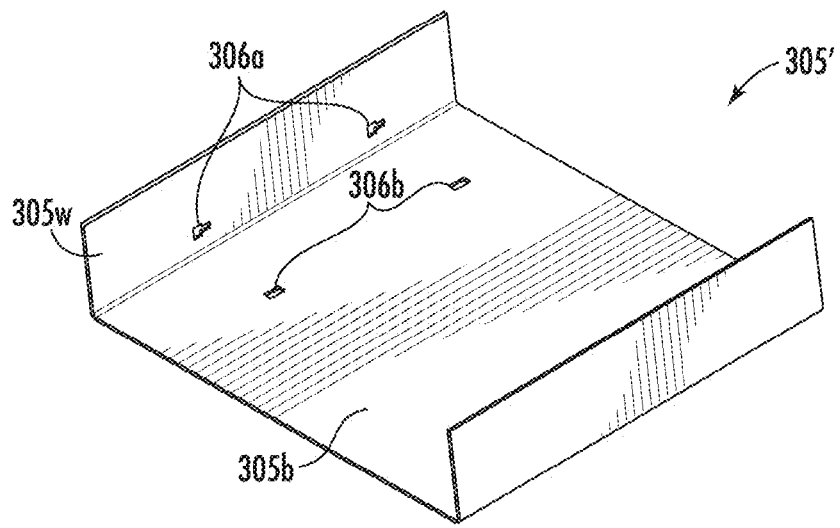
FIG. 31 is a top perspective view of a reflector configured to receive the mounting features shown in FIG. 30A.

As shown in FIGS. 30A and 30B, the mounting base 401' of the phase shifter assembly 400' may comprise mounting features 403, 404 which may allow the phase shifter assembly 400' to be easily mounted to the reflector 305' of an antenna 100. In some embodiments, the mounting features 403, 404 may be integral with the mounting base 401'. As shown in FIGS. 30A and 30B, the mounting features 403 may extend outwardly from and perpendicular to the second primary side 401B' of the mounting base 401'. The mounting features 403 may comprise a snap-lock or snap-fit feature that is configured to be received by mounting cutouts (or apertures) 306b' residing in a base 305b of the reflector 305' (see, e.g., FIG. 31 and FIGS. 32A-32C). The mounting apertures 306b' are sized to receive a respective mounting feature 403. For example, the mounting features 403 may comprise a cantilever snap joint having a flexible U-shaped end 403e configured to interlock with a respective mounting aperture 306b'.

Still referring to FIGS. 30A and 30B, the mounting features 404 may extend outwardly from a secondary side 401C of the mounting base 401'. The mounting features 404 may comprise a snap-lock or snap-fit feature that is configured to be received by mounting cutouts (or apertures) 306a' residing in a sidewall 305w of the reflector 305' (see, e.g., FIG. 31 and FIGS. 32A-32C). The mounting apertures 306a' are sized to receive a respective mounting feature 404. For example, the mounting features 404 may be inserted into a wide portion of a respective aperture 306a' and then slid to a narrow portion of the aperture 306a', thereby locking the mounting feature 404 within the mounting aperture 306a' (see, e.g., FIG. 31 and FIG. 32B).

Figure 32A:
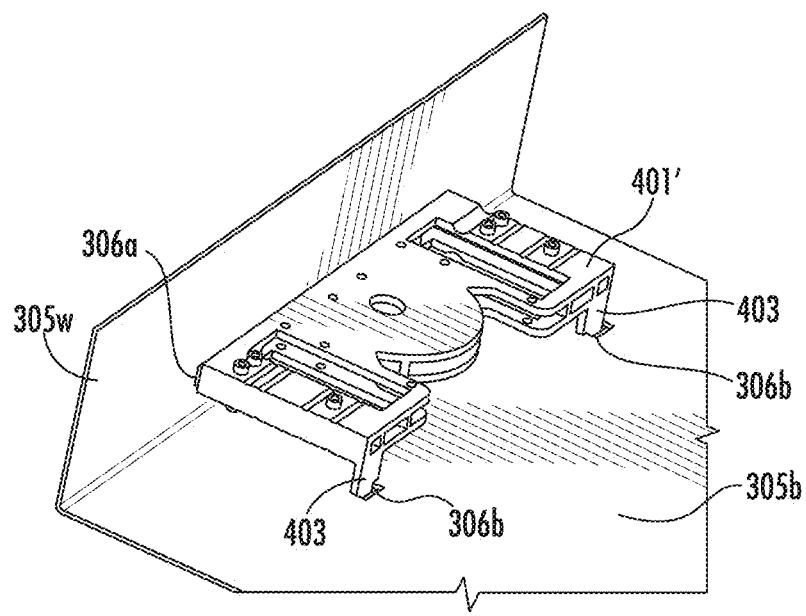
FIG. 32A is a top perspective view of the mounting base of FIG. 30A mounted to the reflector of FIG. 31.
Figure 32B:
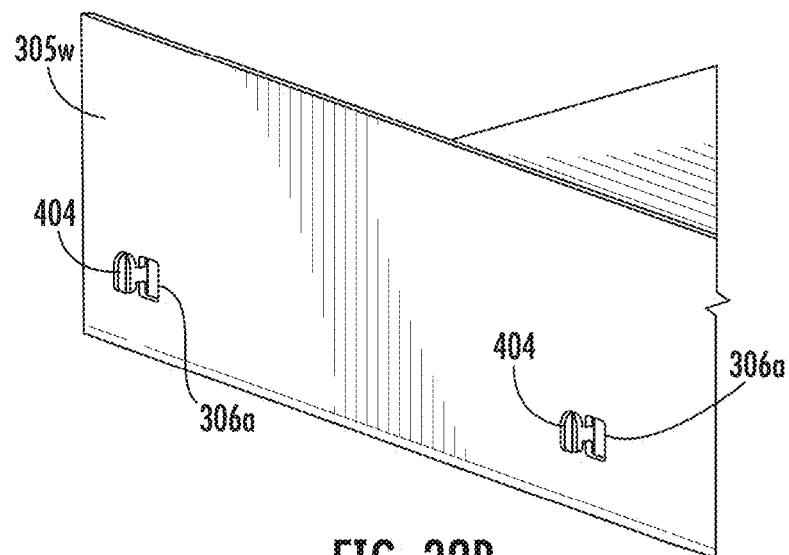
FIG. 32B and FIG. 32C are enlarged views of the mounting features of the mounting base of FIG. 30A secured to the reflector of FIG. 31.
Figure 32C:
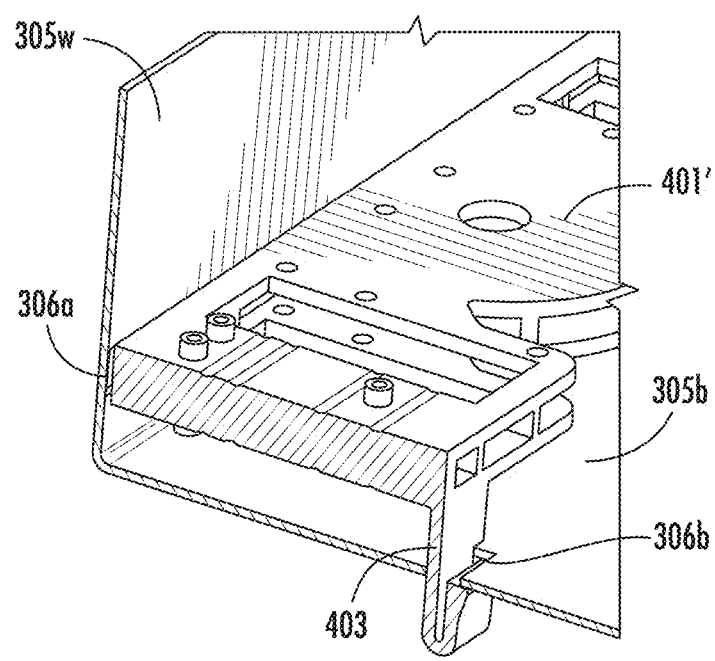

As shown in FIGS. 32A-32C, in some embodiments, the mounting features 403 are each received (and secured) in respective mounting apertures 306b' residing in the base 305b of the reflector 305' and the mounting features 404 are each received (and secured) in respective mounting apertures 306a' residing in the sidewall 305w of the reflector 305'.

Figure 33:
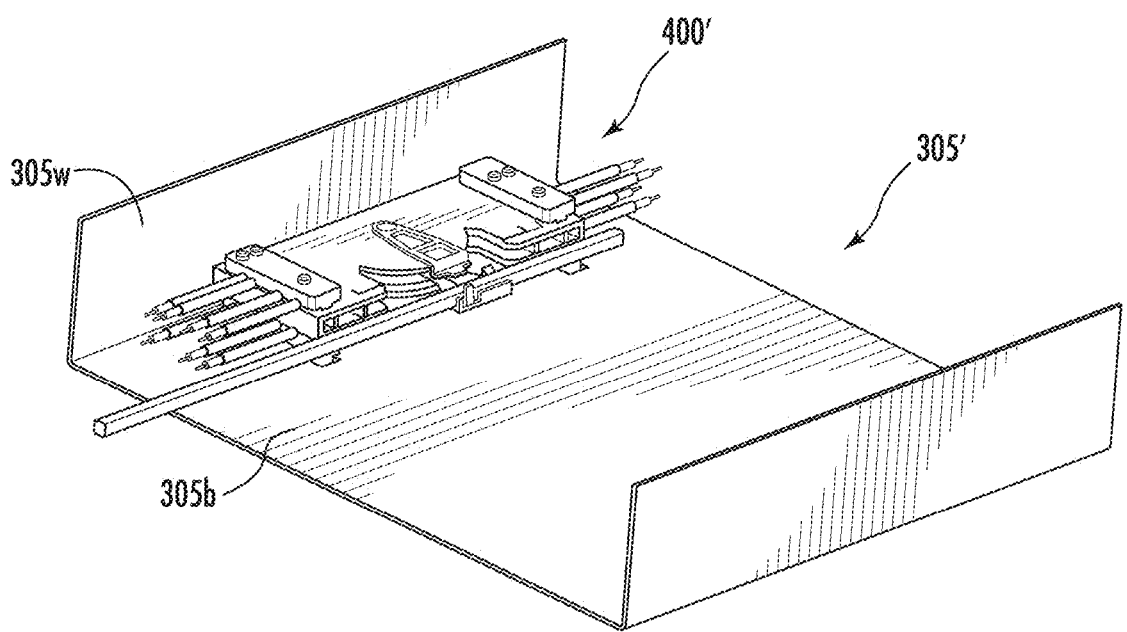
FIG. 33 is a perspective view of the entire phase shifter assembly of FIG. 26A mounted on the reflector of FIG. 31.

FIG. 33 illustrates the entire phase shifter assembly 400' mounted on reflector 305' using the mounting features 403, 404 described above. As shown in FIG. 33, the phase shifter assembly 400' may be mounted against the sidewall 305w of the reflector 305'.

Referring now to FIGS. 34A-36C, another mounting base 401" according to embodiments of the present invention is illustrated. The mounting base 401" comprises another alternative option for mounting the phase shifter assembly 400' to the reflector 305" of a base station antenna 100.

Figure 34A:
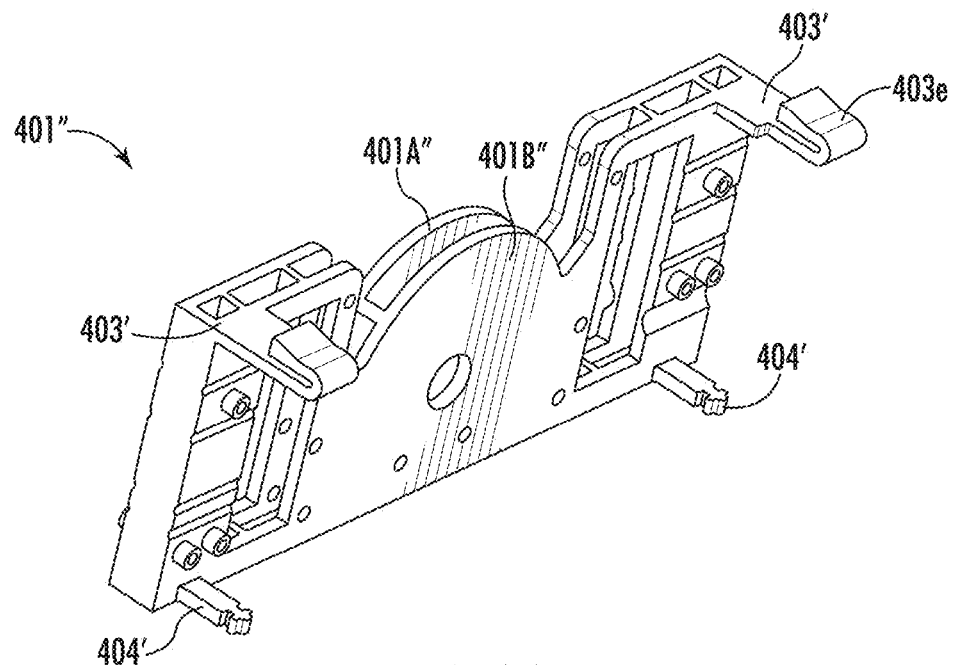
FIG. 34A is a top perspective view of a mounting base of the phase shifter assembly FIG. 26A having alternative mounting features according to embodiments of the present invention.
Figure 34B:
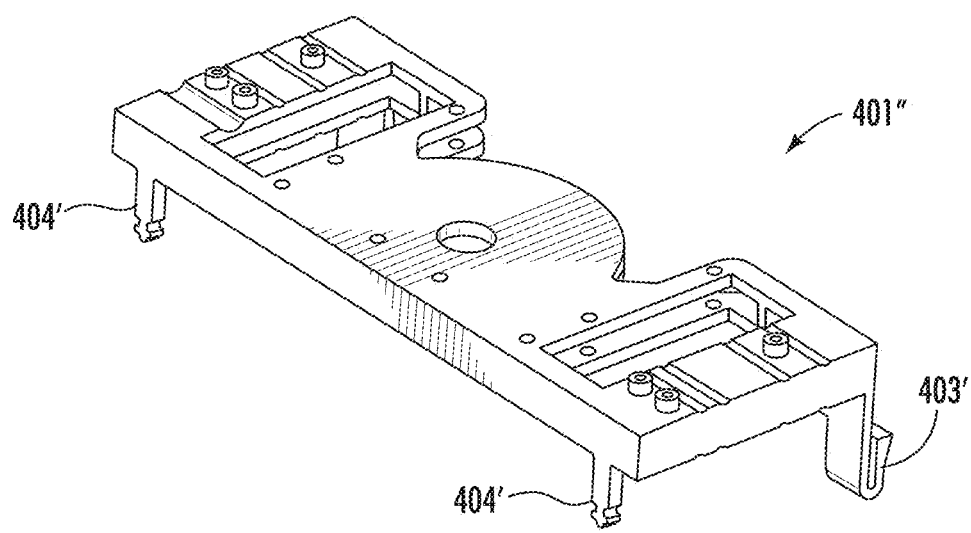
FIG. 34B is a perspective view of the mounting base of FIG. 34A.

As shown in FIGS. 34A and 34B, the mounting base 401" of the phase shifter assembly 400' may also comprise mounting features 403', 404' which may allow the phase shifter assembly 400' to be easily mounted to the reflector 305" of an antenna 100. In some embodiments, the mounting features 403', 404' may be integral with the mounting base 401". Similar to the mounting features 403, 404, mounting features 403', 404' may comprise snap-lock or snap-fit features that are configured to be received by mounting cutouts (or apertures) 306a', 306b' in the reflector 305".

Still referring to FIGS. 34A and 34B, the mounting features 403' extend outwardly from and perpendicular to the second primary side 401B" of the mounting base 401" and may comprise a similar cantilever snap joint having a flexible U-shaped end 403e configured to interlock with the mounting aperture 306b', as described above with respect to mounting base 401'. Mounting base 401" differs from mounting base 401' in that the mounting features 403' also extend outwardly from and perpendicular to the second primary side 401B" of the mounting base 401". Like mounting features 404, the mounting features 404' may be inserted into a wide portion of a respective aperture 306a' and then slid to a narrow portion of the aperture 306a', thereby locking the mounting feature 404' within the mounting aperture 306a' (see, e.g., FIG. 35 and FIG. 36B).

Figure 35:
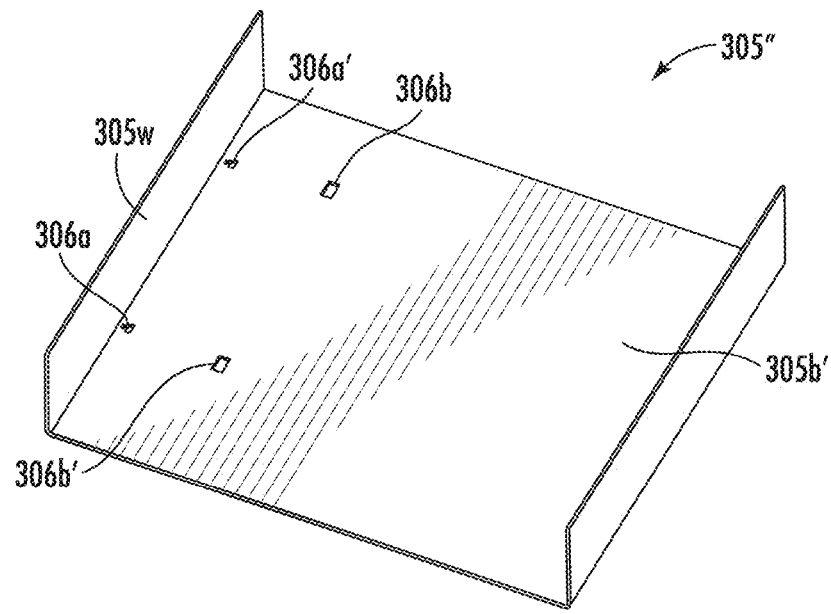
FIG. 35 is a top perspective view of a reflector configured to receive the mounting features shown in FIG. 34A.

The mounting apertures 306a', 306b' are sized to receive a respective mounting feature 403', 404'. As shown in FIG. 35, since all of the mounting features 403', 404' extend outwardly from the second primary side 401B" of the mounting base 401", all of the mounting apertures 306a', 306b' reside in the base 305b' of the reflector 305". In some embodiments, the mounting apertures 306a' may be offset from the mounting apertures 306b' in the base 305b' of the reflector 305". As such, the mounting features 403, 404 are positioned on the second primary side 401B" of the mounting base 401" such that the features 403, 404 will align with the mounting apertures 306a', 306b' when the mounting base 401' is being mounted to the reflector 305".

Figure 36A:
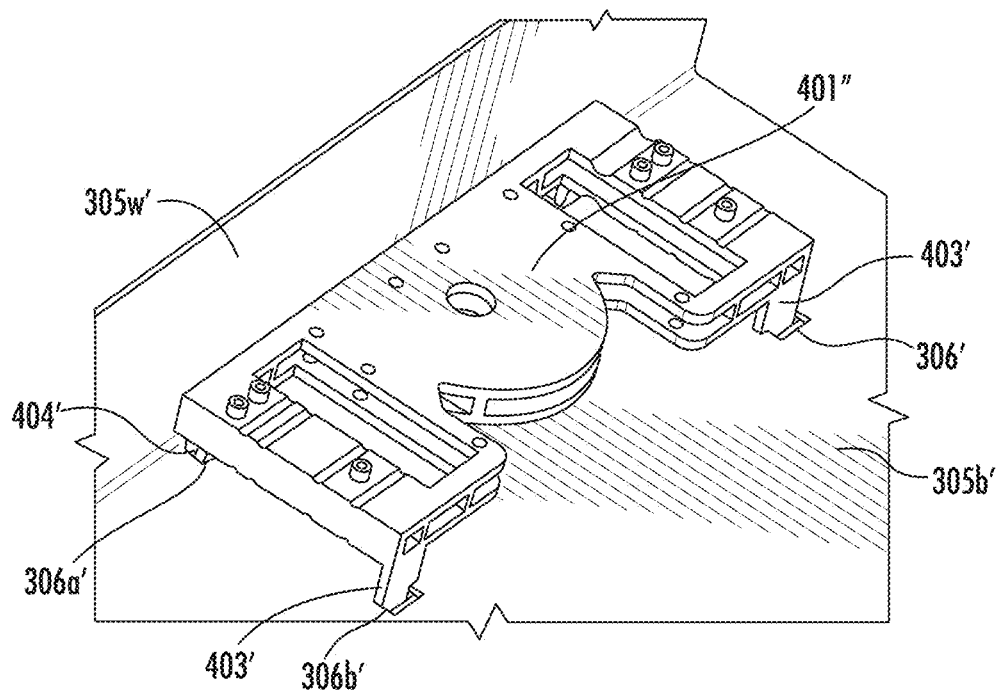
FIG. 36A is a top perspective view of the mounting base of FIG. 34A mounted to the reflector of FIG. 35.
Figure 36B:
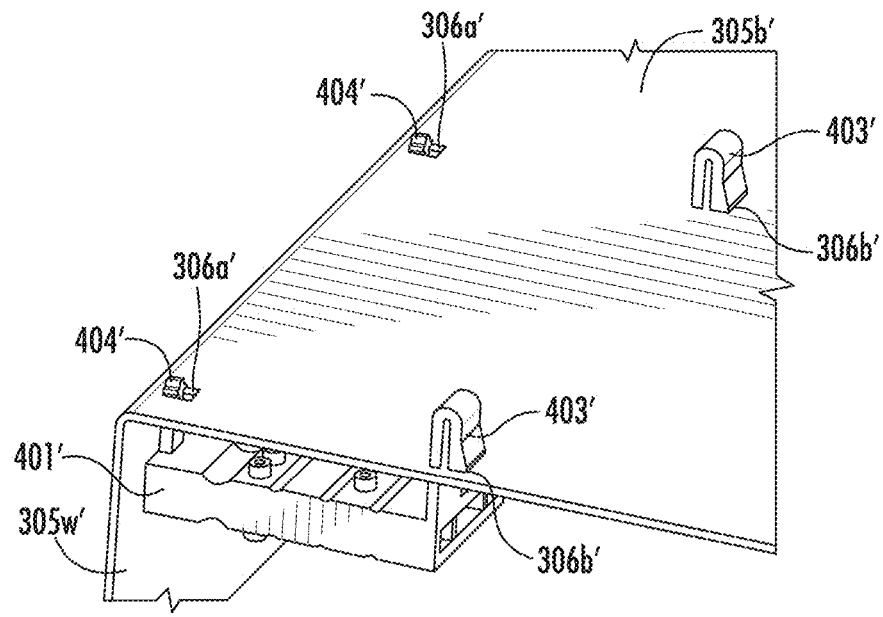
FIG. 36B and FIG. 36C are enlarged views of the mounting features of the mounting base of FIG. 34A secured to the reflector of FIG. 35.
Figure 36C:
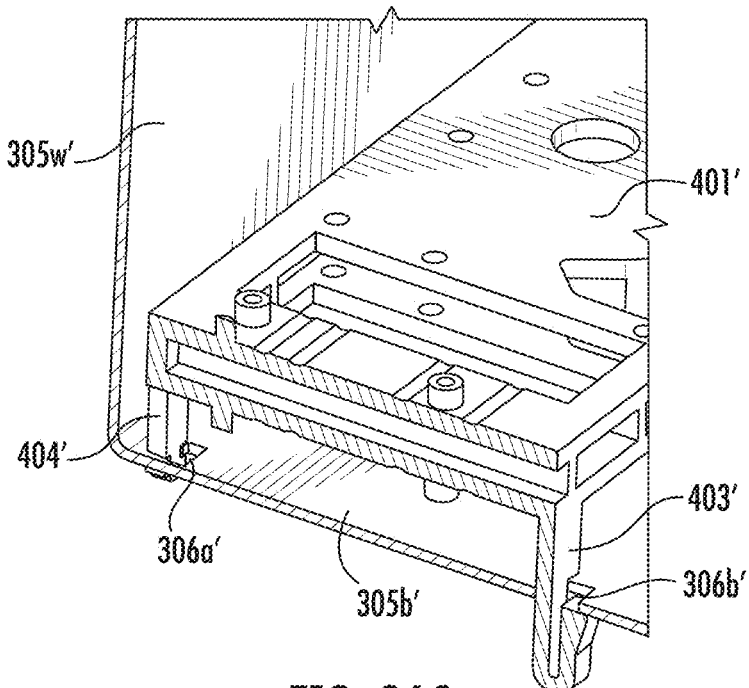

As shown in FIGS. 36A-36C, in some embodiments, the mounting features 403' are each received (and secured) in a respective mounting aperture 306b' and the mounting features 404' are each received (and secured) in a respective mounting aperture 306a'.

Figure 37:
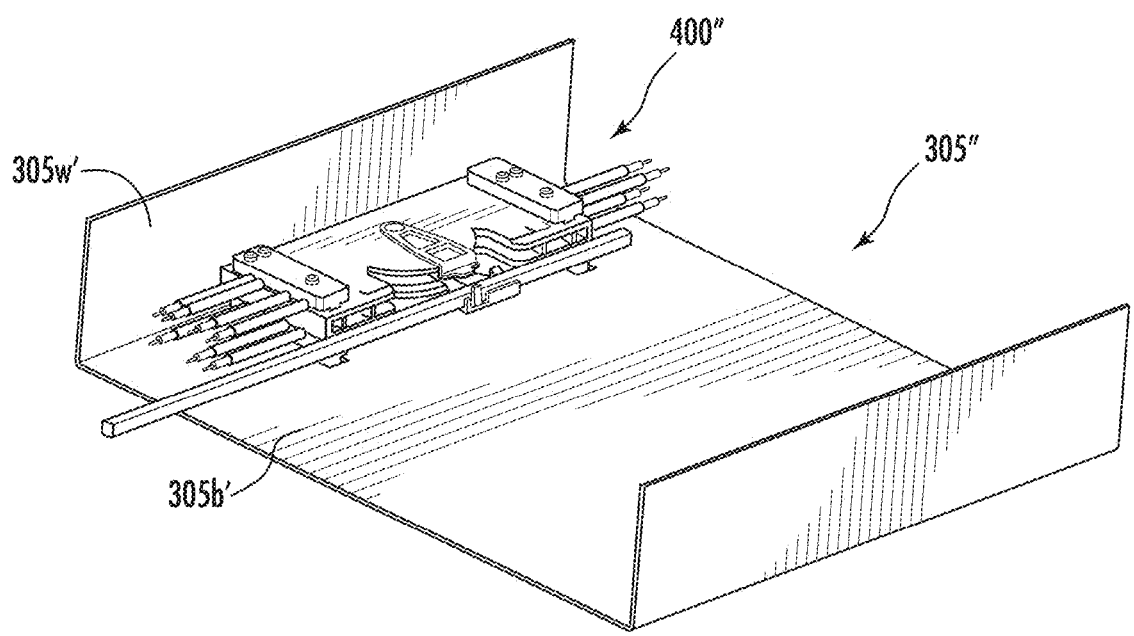
FIG. 37 is a perspective view of the entire phase shifter assembly of FIG. 34A mounted on the reflector of FIG. 35.

FIG. 37 illustrates the entire phase shifter assembly 400' mounted on reflector 305" using the mounting features 403', 404' described above.

As noted above, a RET actuator is used to drive the moveable element of a phase shifter 150/phase shifter assembly 200, 200', 300, 300'. See, e.g., U.S. Provisional Application Ser. No. 62/696,996, the contents of which are hereby incorporated by reference as if recited in full herein for example components an RET actuator that may be used in the base station antennas according to embodiments of the present invention. The RET actuator can be a multi-RET actuator that includes multiple output members that can drive multiple respective mechanical linkages.

It will be appreciated that the above embodiments are intended as examples only, and that a wide variety of different embodiments fall within the scope of the present invention. It will also be appreciated that any of the above embodiments or features of different embodiments may be combined.

The present invention has been described above with reference to the accompanying drawings. The invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Herein, the terms "attached", "connected", "interconnected", "contacting", "mounted" and the like can mean either direct or indirect attachment or contact between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

That which is claimed is:

1. A base station antenna, comprising:
    a reflector; and
    a rearwardly extending phase shifter assembly that comprises a first plate that comprises a major surface and one or more mounting flanges extending perpendicular to the major surface,
    wherein the phase shifter assembly is mounted to the reflector or a support member via the one or more mounting flanges such that the phase shifter assembly is aligned substantially perpendicular to a plane defined by the reflector or the support member.

2. The base station antenna of claim 1, wherein the phase shifter assembly further comprises a second plate, the first and second plates arranged back-to-back and extending parallel to each other.

3. The base station antenna of claim 2, wherein the phase shifter assembly further comprises:
    a first main printed circuit board residing on the outer surface of the first plate, the first main printed circuit board comprising a plurality of radio frequency (RF) transmission paths;
    a second main printed circuit board residing on the outer surface of the second plate, the second main printed circuit board comprising a plurality of RF transmission paths, wherein the second main printed circuit board is aligned with the first main printed circuit board;
    a first wiper rotatably coupled to the first main printed circuit board, the first wiper having a first attachment link; and
    a second wiper rotatably coupled to the second main printed circuit board, the second wiper having a second attachment link,
    wherein the first attachment link of the first wiper and the second attachment link of the second wiper are each configured to couple their respective wiper to a drive shaft of a mechanical linkage,
    wherein the first and second wipers are configured to rotate in concert relative to the first and second main printed circuit boards to thereby adjust lengths of RF transmission paths on respective first and second main printed circuit boards.

4. The base station antenna of claim 3, comprising a plurality of rearwardly extending phase shifter assemblies, wherein the mechanical linkage of each phase shifter assembly aligns in the same transverse plane.

5. The base station antenna of claim 1, wherein the phase shifter assembly is mounted to the reflector by the mounting flanges.

6. The base station antenna of claim 1, wherein the phase shifter assembly is mounted on the support member by the mounting flanges.

7. The base station antenna of claim 1, further comprising an AISG PING printed circuit board extending perpendicular to the phase shifter assembly.

8. The base station antenna of claim 7, wherein the phase shifter assembly is coupled to the AISG PING printed circuit board through a blind mated or cabled connection.

9. The base station antenna of claim 1, further comprising a calibration circuit board extending perpendicular to the phase shifter assembly.

10. The base station antenna of claim 9, wherein the phase shifter assembly is coupled to the calibration circuit board through a blind mated or cabled connection.

11. The base station antenna of claim 1, wherein the base station antenna comprises about 10 to about 30 rearwardly extending phase shifter assemblies.

12. A method of assembling a base station antenna, the method comprising:
    providing a plurality of phase shifter assemblies, each phase shifter assembly comprising a first and a second plate arranged back-to-back and extending parallel to each other;
    mounting each phase shifter assembly to a support member such that the first and second plates are oriented perpendicular to the support member; and
    integrating the support member comprising the plurality of phase shifter assemblies mounted thereon into the base station antenna.

13. The method of claim 12, the method further comprising integrating an AISG PING printed circuit board extending perpendicular to the plurality of phase shifter assemblies.

14. The method of any one of claim 12, the method further comprising integrating a calibration printed circuit board extending perpendicular to the plurality of phase shifter assemblies.

15. A base station antenna, comprising:
    a reflector; and
    a plurality of rearwardly extending phase shifter assemblies, wherein each of the phase shifter assemblies are aligned substantially perpendicular to a plane defined by the reflector, and
    wherein each phase shifter assembly comprises:

a first and a second plate arranged back-to-back and extending parallel to each other, each plate comprising an outer surface;

a first main printed circuit board residing on the outer surface of the first plate, the first main printed circuit board comprising a plurality of radio frequency (RF) transmission paths;

a second main printed circuit board residing on the outer surface of the second plate, the second main printed circuit board comprising a plurality of RF transmission paths, wherein the second main printed circuit board is aligned with the first main printed circuit board;

a first wiper rotatably coupled to the first main printed circuit board, the first wiper having a first attachment link; and a second wiper rotatably coupled to the second main printed circuit board, the second wiper having a second attachment link, wherein the first attachment link of the first wiper and the second attachment link of the second wiper are each configured to couple their respective wiper to a drive shaft of a mechanical linkage, wherein the first and second wipers are configured to rotate in concert relative to the first and second main printed circuit boards to thereby adjust lengths of RF transmission paths on respective first and second main printed circuit boards.

16. The base station antenna of claim 15, wherein each phase shifter assembly comprises one or more mounting flanges, each mounting flange being configured to mount the phase shifter assembly to the reflector or a support member.

17. The base station antenna of claim 16, wherein the plurality of phase shifter assemblies is mounted to the reflector or the support member by the mounting flanges.

18. The base station antenna of claim 15, wherein the mechanical linkage of each phase shifter assembly aligns in the same transverse plane.

19. The base station antenna of claim 15, further comprising an AISG PING printed circuit board extending perpendicular to the plurality of phase shifter assemblies.

20. The base station antenna of claim 15, further comprising a calibration circuit board extending perpendicular to the plurality of phase shifter assemblies.

* * * * *